(12) United States Patent
Nakamura et al.

(10) Patent No.: US 9,123,830 B2
(45) Date of Patent: Sep. 1, 2015

(54) MANUFACTURING METHOD FOR SEMICONDUCTOR DEVICE

(71) Applicant: SUMITOMO BAKELITE CO., LTD., Tokyo (JP)

(72) Inventors: Kensuke Nakamura, Tokyo (JP); Toru Meura, Tokyo (JP); Yoji Ishimura, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 14/356,844

(22) PCT Filed: Nov. 12, 2012

(86) PCT No.: PCT/JP2012/079256
§ 371 (c)(1),
(2) Date: May 7, 2014

(87) PCT Pub. No.: WO2013/069798
PCT Pub. Date: May 16, 2013

(65) Prior Publication Data
US 2014/0312511 A1    Oct. 23, 2014

(30) Foreign Application Priority Data

Nov. 11, 2011  (JP) .................................. 2011-247023
Mar. 22, 2012  (JP) .................................. 2012-064719

(51) Int. Cl.
*H01L 21/00*    (2006.01)
*H01L 23/00*    (2006.01)
(Continued)

(52) U.S. Cl.
CPC ............... *H01L 24/96* (2013.01); *H01L 24/75* (2013.01); *H01L 24/81* (2013.01); *H01L 25/065* (2013.01);
(Continued)

(58) Field of Classification Search
USPC ......... 438/107, 108, 109, 110, 118, 125, 126; 257/686, 777
See application file for complete search history.

(56) References Cited

U.S. PATENT DOCUMENTS 8,174,109 B2 *  5/2012  Uchiyama .................... 257/686
8,415,202 B2 *  4/2013  Ohba ............................ 438/109
(Continued)

FOREIGN PATENT DOCUMENTS

JP        10-32307 A       2/1998
JP     20040311709 A      11/2004
(Continued)

OTHER PUBLICATIONS

Horibe et al., "Sanjigen Chip Sekiso Device-yo Inter Chip Fill-zai", Dai 23 Kai Japan Institute of Electronics Packagaing Koen Taikai Koen Ronbunshu, Mar. 11, 2009, pp. 61-62.
(Continued)

*Primary Examiner* — Sheila V Clark
(74) *Attorney, Agent, or Firm* — Birch, Stewart, Kolasch & Birch, LLP

(57) ABSTRACT

Provided is a method of manufacturing a semiconductor device that has a plurality of semiconductor components and a plurality of resin layers, the method including: a step in which resin layers and semiconductor components are laminated alternately on a substrate, and the same is adhered by being subjected to heating and pressurization at a temperature lower than the temperature at which the substrate and/or a solder layer of the semiconductor components melts; and a step in which heat and pressure are applied at a temperature at which the solder layer melts or a temperature higher than said temperature.

32 Claims, 20 Drawing Sheets

(51) Int. Cl.
*H01L 25/065* (2006.01)
*H01L 25/07* (2006.01)
*H01L 25/18* (2006.01)

(52) U.S. Cl.
CPC .............. *H01L 25/07* (2013.01); *H01L 25/18* (2013.01); *H01L 2224/16145* (2013.01); *H01L 2224/32145* (2013.01); *H01L 2224/73204* (2013.01); *H01L 2224/81203* (2013.01); *H01L 2924/10253* (2013.01)

(56) References Cited

U.S. PATENT DOCUMENTS

| | | | |
|---|---|---|---|
| 2002/0042161 A1 | 4/2002 | Sato et al. | |
| 2008/0157327 A1* | 7/2008 | Yang | 257/686 |
| 2009/0218671 A1* | 9/2009 | Kuwabara | 257/686 |
| 2010/0244233 A1 | 9/2010 | Kim et al. | |
| 2012/0171814 A1* | 7/2012 | Choi et al. | 438/107 |
| 2013/0344655 A1* | 12/2013 | Ohba | 438/109 |

FOREIGN PATENT DOCUMENTS

| | | |
|---|---|---|
| JP | 2006-261264 A | 9/2006 |
| JP | 2007-9188 A | 1/2007 |
| JP | 2009-110995 A | 5/2009 |
| JP | 2010-278334 A | 12/2010 |
| JP | 2011-29392 A | 2/2011 |
| JP | 2011-108770 A | 6/2011 |
| JP | 2011-181703 A | 9/2011 |
| JP | 2011-211156 A | 10/2011 |
| JP | 2011-228620 A | 11/2011 |
| WO | WO 2011/048774 A1 | 4/2011 |

OTHER PUBLICATIONS

International Search Report for PCT/JP2012/079256 mailed on Feb. 19, 2013.
Written Opinion of the International Searching Authority for PCT/JP2012/079256 mailed on Feb. 19, 2013.
Japanese Office Action dated Apr. 1, 2015 for Japanese Office Action No. 2012-247985, with English Translation.
Notice of Allowance dated Jun. 16, 2015, issued in JP Application No. 2012-247985 with English language translation.

* cited by examiner

US 9,123,830 B2

MANUFACTURING METHOD FOR SEMICONDUCTOR DEVICE

TECHNICAL FIELD

The present invention relates to a method for manufacturing a semiconductor device.

Priority is claimed on Japanese Patent Application No. 2011-247023, filed Nov. 11, 2011, and Japanese Patent Application No. 2012-64719, filed Mar. 22, 2012, the contents of which are incorporated herein by reference.

BACKGROUND ART

Conventionally, semiconductor devices which are configured by laminating a plurality of semiconductor elements have been used. For example, in Patent Documents 1 and 2, a semiconductor device in which a plurality of semiconductor elements (or semiconductor substrates) having a through silicon via (TSV) are laminated has been disclosed. FIG. 7 shows a semiconductor device 900 disclosed in Patent Document 1. The semiconductor device 900 has a structure in which a semiconductor chip 903 is laminated on an interposer 901 through a resin layer 902.

It is thought that the semiconductor device 900 has been manufactured in the following manner. First, as shown in FIG. 8A, wirings 904 and connection bumps 900A that are disposed on the surface of an interposer or semiconductor chip are formed on the interposer 901 in advance. Thereafter, as shown in FIG. 8B, a film-like adhesive (resin layer) 902 is provided. Then, as shown in FIG. 8C, a semiconductor chip 903 is laminated to perform soldering.

By repeating such operations, the semiconductor device 900 shown in FIG. 7 can be obtained.

Further, a method for manufacturing a semiconductor device has been disclosed in Patent Document 2, in which after forming a laminate by laminating four semiconductor substrates, the opposing semiconductor substrates are soldered with each other through application of heat, followed by sealing with a resin, thereby injecting the resin between the semiconductor substrates.

CITATION LIST

Patent Documents

Patent Document 1: Japanese Unexamined Patent Application, First Publication No. 2011-29392
Patent Document 2: Japanese Unexamined Patent Application, First Publication No. 2010-278334

SUMMARY OF INVENTION

Problem to be Solved by the Invention

However, in the method for manufacturing a semiconductor device described in Patent Document 1, there is a problem, in terms of time and the like, in productivity at the time of soldering, since soldering is performed repeatedly every time a semiconductor chip is laminated. Furthermore, because soldering is performed repeatedly every time a semiconductor chip is laminated, there is a concern about adverse effect of heat to the semiconductor chip in the lower layer during the soldering.

On the other hand, in the method for manufacturing a semiconductor device described in Patent Document 2, because a resin is filled in the gap between the semiconductor substrates after soldering the semiconductor substrates with each other, the filling of the resin is difficult, thereby causing a problem in productivity.

Means for Solving the Problem

The present invention provides a method for manufacturing a semiconductor device which includes at least a step (A) to be described below; a step of obtaining a laminate, in which n semiconductor components and n resin layers are laminated alternately in this order, by heating and pressurization at a temperature equal to or lower than the temperature at which the solder layer melts; and a soldering step in which the laminate is heated and pressurized at a temperature equal to or lower than the temperature at which the solder layer melts.

A first aspect of the present invention is a manufacturing method described below.

(1) A method of manufacturing a semiconductor device, the method including:

a step (A) which is a step of preparing one or more combinations of n semiconductor components and n resin layers, and one substrate,
in which the n semiconductor components are constituted from first to nth semiconductor components that are laminated in this order through resin layers,
the n resin layers are constituted from first to nth resin layers that are used sequentially,
the aforementioned substrate has a plurality of connection terminals for connecting with the first semiconductor component on one side,
the first semiconductor component has a connection terminal for connecting with the substrate on one side and a connection terminal for connecting with another semiconductor component on the other side,
each of second to n−1th semiconductor components has a connection terminal for connecting with another semiconductor component on both sides,
the nth semiconductor component has a connection terminal for connecting with the n−1th semiconductor component,
in the first to the nth semiconductor components, at least one of connection terminals, that are facing each other through a resin layer when the semiconductor components are laminated sequentially, has a solder layer, and
in the first semiconductor component and the substrate, at least one of the connection terminal of the first semiconductor component for connecting with the substrate and the connection terminal of the substrate for connecting with the first semiconductor component that are facing each other has a solder layer,
with a proviso that n is an integer of 2 or more;

a first bonding step (B) of bonding the substrate and the first semiconductor component through the first resin layer in a semi-cured state, by laminating at least one first resin layer and at least one first semiconductor component in this order, on the substrate, to form at least one laminated structure, followed by heating at a temperature at which the resin layer is semi-cured and which is lower than a temperature at which the solder layer melts;

a repetitive bonding step (C) of obtaining, on the substrate, at least one laminate in which (n−1) resin layers and (n−1) semiconductor components are laminated alternately, by repeating a process until the n−1th semiconductor component is bonded, in which another resin layer and another semiconductor component are laminated in this order on the semiconductor component which has been bonded, followed by heating at a temperature which is lower than a temperature at which the solder layer melts, to bond the semiconductor component through the resin layer in a semi-cured state, with the proviso that this step is omitted when n equals 2;

a step (D) of preparing a pair of clamping members, and, on one clamping member, mounting the substrate on which at least one laminate is laminated, with the proviso that this step is omitted in those cases where the substrate is already mounted on a pair of clamping members in a step prior to this;

a step (E) of obtaining, on the substrate, at least one laminate in which n resin layers and n semiconductor components are laminated alternately, by further laminating the nth resin layer and the nth semiconductor component in this order on the n−1th semiconductor component in the laminate which is mounted on the clamping member;

a clamping and soldering step (F) of obtaining a structure which is a soldered laminate, by clamping the substrate and the laminate from a substrate side and a side of the nth semiconductor component with the one clamping member and the other clamping member, and also by heating the substrate and laminate at a temperature equal to or higher than a temperature at which the solder layer melts, to carry out soldering between connection terminals that are facing each other; and a curing step (G) of heating at a temperature which is equal to or higher than a curing temperature of the resin layer, to thereby promote curing of the first to nth resin layers.

It is preferable that the above-mentioned manufacturing method (1) have the following characteristics (2) to (15).

(2) The method of manufacturing a semiconductor device according to (1), in which each of the resin layers includes a thermosetting resin of not less than 30% by weight and not more than 70% by weight, and the n is any one of integers selected from the group consisting of 2, 3, 4, 5, 6, 7, 8, 9, and 10.

(3) The method of manufacturing a semiconductor device according to (1) or (2), in which a plurality of first resin layers are disposed on the substrate, and the first semiconductor components are laminated on each of the first resin layers, in the first bonding step (B); and in the repetitive bonding step (C), another resin layer and semiconductor component are laminated in this order, on each of a plurality of the first semiconductor components.

(4) The method of manufacturing a semiconductor device according to (1) or (2), further including:

a repeating step (C'), prior to the mounting step (D), of repeating several times a combination of the first bonding step (13), which forms one laminate and the repetitive bonding step (C), thereby forming a plurality of laminates on the substrate;

or a repeating step (C''), prior to the curing step (G), of repeating several times a combination of the steps (B) to (F), which forms one laminate, thereby forming a plurality of laminates on the substrate.

(5) The method of manufacturing a semiconductor device according to any one of (1) to (4), wherein the step (A) is a step in which the n is 3, and the first semiconductor component, the second semiconductor component, the third semiconductor component, the substrate, the first resin layer, the second resin layer, and the third resin layer are prepared as the semiconductor and resin layer;

the first bonding step (B) is a step of bonding the substrate and the first semiconductor component through the first resin layer in a semi-cured state, by laminating the first resin layer and the first semiconductor component in this order on the substrate, followed by heating;

the aforementioned repetitive bonding step (C) is a step of bonding the aforementioned first semiconductor component and the second semiconductor component through the second resin layer in a semi-cured state, by laminating the second resin layer and the second semiconductor component in this order on the first semiconductor component, followed by heating;

the step (D) is a step of preparing a pair of clamping members and mounting the substrate, first resin layer, first semiconductor component, second resin layer, and second semiconductor component on one clamping member;

the step (E) is a step of configuring a laminate on the substrate by installing the third semiconductor component on the second semiconductor component through the third resin layer;

the clamping and soldering step (F) is a step of obtaining a structure which is a soldered laminate, by clamping the laminate with the one clamping member and the other clamping member, followed by heating to carry out soldering; and the aforementioned curing step (G) is a step of promoting curing of the first resin layer, second resin layer, and third resin layer.

(6) The method of manufacturing a semiconductor device according to (5), in which the first resin layer, the second resin layer and the third resin layer include a thermosetting resin; and in the curing step, heating is carried out while pressurizing the structure with a fluid to promote curing of the first resin layer, second resin layer, and third resin layer.

(7) The method of manufacturing a semiconductor device according to (5) or (6), in which at least one of second semiconductor component connection terminal of the third semiconductor component and third semiconductor component connection terminal of the second semiconductor component includes a solder layer, at least one of first semiconductor component connection terminal of the second semiconductor component and second semiconductor component connection terminal of the first semiconductor component includes a solder layer, and at least one of substrate connection terminal of the first semiconductor component and first semiconductor component connection terminal of the substrate includes a solder layer.

(8) The method of manufacturing a semiconductor device according to any one of (5) to (7), further including, prior to the step (B):

a sub-step of providing a resin layer constituting the third resin layer on at least one of a surface in which the third semiconductor component connection terminal of the second semiconductor component is formed, and a surface in which the second semiconductor component connection terminal of the third semiconductor component is provided;

providing a resin layer constituting the second resin layer on at least one of a surface in which the second semiconductor component connection terminal of the first semiconductor component is formed, and a surface in which the first semiconductor component connection terminal of the second semiconductor component is provided; and providing a resin layer constituting the first resin layer on at least one of a surface in which the first semiconductor components connection terminal of the substrate is formed, and a surface in which the substrate connection terminal of the first semiconductor component is provided.

(9) The method of manufacturing a semiconductor device according to any one of (5) to (8), in which the step (D) of mounting the substrate is a step of preparing a device including a pair of clamping members that are preheated and oppositely disposed and an installing section in which the laminate is installed, which is disposed between the pair of clamping members while being spaced apart from them, and disposing the laminate on the installing section; and the clamping and soldering step (F) is a step of carrying out soldering by heating, while clamping the laminate and the installing section, with the pair of clamping members which are heated.

(10) The method of manufacturing a semiconductor device according to (9), in which among the pair of clamping members, a temperature of one clamping member is lower than a temperature of the other clamping member.

(11) The method of manufacturing a semiconductor device according to any one of (5) to (10), further including, after the curing step:

a cutting step of cutting the substrate for each of the structures;

in which the structure includes at least the third resin layer, the third semiconductor component, the second resin layer, the second semiconductor component, the first resin layer, and the first semiconductor component, and has a structure in which the resin layers and the semiconductor components are laminated alternately;

two or more of the structures are formed on the substrate; and in the curing step, curing of the first resin layer, the second resin layer, and the third resin layer, that are included in a plurality of the structures formed on the substrate, is promoted.

(12) The method of manufacturing a semiconductor device according to any one of (5) to (12), in which the second semiconductor component is a semiconductor chip of a TSV structure which has a substrate and a through-via that penetrates through the substrate, and the through-via is connected to the third semiconductor component connection terminal and the first semiconductor component connection terminal;

the first semiconductor component is a semiconductor chip of a TSV structure which has a substrate and a through-via that penetrates through the substrate, and the through-via is connected to the second semiconductor component connection terminal and a terminal provided on a surface of the substrate which is opposite to a surface on which the second semiconductor component connection terminal is provided.

(13) The method of manufacturing a semiconductor device according to any one of (1) to (12), further including at least one of the following characteristics:

(i) the solder layer has a melting point of 110 to 250° C.; and (ii) the resin layer includes a thermosetting resin, and a flux active compound of 1 to 30% by weight which has at least one of carboxyl groups and phenolic hydroxyl groups.

(14) The method of manufacturing a semiconductor device according to any one of (1) to (13), further including at least one of the following characteristics:

(iii) includes a step of pressurizing the substrate and the laminate with a fluid, which is carried out in a vessel where the fluid is introduced;

(iv) the resin layer includes a thermosetting resin;

(v) heating in the curing step is performed by use of a pressurizing fluid which is heated, or by heating of a vessel.

(15) The method of manufacturing a semiconductor device according to (14), further including at least one of the following characteristics:

(vi) the solder layer has a melting point of 170 to 230° C.;

(vii) the fluid is air or an inert gas;

(viii) pressing force for pressurizing the laminate is from not less than 0.1 MPa to not more than 10 MPa.

(16) A second aspect of the present invention is a manufacturing method described below.

A method of manufacturing a semiconductor device, the method including:

a step (A) which is a step of preparing one or more combinations of n semiconductor components and n resin layers, and one substrate, in which the n semiconductor components are constituted from first to nth semiconductor components that are laminated in this order through resin layers, the n resin layers are constituted from first to nth resin layers that are used sequentially, the substrate has a plurality of connection terminals for connecting with the first semiconductor component on one side of the substrate, the first semiconductor component has a connection terminal for connecting with the substrate on one side thereof and a connection terminal for connecting with another semiconductor component on the other side thereof, each of the second to n−1th semiconductor components has a connection terminal for connecting with another semiconductor component on both sides, the nth semiconductor component has a connection terminal for connecting with the n−1th semiconductor component, in the first to the nth semiconductor components, at least one of connection terminals, that are facing each other through a resin layer when the semiconductor components are laminated sequentially, has a solder layer, in the first semiconductor component and the substrate, at least one of the connection terminal of the first semiconductor component for connecting with the substrate and the connection terminal of the substrate for connecting with the first semiconductor component that are facing each other has a solder layer, with a proviso that n is an integer of 2 or more;

a first bonding step (B) of bonding the substrate and the first semiconductor component through the first resin layer in a semi-cured state, by laminating at least one first resin layer and at least one first semiconductor component in this order, on the substrate, to form at least one laminate structure, followed by heating the structure at a temperature at which the resin layer is semi-cured and which is lower than a temperature at which the solder layer melts;

a second bonding step (b-1) of bonding the first semiconductor component and the second semiconductor component through the second resin layer in a semi-cured state, by laminating the second resin layer and the second semiconductor component in this order on the first semiconductor component which has been bonded, followed by heating at a temperature at which the resin layer is semi-cured, and which is lower than a temperature at which the solder layer melts;

a repetitive bonding step (c) of obtaining at least one laminate in which n resin layers and n semiconductor components are laminated alternately on the substrate, by repeating (n−1) times a sequential bonding on the second semiconductor component under the same conditions as those in the second bonding step until the nth semiconductor component is bonded, with a proviso that this step is omitted when n equals 2;

a step (D) of preparing a pair of clamping members, and, on one clamping member, mounting the substrate on which at least one laminate is provided, with the proviso that this step is omitted in those cases where the substrate is already mounted on a pair of clamping members in a step prior to this;

a step (e) of pressurizing the substrate and the laminate with a fluid;

a step (f) of clamping the substrate and the laminate from a substrate side and a side of the nth semiconductor component with the one clamping member and the other clamping member;

a soldering and curing step (g) of obtaining a structure which is a soldered laminate, by heating the substrate and laminate at a temperature equal to or higher than a temperature at which the solder layer melts, to carry out soldering between connection terminals that are facing each other, while promoting curing of the first to the nth resin layers.

It is preferable that the above-mentioned manufacturing method (16) have the following characteristics (17) to (30).

(17) The method of manufacturing a semiconductor device according to (16), in which each of the resin layers includes a thermosetting resin of not less than 30% by weight and not more than 70% by weight, and the n is any one of integers selected from the group consisting of 2, 3, 4, 5, 6, 7, 8, 9, and 10.

(18) The method of manufacturing a semiconductor device according to (16) or (17), in which a plurality of first resin layers are disposed on the substrate, and the first semiconductor components are laminated on each of the first resin layers, in the first bonding step (B); and in the second bonding step (b-1), another resin layer and semiconductor component are laminated in this order, on each of a plurality of the first semiconductor components.

(19) The method of manufacturing a semiconductor device according to (16) or (17), further including a repeating step (c'), prior to the mounting step (D), of repeating several times a combination of the first bonding step (B) wherein one laminate is formed, the second bonding step (b-1), and the repetitive bonding step (c) to form a plurality of laminates on the substrate;

or further including a repeating step (C") of repeating several times a combination of the steps (B) to (g) wherein one laminate is formed, thereby forming a plurality of laminates on the substrate.

(20) The method of manufacturing a semiconductor device according to any one of (16) to (19), including:

the step (A) which is a step in which the n is 3, and the third semiconductor component having a connection terminal for connecting with the second semiconductor component on one side, the second semiconductor component having a connection terminal for connecting with the first semiconductor components on one side and a connection terminal for connecting with the third semiconductor component on the other side, the first semiconductor component having a connection terminal for connecting with the substrate on one side and a connection terminal for connecting with the second semiconductor component on the other side, the substrate having a plurality of connection terminals for connecting with the first semiconductor component on one side, the third resin layer, the second resin layer, and the first resin layer are prepared, as the semiconductor and resin layer, the first bonding step (B) is a first bonding step in which the substrate and the first semiconductor component are bonded through the first resin layer in a semi-cured state by laminating the first resin layer and the first semiconductor component in this order on the substrate, followed by heating;

the second bonding step (b-1) is a step of bonding the first semiconductor component and the second semiconductor component through the second resin layer in a semi-cured state by laminating the second resin layer and the second semiconductor component in this order on the first semiconductor component, followed by heating, the repetitive bonding step (c) is a step of obtaining at least one laminate constituted of at least the third semiconductor component, the third resin layer, the second semiconductor component, the second resin layer, and the first semiconductor component, in which the resin layers and the semiconductor components are laminated alternately, by a step in which the second semiconductor component and the third semiconductor component are bonded through the third resin layer in a semi-cured state by laminating the third resin layer and the third semiconductor component in this order on the second semiconductor component, followed by heating;

the step (D) is a step of preparing a pair of clamping members and, above one clamping member, mounting a plurality of the laminates that are laminated on the substrate;

the step (e) is a step of pressurizing, with a fluid, the substrate and the laminate that are mounted;

the step (f) is a step of clamping, while pressurizing, the substrate and the laminate with the one clamping member and the other clamping member while applying pressure; and the step (g) is a step of heating, while clamping, the substrate and the laminate to carry out soldering, and also to promote curing of the third resin layer, second resin layer, and first resin layer.

(21) The method of manufacturing a semiconductor device according to (20), in which at least one of second semiconductor component connection terminal of the third semiconductor component and third semiconductor component connection terminal of the second semiconductor component includes a solder layer, at least one of first semiconductor component connection terminal of the second semiconductor component and second semiconductor component connection terminal of the first semiconductor component includes a solder layer, and at least one of substrate connection terminal of the first semiconductor component and first semiconductor component connection terminal of the substrate includes a solder layer.

(22) The method of manufacturing a semiconductor device according to (20) or (21), further including, prior to the step (B):

a sub-step of providing a resin layer constituting the first resin layer on at least one of a surface of the second semiconductor component where the third semiconductor component connection terminal is formed, and a surface of the third semiconductor component where the second semiconductor component connection terminal is provided;

providing a resin layer constituting the second resin layer on at least one of a surface of the first semiconductor component where the second semiconductor component connection terminal is formed, and a surface of the second semiconductor component where the first semiconductor component connection terminal is provided; and providing a resin layer constituting the first resin layer on at least one of a surface of the substrate where the first semiconductor components connection terminal is formed, and a surface of the first semiconductor component where the substrate connection terminal is provided.

(23) The method of manufacturing a semiconductor device according to any one of (20) to (22), in which the step (D) of mounting the substrate is a step of preparing a device including a pair of clamping members that are preheated and oppositely disposed and an installing section which is disposed between the pair of clamping members while being spaced apart from them, and disposing, a plurality of the laminates laminated on the substrate, on the installing section spaced apart from the pair of clamping members; and the soldering step (g) is a step of carrying out soldering by heating while clamping a plurality of the laminates that are laminated on the substrate with the pair of clamping members.

(24) The method of manufacturing a semiconductor device according to (23), in which among the pair of clamping members, a temperature of one clamping member is lower than a temperature of the other clamping member.

(25) The method of manufacturing a semiconductor device according to any one of (20) to (24), in which two or more of the laminates are formed on the substrate; and includes, after the soldering step, a cutting step of cutting the substrate for each of the laminates.

(26) The method of manufacturing a semiconductor device according to any one of (20) to (25), in which the second semiconductor component is a semiconductor chip of a TSV structure which includes a substrate and a through-via that penetrates through the substrate, and the through-via is connected to the third semiconductor component connection terminal and the first semiconductor component connection terminal; and the first semiconductor component is a semiconductor chip of a TSV structure which includes a substrate and a through-via that penetrates through the substrate, and the through-via is connected to the second semiconductor component connection terminal and a terminal provided on a surface of the substrate wherein the surface is opposite to a surface on which the second semiconductor component connection terminal is provided, among surfaces of the substrate.

(27) The method of manufacturing a semiconductor device according to any one of (16) to (26), further including at least one of the following characteristics: (i) the solder layer has a melting point of 110 to 250° C.; and (ii) the resin layer includes a thermosetting resin, and a flux active compound of 1 to 30% by weight which has at least one of carboxyl groups and phenolic hydroxyl groups.

(28) The method of manufacturing a semiconductor device according to any one of (16) to (27), further including at least one of the following characteristics:

(iii) the step of pressurizing the substrate and the laminate with a fluid is carried out in a vessel where the fluid is introduced;

(iv) the resin layer includes a thermosetting resin; and (v) heating for solder curing and curing of the resin layer is performed by the clamping members that are heated.

(29) The method of manufacturing a semiconductor device according to any one of (16) to (28), further including at least one of the following characteristics:

(vi) the solder layer has a melting point of 170 to 230° C.;

(vii) the fluid is air or an inert gas; and (viii) pressing force for pressurizing the laminate is from not less than 0.1 MPa to not more than 10 MPa.

(30) The method of manufacturing a semiconductor device according to any one of (16) to (29), further including, after the step (g), a post-curing step of carrying out heating and pressurization in order to completely cure the resin layer of the laminate.

Effects of Invention

According to the present invention, a method of manufacturing a semiconductor device capable of improving the productivity and reliability is provided.

BEST MODE FOR CARRYING OUT THE INVENTION

Preferred examples and embodiments of the present invention will be described below with reference to the drawings. However, the present invention is not limited only to each of the following examples and embodiments. For example, the constituting elements and conditions of these preferred examples and embodiments may be suitably combined. Further, it is also possible to combine other constituting elements as long as there is no problem. Various changes in position, number, size, quantity or the like can be added within a range that does not fall outside the spirit of the present invention.

In the present invention, although resin layers and semiconductor components are laminated in order on the substrate, the number of combinations of the aforementioned resin layers and semiconductor components is not limited and there is no upper limit. By way of example, the number of combinations may be 2 to 20, 2 to 16, 2 to 8, or 2 to 6, and any one of two, four, and six is preferred.

First Embodiment

As a first embodiment of the present invention, a method will be described in which a bonding step and soldering step are carried out simultaneously to the resin layer and semiconductor component that are provided at the end.

FIGS. 1A to 3B show a method for manufacturing a semiconductor device in which 4 layers of semiconductor components are laminated, which is a preferred embodiment of the present invention.

Figure 13A:
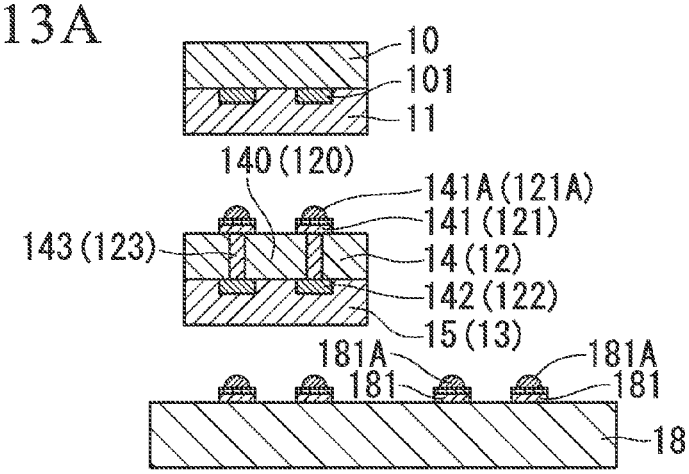
FIG. 13A is a schematic process diagram showing an example of a method of manufacturing a semiconductor device of the present invention.
Figure 13B:
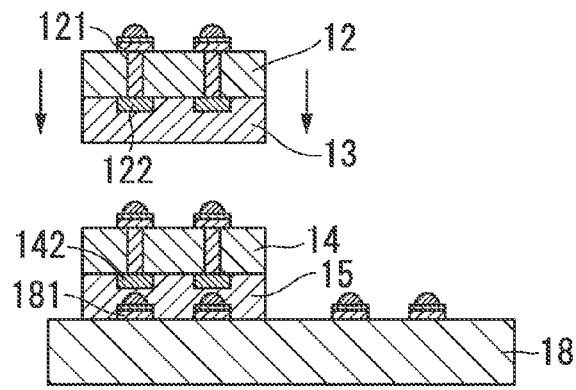
FIG. 13B is a schematic process diagram showing an example of a method of manufacturing a semiconductor device of the present invention.
Figure 13C:
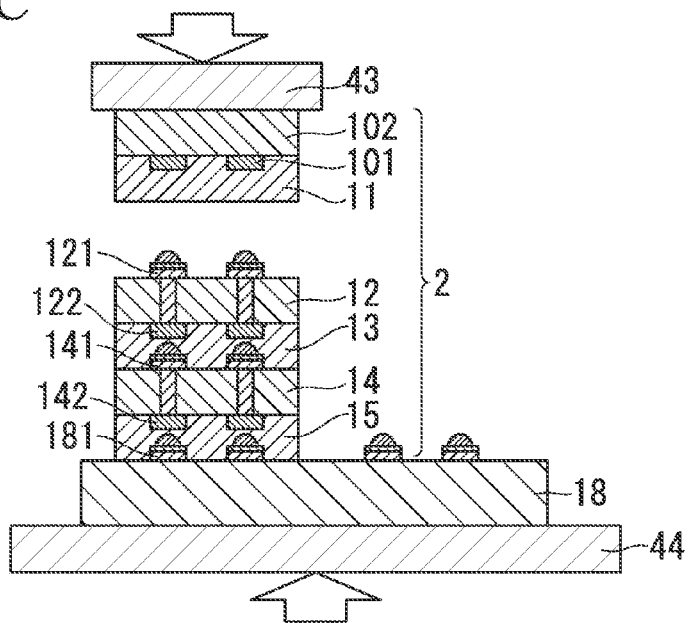
FIG. 13C is a schematic process diagram showing an example of a method of manufacturing a semiconductor device of the present invention.
Figure 13D:
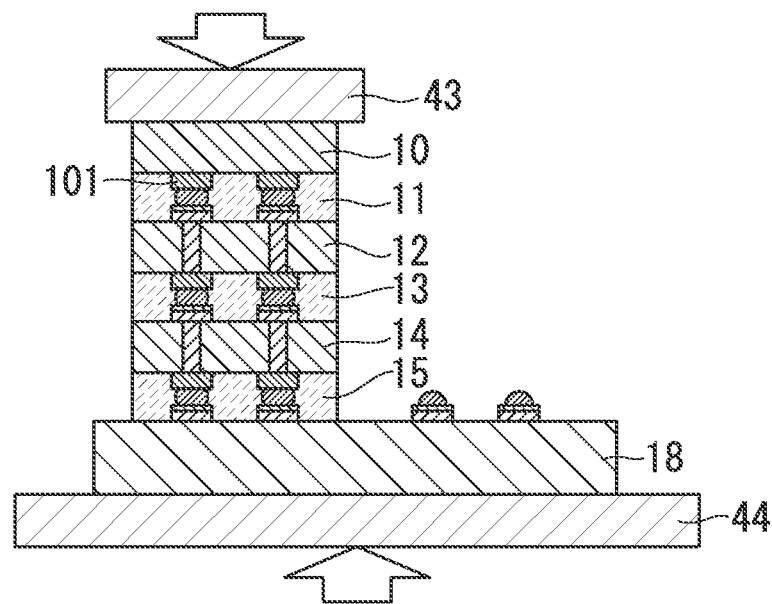
FIG. 13D is a schematic process diagram showing an example of a method of manufacturing a semiconductor device of the present invention.

FIGS. 13A to 13D show a method for manufacturing a semiconductor device that includes 3 layers of semiconductor components, which is a preferred embodiment of the present invention, and FIG. 13D shows a state where the solder is melted by applying heat and pressure to complete the soldering.

Figure 1A:
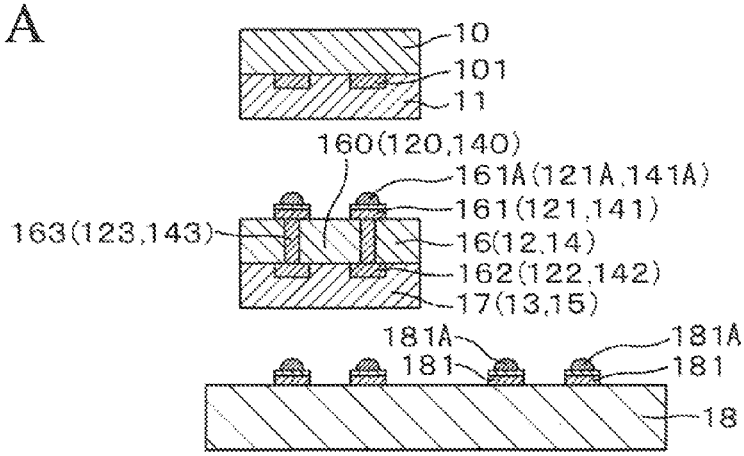
FIG. 1A is a schematic cross-sectional view showing an example of a process of manufacturing a semiconductor device of the present invention.
Figure 1B:
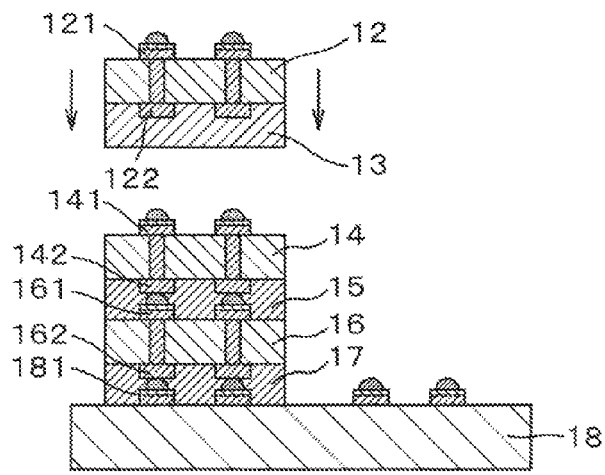
FIG. 1B is a schematic cross-sectional view showing an example of a process of manufacturing a semiconductor device of the present invention.

It is possible to manufacture a semiconductor device that includes three layers of semiconductor components shown in FIGS. 13A to 13D by omitting a step for providing a resin layer 17 and a semiconductor component 16 from FIGS. 1A to 1B, providing a resin layer 15 directly on a substrate 18 as a first resin layer, and carrying out the subsequent steps sequentially.

Figure 1C:
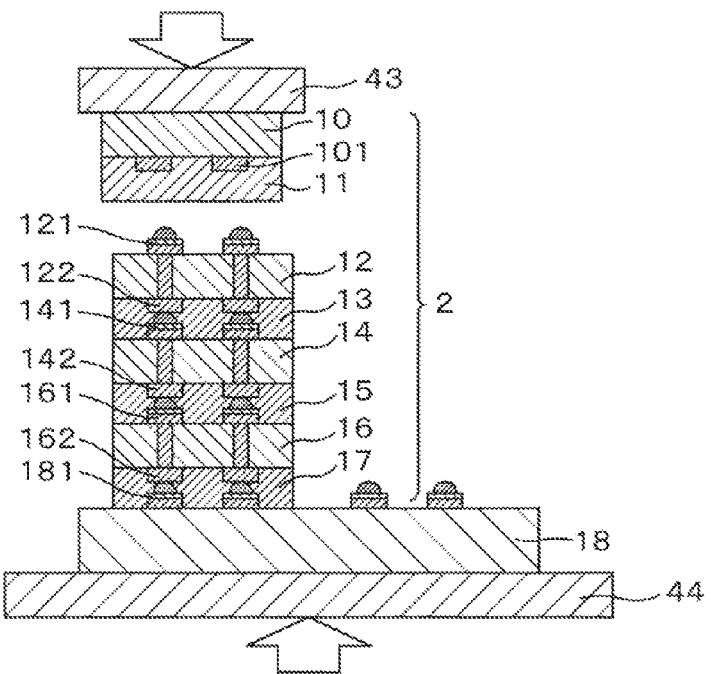
FIG. 1C is a schematic cross-sectional view showing an example of a process of manufacturing a semiconductor device of the present invention.

It is possible to manufacture a semiconductor device that includes two layers of semiconductor components by omitting a step for providing resin layers 17 and 15 and semiconductor components 16 and 14 from FIGS. 1A to 1C, providing a resin layer 13 directly on a substrate 18 as a first resin layer, and carrying out the subsequent steps sequentially.

An overview of the present embodiment which is a method for manufacturing a semiconductor device 1 (having a 4-layer structure) will be described below with reference to FIGS. 1A to 3B.

The method for manufacturing a semiconductor device 1 according to the first embodiment includes: a step for preparing the members of a first semiconductor component 16, a second semiconductor component 14, a third semiconductor component 12, a fourth semiconductor component 10, a substrate 18, a first resin layer 17, a second resin layer 15, a third resin layer 13, and a fourth resin layer 11; a step for obtaining a laminate; a bonding step; and a curing step.

As shown in FIG. 1A, in the step for preparing the members, a semiconductor chip (first semiconductor component) 16, a semiconductor chip (second semiconductor component) 14, a semiconductor chip (third semiconductor component) 12, a semiconductor chip (fourth semiconductor component) 10, a substrate 18, a resin layer (first resin layer) 17, a resin layer (second resin layer) 15, a resin layer (third resin layer) 13, and a resin layer (third resin layer) 11 are prepared.

If necessary, to the semiconductor component, terminals, solder layers or vias are provided at a position that can be selected arbitrarily. Although a terminal is essential to the semiconductor component that is provided at the top, there may be cases where a via or semiconductor layer is not provided. In addition, a terminal is also provided on a substrate, and a solder layer is provided on the terminal if necessary.

As shown in FIG. 1B, in the step for obtaining a laminate, the first resin layer 17 and the first semiconductor component 16 are laminated on the substrate 18 in this order. Then, by heating, the substrate 18 and the first semiconductor component 16 are bonded through the first resin layer 17 which is in a semi-cured state. Thereafter, the second resin layer 15 and the second semiconductor components 14 are laminated on the first semiconductor component 16 in this order. Then, by heating, the first semiconductor component 16 and the second semiconductor component 14 are bonded through the second resin layer 15 which is in a semi-cured state. Thereafter, the third resin layer 13 and the third semiconductor component 12 are laminated on the second semiconductor component 14 in this order. Then, by heating, the third semiconductor component 13 and the second semiconductor component 14 are bonded through the third resin layer 13 which is in a semi-cured state.

Next, as shown in FIG. 1C, a pair of clamping members 43 and 44 are prepared. On one of the clamping members 44, the substrate 18, the first resin layer 17, the first semiconductor component 16, the second resin layer 15, the second semiconductor component 14, the third resin layer 13, and the third semiconductor component 12 are mounted. In those cases where the substrate is disposed in advance on the pair of clamping members, the subsequent steps of laminating and soldering may be carried out while the substrate is disposed on the clamping members. After mounting, the fourth semiconductor component 10 is installed on the third semiconductor component 12 through the fourth resin layer 11 to obtain a laminate, prior to the soldering. At this time, although heating and/or pressurization is not carried out in the embodiment, one or both thereof may be carried out.

Next, in the soldering step, a laminate 2 is clamped with one clamping member 44 and the other clamping member 43, followed by heating, to carry out the soldering. As a result, a structure is obtained that has been soldered.

Further, if necessary, a curing step is carried out, and in this step, the curing of the first resin layer 17, the second resin layer 15, the third resin layer 13 and the first resin layer 11 is promoted.

Next, the method for manufacturing the semiconductor device 1 of the present embodiment will be described in detail.

(Step for Preparing Members)

First, as shown in FIG. 1A, the semiconductor chip 16 (14, 12), the semiconductor chip 10, the substrate 18, and the resin layer 17 (15, 13, 11) are prepared. Apart from the semiconductor chip 10 that is disposed at the uppermost section, it is preferred that the semiconductor chips 16, 14 and 12 have the same structure.

The semiconductor chip 16 used in the present embodiment is a semiconductor element of a Through-Silicone via (TSV) structure having a substrate (silicon substrate) 160, and a via 163 that penetrates the substrate 160. A terminal 161 is provided on one surface of the substrate 160, and a terminal 162 is provided on the other surface thereof. The terminal 161 and the terminal 162 are connected through the via 163. The terminal 162 of the first semiconductor component (semiconductor chip) 16 is connected to a terminal located at a position opposite to this terminal. More specifically, the terminal 162 is a connection terminal connected to a terminal of the substrate 18. The terminal 161 of the first semiconductor component 16 is a connection terminal connected to the second semiconductor component (semiconductor chip) 14 that is located thereon through a resin layer.

The via 163 may be constituted of a material selected arbitrarily, and, for example, can be configured using a metal such as copper and tungsten, or conductive polysilicon doped with impurities.

The terminals used in the present invention can be selected arbitrarily. They may have a structure selected arbitrarily, and they may also be constituted of a material selected arbitrarily. Although not shown in the drawing, the terminal 162 has a structure in which a copper layer, a nickel layer, and a gold layer are laminated in this order from the substrate 160 side. That is, the copper layer is in contact with the semiconductor component. Other terminals may also have this configuration.

The terminal 161 has a solder layer 161A on the surface. For example, as shown in the drawing, the connection terminal 161 is configured by laminating a nickel layer on a copper layer. The solder layer 161A is further provided on top of the connection terminal 161 so as to at least partially cover the nickel layer. The solder layer may cover the entire surface of the connection terminal. The solder layer 161A may be a structure that is provided so as to cover the copper layer.

The material of the solder layer 161A is not particularly limited. Examples of the aforementioned materials include alloys containing at least one type selected from the group consisting of tin, silver, lead, zinc, bismuth, indium and copper. Among them, an alloy containing at least one type selected from the group consisting of tin, silver, lead, zinc, and copper is preferred. The melting point of the solder layer 161A (the temperature at which the solder layer melts) can be selected arbitrarily in accordance with the solder to be used, but is preferably from 110 to 260° C., more preferably from 110 to 250° C., even more preferably from 140 to 250° C., even more preferably from 160 to 240° C., and particularly preferably from 170 to 230° C. The melting point of the solder is generally known as long as the composition thereof is known. Further, even in those cases where the melting point is unknown, it is possible to know from the product data as long as the product is purchased, or it can also be measured easily by using a thermal analysis instrument or the like.

The substrate 18 can be selected as needed. For example, the substrate may be an organic substrate, such as a resin substrate, or may be a silicon wafer as a semiconductor chip assembly, a silicon substrate, a glass substrate, a ceramic substrate, or the like. A silicon substrate having a thermal expansion coefficient substantially equal to that of the semiconductor components is preferred. A substrate with a TSV structure or through glass via (TGV) structure may be used.

In the substrate 18, a terminal (connection terminal) 181 is formed on the surface. The terminal 181 has a solder layer 181A on the surface thereof. It is possible to omit the solder layer of the terminal 181A when the terminal connected thereto has a solder layer. The connection terminal 181 can be arbitrarily selected. For example, the one shown in the drawing is a structure formed by laminating a nickel layer on a copper layer. The solder layer 181A is further provided on top of this terminal so as to cover the nickel layer. Further, it may be a structure with no nickel layer in which the solder layer 181A is provided so as to directly cover the copper layer. The terminal 181 is connected to the terminal 162 of the semiconductor chip 16.

The resin layer 17 is provided on the surface (lower surface) side of the semiconductor chip 16 on which the terminal 162 of the substrate 160 is provided.

The resin layer 17 covers the terminal 162. The resin layer 17 is a layer containing a thermosetting resin as an essential component, and the details thereof will be described later. In addition, the resin layer preferably contains a flux active compound. As a result, because the metal surface is cleaned by the action of the flux activity at the time of soldering, a bonded structure can be formed with higher reliability. It should be noted that a flux may be coated to the surface of the semiconductor chip as required in the present invention. It is also possible to omit the coating of flux due to the inclusion of a flux active compound in the resin layer.

Further, the semiconductor chip 14, the semiconductor chip 12, and the semiconductor chip 10 that are prepared are laminated (refer to FIGS. 1B and C).

The semiconductor chips 14 and 12 have the same structure as that of the semiconductor chip 16. In other words, like the semiconductor chip 16, the semiconductor chip 14 and the semiconductor chip 12 are semiconductor elements having a TSV structure.

The semiconductor chip 14 includes a substrate (silicon substrate) 140, a via 143 that penetrates through the substrate 140, and a pair of terminals 142 and 141 that are connected to the via 143. The terminal 142 disposed on the lower surface of the chip 14 is a connection terminal to be connected to the terminal of the semiconductor chip 16. The terminal 141 disposed on the upper surface of the chip 14 is a connection terminal to be connected to the terminal of the semiconductor chip 12. The semiconductor chip 12 includes a substrate (silicon substrate) 120, a via 123 that penetrates through the substrate 120, and a pair of terminals 122 and 121 that are connected to the via 123. The terminal 122 disposed on the lower surface of the chip 12 is a connection terminal to be connected to the terminal of the semiconductor chip 14. The terminal 121 is a connection terminal to be connected to the terminal of the semiconductor chip 10.

In the semiconductor chip 10, a terminal 101 (terminal for connecting to the semiconductor chip 12) is provided on the substrate surface. In the present embodiment, a via that penetrates through the substrate of the semiconductor chip 10 is not provided. The connection terminal 101 of the chip 10 can be selected arbitrarily. For example, the terminal has a structure in which a copper layer, a nickel layer, and a gold layer are laminated in this order from the substrate side. However, it should be noted that the structure of the connection terminal 101 is not limited thereto.

It is preferable that the vias 143 and 123 be composed of the same material as that of the via 163. It is preferable that the structure and material of the terminals 142 and 122 be the same as those of the terminal 162. It is preferable that the structure and material of the terminals 141 and 121 be the same as those of the terminal 161. It should be noted that the reference symbols 141A and 121A denote the solder layers, and these are preferably solder layers composed of the same material as that of the solder layer 161A.

The semiconductor chip and the resin layer may be laminated separately, or a semiconductor chip in which a resin layer is attached may be used.

The resin layer 15 which covers the terminal 142 is provided in advance on the lower surface of the semiconductor chip 14 as shown in FIG. 1A. In addition, the resin layer 13 covering the terminal 122 is provided in advance on the lower surface of the semiconductor chip 12.

As a method of providing the resin layers 11, 13, 15, and 17 to the semiconductor chips 10, 12, 14, and 16, respectively, for example, the following methods can be used.

For example, the resin layers 11, 13, 15, and 17 may be attached to the semiconductor chips 10, 12, 14, and 16, respectively, to prepare a plurality of combinations of the semiconductor chips to which resin layers are attached.

Moreover, it is also possible to use the following method. A wafer wherein the semiconductor chips 10, 12, 14, and 16 are integrated is prepared in advance. To this wafer, a resin sheet formed by integrating the resin layers 11, 13, 15, and 17 is attached. Then, a combination of resin sheet and wafer is subjected to dicing. In this way, it is also possible to prepare the semiconductor chip 10 provided with the resin layer 11, the semiconductor chip 12 provided with the resin layer 13, the semiconductor chip 14 provided with the resin layer 15, and the semiconductor chip 16 provided with the resin layer 17 with such a method.

Furthermore, it is also possible to use the following method. A wafer wherein the semiconductor chips 10, 12, 14, and 16 are integrated is prepared. Layers are formed on this wafer by spin coating to form layers which become the resin layers 11, 13, 15, and 17 after cutting, and performing dicing subsequently. It is also possible to prepare the semiconductor chip 10 provided with the resin layer 11, the semiconductor chip 12 provided with the resin layer 13, the semiconductor chip 14 provided with the resin layer 15, and the semiconductor chip 16 provided with the resin layer 17 with such a method.

It should be noted that in the present embodiment, the semiconductor chips 10, 12, 14, and 16 have the same size in planer view (planer view when viewed from the substrate surface side). In addition, the thickness of the substrates 120, 140, and 160 of the semiconductor chips 12, 14, and 16 can be selected arbitrarily. The thickness is preferably from 10 μm or more to 150 μm or less, more preferably from 20 μm or more to 100 μm or less, and even more preferably 50 μm or less. As described above, it is preferable to use a very thin substrate.

(Step for Obtaining a Laminate)

Next, as shown in FIGS. 1A, B, and C, a laminate is obtained. First, the resin layer 17 and the semiconductor chip 16 are laminated on the substrate 18 in this order. Then, by heating, the substrate 18 and the semiconductor chip 16 are bonded through the first resin layer 17 which is in a semi-cured state.

It is also possible to carry out temporary bonding by mounting the substrate 18 on one of the pair of clamping members that have a built-in heater in advance; laminating the resin layer 17 and the semiconductor chip 16 thereon in this order; and heating while sandwiching them with the clamping members. The clamping members may be heated to a predetermined temperature before mounting the substrate 18. It is also possible to carry out lamination by attaching the resin layer 17 and the semiconductor chip 16 to the other clamping member, which has been heated to a predetermined temperature, if necessary, and using the resultant to obtain the laminate. The clamping members may be heated after the mounting and/or attachment, followed by bonding.

At the time of bonding, it is preferable to perform an alignment by checking the alignment mark formed on the substrate 18 and the alignment mark formed on the semiconductor chip 16. The aforementioned bonding (temporary bonding) is carried out under conditions in which the solder layer does not melt. For example, the substrate 18, the resin layer 17, and the semiconductor chip 16 can be heated by sandwiching the substrate 18, the resin layer 17, and the semiconductor chip 16 with a pair of clamping members 43 and 44 that have a built-in heater, and together with the heating, it is possible to bond the substrate 18 and the semiconductor chip 16 by sandwiching with the pair of clamping members 43 and 44 to apply the load. For example, bonding of the substrate 18 and the semiconductor chip 16 through the first resin layer 17 in the air under atmospheric pressure by using a flip chip bonder can also be cited as examples thereof. The heating temperature at this time is not particularly limited. The temperature at which the solder layer does not melt and also the thermosetting resin of the resin layer 17 is not fully cured is preferably selected. It is preferably below the curing temperature of the thermosetting resin contained in the resin layer.

Whether the position of the semiconductor chip 16 with respect to the substrate 18 after bonding is correct or not can be confirmed, for example, by using an X-ray microscope or infrared microscope.

Next, the surface provided with the terminal 161 of the semiconductor chip 16 and the resin layer 15 laminated on the lower surface of the semiconductor chip 14 are disposed so as to face each other to thereby laminate the semiconductor chip 14 on the semiconductor chip 16 through the resin layer 15.

At this time, it is preferable to perform an alignment by checking the alignment mark formed on the semiconductor chip 16 and the alignment mark formed on the semiconductor chip 14.

Note that in the present invention, the substrate or the semiconductor chip having a resin layer used in the bonding may be preheated to some extent prior to bonding, as long as the bonding at the time of lamination is possible. Preheating of the semiconductor chip can be arbitrarily selected, and the temperature may be the same as, or may be higher or lower than, the temperature used during the bonding at the time of lamination. The preheating temperature of the substrate may be the same as or different from, but is preferably lower than, the preheating temperature of the semiconductor chip having a resin layer used in the bonding.

After lamination of the semiconductor chip 14, the substrate 18, the resin layer 17, the semiconductor chip 16, the resin layer 15, and the semiconductor chip 14 are heated to thereby bond the semiconductor chip 16 and the semiconductor chip 14 through the resin layer 15 in a semi-cured state (stage B). At this time, the substrate 18, the resin layer 17, the semiconductor chip 16, the resin layer 15, and the semiconductor chip 14 are sandwiched and heated with a pair of clamping members that have a built-in heater. It is possible to bond the semiconductor chip 16 and the semiconductor chip 14 by sandwiching with the pair of clamping members and applying a load, together with the heating. For example, bonding of the semiconductor chip 16 and the semiconductor chip 14 in the air under atmospheric pressure by using a flip chip bonder can also be cited as examples thereof. The temperature of the aforementioned preheating may be used directly as a temperature used for bonding. The heating temperature at this time is not particularly limited, as long as the thermosetting resin of the resin layer 15 is not fully cured, but is preferably lower than the curing temperature of the thermosetting resin.

Whether the position of the semiconductor chip 14 with respect to the semiconductor chip 16 after bonding is correct or not can be confirmed, for example, by using an X-ray microscope or infrared microscope.

Next, as shown in FIG. 1B, the surface provided with the terminal 141 of the semiconductor chip 14 and the resin layer 13 laminated on the lower surface of the semiconductor chip 12 are disposed so as to face each other to thereby laminate the semiconductor chip 12 on the semiconductor chip 14 through the resin layer 13.

At this time, it is preferable to perform an alignment by checking the alignment mark formed on the semiconductor chip 14 and the alignment mark formed on the semiconductor chip 12.

Then, the substrate 18, the resin layer 17, the semiconductor chip 16, the resin layer 15, the semiconductor chip 14, the resin layer 13, and the semiconductor chip 12 are heated to thereby bond the semiconductor chip 14 and the semiconductor chip 12 through the resin layer 13 in a semi-cured state (stage B). At this time, it is possible to bond the semiconductor chip 14 and the semiconductor chip 12 by sandwiching and heating the substrate 18, the resin layer 17, the semiconductor chip 16, the resin layer 15, the semiconductor chip 14, the resin layer 13, and the semiconductor chip 12 with a pair of clamping members that have a built-in heater, and also clamping and applying a load with the pair of clamping members. For example, it is also possible to bond the semiconductor chip 14 and the semiconductor chip 12 in the air under atmospheric pressure by using a flip chip bonder. The heating temperature at this time is not particularly limited, as long as the thermosetting resin of the resin layer 13 is not fully cured, but is preferably lower than the curing temperature of the thermosetting resin.

Whether the position of the semiconductor chip 12 with respect to the semiconductor chip 14 after bonding is correct or not can be confirmed, for example, by using an X-ray microscope or infrared microscope.

Further, the heating temperatures in each of the above bonding steps may be the same or different. It is preferable to select a temperature at which the resin layer can maintain the semi-cured state until the soldering step is started.

The heating time in the bonding step can be selected arbitrarily, but as an example, it may be from 0.1 seconds to 10 minutes, preferably from 0.2 seconds to 5 minutes, and more preferably from 0.5 seconds to 2 minutes.

It is also possible to arbitrarily select the heating temperature (that is, the temperature at which the resin layer is semi-cured or the temperature to further promote the curing). This is because an adequate heating temperature also changes depending on the resin to be used. By way of example, the heating is generally carried out within a range of 60 to 200° C., and the heating is preferably carried out within a range of 80 to 180° C., more preferably within a range of 100 to 160° C.

In the present invention, any constitution can be selected arbitrarily for the constitution of the resin layer as long as the bonding and curing are possible, and for example, it may be composed of a resin alone or may be a mixture of resins and monomers. Other components may be included if necessary. The temperature suitable for semi-curing can also be determined by conducting an experiment. Those that are commercially available as a sealing resin in the field can also be used as the resin layer of the present invention, and in this case, it is also possible to obtain the information on the temperature suitable for semi-curing or curing from commercial sources. Further, the resin layer before the bonding step may be in a state prior to being cured, or a state of being semi-cured already to some extent. It should be noted that the temperature at which the resin layer is semi-cured generally lies between the ordinary temperature and the temperature at which the resin layer is cured, and the curing temperature of the resin layer can be easily determined by conducting an experiment in which the temperature of the resin layer is increased.

Next, as shown in FIG. 1C, the semiconductor chip 10 provided with the resin layer 11 is mounted on the clamping member 43. On the other hand, the substrate 18, the resin layer 17, the semiconductor chip 16, the resin layer 15, the semiconductor chip 14, the resin layer 13, and the semiconductor chip 12 that are bonded by the respective bonding layers are placed in this order on the clamping member 44. At this stage, preheating may be carried out with the clamping members 43 and 44 at a predetermined temperature which is lower than the temperature used for soldering.

Figure 5:
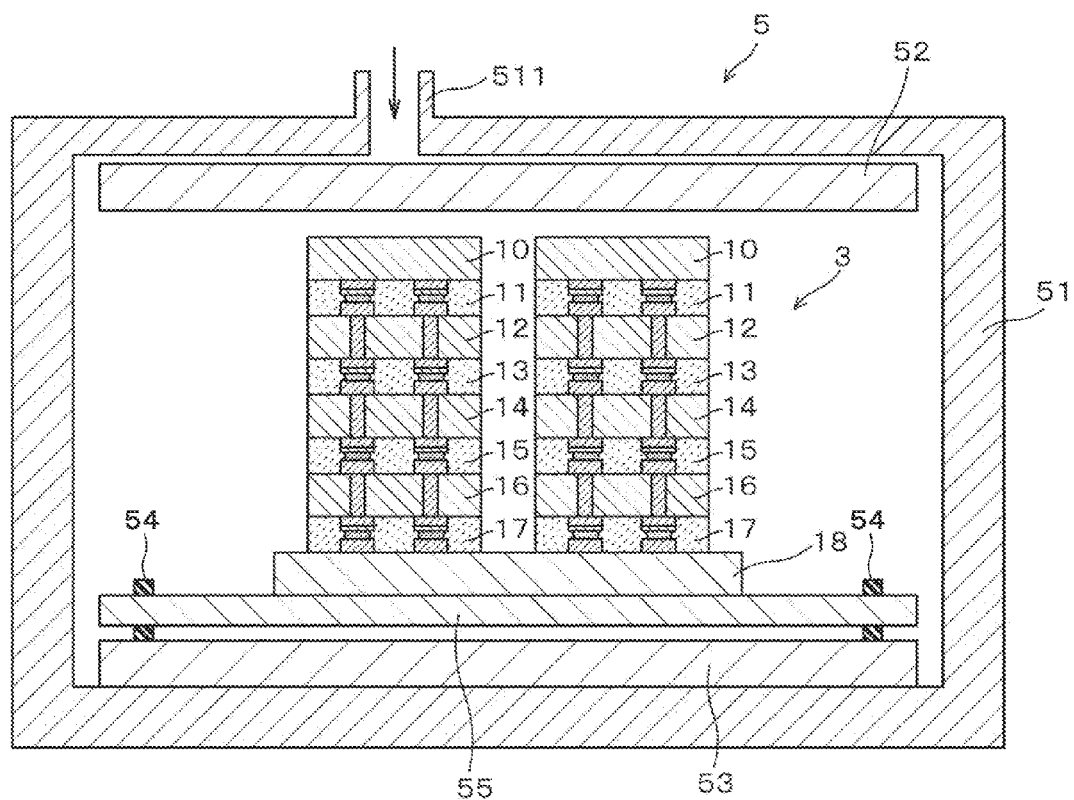
FIG. 5 is a schematic cross-sectional view showing an example of an apparatus for manufacturing a semiconductor device that can be used in the present invention.

It should be noted that instead of mounting the semiconductor chip 10 onto the clamping member 43, it is also possible to obtain the laminate 2 prior to the soldering, by simply abutting the resin layer 11 against the semiconductor chip 12 while aligning the semiconductor chip 10 provided with the resin layer 11. In such a case, a structure may be obtained by placing the laminate 2 before the soldering, which is mounted with the semiconductor chip 10 provided with the resin layer 11 without heating, in a vessel 51 having a pair of hot plates (clamping members) inside and into which the fluid is introduced, as shown in FIG. 5, and by applying pressure and heat for the soldering.

Next, the laminate 2 is obtained by bringing the aforementioned clamping members 44 and 43 closer together and making the resin layer 11 of the semiconductor chip 10 provided with the resin layer 11 abut against the semiconductor chip 12. There is no need to apply pressure as long as the abutment is achieved. On the other hand, it is also possible to move on to the heating and pressurizing step for the soldering immediately after the abutment. At this time, alignment is performed by checking the alignment mark formed on the semiconductor chip 12 and the alignment mark formed on the semiconductor chip 10. Note that in the present step, the solder layers 121A, 141A, 161A, and 181A are not melted. Accordingly, the terminals 122 and 141, the terminals 142 and 161, and the terminals 162 and 181 are not soldered to each other.

Further, the terminals facing each other, for example, the terminals 122 and 141 may or may not be in contact with each other.

Moreover, the resin of the resin layer 13 may be interposed between the terminals 122 and 141. Before the solder layer melts, the solder layer and the terminal that are facing each other may or may not be in contact with each other, as long as it is configured so that the terminals facing each other are electrically connectable when the solder melts. The same applies to the terminals 101 and 121, the terminals 142 and 161, and the terminals 162 and 181.

Here, a laminate refers to a structure in which a plurality of resin layers and a plurality of semiconductor components are laminated alternately on a substrate. In the present example, it is one obtained by laminating at least a first resin layer, a first semiconductor component, a second resin layer, a second semiconductor component, a third resin layer, a third semiconductor component, a fourth resin layer, and a fourth semiconductor component on a substrate.

(Soldering Step)

In those cases where the laminate 2 is obtained and then heated and pressurized as it is, the heater inside the clamping members 43 and 44 that is still sandwiching the laminate 2 initiates the pressurization and heating. Alternatively, in those cases where the soldering step is carried out in a separate step after going through the step for laminating the semiconductor chip 10 through the semi-cured resin by heating and pressurization, the resultant is disposed on the clamping members which are prepared separately, and the heater inside these clamping members 43 and 44 initiates the pressurization and heating. At this time, the substrate 18, the resin layer 17, the semiconductor chip 16, the resin layer 15, the semiconductor chip 14, the resin layer 13, the semiconductor chip 12, the resin layer 11, and the semiconductor chip 10 are heated to a temperature equal to or higher than the melting point of the solder layers 181A, 161A, 141A, and 121A by sandwiching, and applying a load to, the substrate 18, the resin layer 17, the semiconductor chip 16, the resin layer 15, the semiconductor chip 14, the resin layer 13, the semiconductor chip 12, the resin layer 11, and the semiconductor chip 10 with the aforementioned pair of clamping members 43 and 44 that have a built-in heater. As a result, the terminals 181 and 162, the terminals 161 and 142, the terminals 141 and 122, and the terminals 121 and 101 are soldered to each other. By this, a soldered structure 3 is obtained.

For example, it is possible to carry out the soldering between the terminals 181 and 162, between the terminals 161 and 142, between the terminals 141 and 122, and between the terminals 121 and 101 in the air under atmospheric pressure by using a flip chip bonder.

By the above process, the soldered structure 3 is obtained. In the structure 3 obtained in this manner, the resin layers 11, 13, 15, and 17 are in a semi-cured state, and are not fully cured.

In the soldering step, the soldering between terminals refers to the following. That is, each of the solder layers 181A, 161A, 141A, and 121A which is used for bonding between the substrate 18 and the semiconductor chip 16, between the semiconductor chips 16 and 14, between the semiconductor chips 14 and 12, and between the semiconductor chips 12 and 10 is heated to a temperature equal to or higher than the melting point of the solder layers 181A, 161A, 141A, and 121A to melt, and also as a result, the terminals 181 and 162, the terminals 161 and 142, the terminals 141 and 122, and the terminals 121 and 101 are connected to each other through the solder layers. To be precise, this refers to a state in which the terminals 181A and 162, the terminals 161A and 142, the terminals 141A and 122, and the terminals 121A and 101 are in physical contact with each other, and at least a portion thereof is forming an alloy.

Whether the position of the semiconductor chip 10 with respect to the semiconductor chip 12 after soldering is correct or not can be confirmed, for example, by using an X-ray microscope or infrared microscope.

The heating time in the soldering step can be selected arbitrarily. For example, it may be from 0.5 seconds to 10 minutes, preferably from 1 second to 5 minutes, and more preferably from 3 seconds to 2 minutes. The heating temperature can also be selected arbitrarily, and by way of example, the heating is generally carried out within a range of 150 to 350° C., and the heating is preferably carried out within a range of 180 to 300° C. In addition, the temperature used in the bonding step and the temperature used for the soldering can be selected arbitrarily. For example, these temperatures preferably differ by 10° C. or more, more preferably by 20 to 300° C. or more, and even more preferably by 50 to 200° C. or more.

It is also possible to conduct the soldering while applying pressure with a fluid using the conditions as described below.

(Curing Step)

Figure 2:
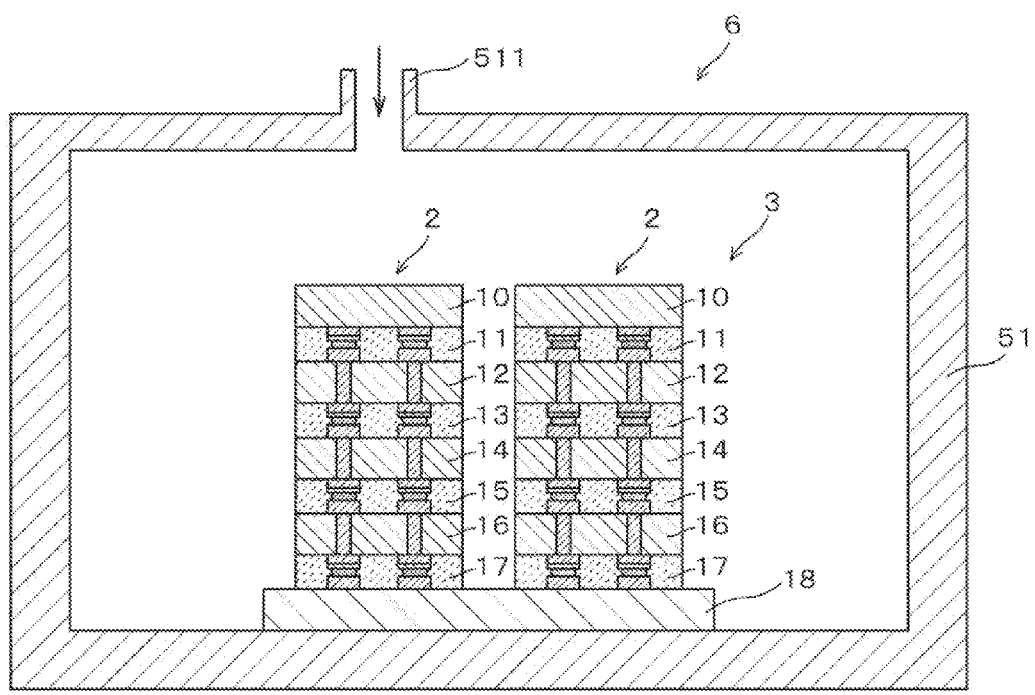
FIG. 2 is a cross-sectional view showing an example of an apparatus for manufacturing a semiconductor device that can be used in the present invention.

In the curing step, for example, the curing of the resin layers 17, 15, 13, and 11 in the structure 3 is promoted by using a device 6 shown in FIG. 2. It should be noted that it is possible to omit the curing step in those cases where the curing of the resin layer is completed in the soldering step.

The device 6 includes a vessel 51 to which a fluid is introduced. The vessel 51 is a pressure vessel. Examples of the materials of the vessel 51 include metals and the like, and for example, stainless steel, titanium, or copper is used.

Examples of the methods of heating the structure 3 include a method in which the structure 3 is placed in the device 6, and then a heated fluid is charged into the vessel 51 from a pipe 511 to apply heat and pressure to the laminate. The fluid can be selected arbitrarily, but is preferably a gas, and examples thereof include air, an inert gas (nitrogen gas, rare gas) or the like. Further, it is also possible to heat the structure 3 by causing the fluid to flow from the pipe 511 into the vessel 51 and heating the vessel 51 under a pressurized atmosphere. The heating process of the vessel 51 may be selected arbitrarily, and heating may be conducted before or after pressurization, or heating and pressurization may be conducted at the same time.

For example, the structure 3 is first disposed inside the vessel 51. Then, by introducing the fluid, the structure 3 is heated to a temperature equal to or higher than the curing temperature of the thermosetting resins of the resin layers 17, 15, 13, and 11 to carry out the curing of the resin layers 17, 15, 13, and 11. The time required for the curing can be selected arbitrarily. For example, it may be from 10 minutes to 9 hours, preferably from 30 minutes to 6 hours, and more preferably from 1 to 3 hours. As a specific example, the heating at 180° C. for 1 hour may be carried out as a curing step, for example. Here, the curing temperature is a curing temperature of the resin layer and refers to a temperature at which the thermosetting resin contained in the resin layer reaches the stage C in accordance with JISK 6,900. Accordingly, it is possible to alter the heating depending on the resin to be used, but by way of example, the heating is generally carried out within a range of 120 to 230° C., and the heating is preferably carried out within a range of 140 to 200° C.

Note that the curing of the resin layers 17, 15, 13, and 11 may be carried out by placing a plurality of the structures 3 inside the vessel 51 of the device 6. It is possible to improve productivity by doing so.

The pressing force at the time of pressurizing the structure 3 with the fluid can be arbitrarily selected. It is preferably from not less than 0.1 MPa to not more than 10 MPa, more preferably from not less than 0.3 MPa to not more than 7 MPa, and even more preferably from not less than 0.5 MPa to not more than 5 MPa. By pressurizing the structure 3 with the fluid, it is possible to suppress the generation of voids within the resin layers 17, 15, 13, and 11. In particular, by making the pressing force to be not less than 0.1 MPa, this of becomes more prominent. Further, by making the pressing force to be not more than 10 MPa, it is possible to suppress an increase in the size and complexity of the device. It should be noted that the expression "pressurizing with the fluid" refers to an increase in the pressure of the atmosphere of the structure 3, from the atmospheric pressure, which corresponds with the pressing force. In other words, the pressing force of 10 MPa indicates that the pressure applied to the structure 3 is higher than the atmospheric pressure by 9 MPa.

Figure 3A:
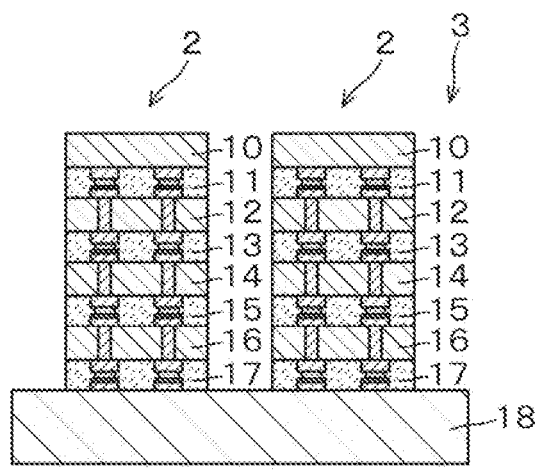
FIG. 3A is a schematic cross-sectional view showing an example of a process of manufacturing a semiconductor device of the present invention.

In the manner described above, the structure 3 is obtained in which the resin layers 17, 15, 13, and 11 are cured (FIG. 3A). Note that the curing of the resin layers may be completed fully in this step, or the curing may be completed in a sealing step which is conducted optionally.

Further, in the structure 3, each side surface of the resin layer 17, the semiconductor chip 16, the resin layer 15, the semiconductor chip 14, the resin layer 13, the semiconductor chip 12, the resin layer 11, and the semiconductor chip 10, as viewed from the upper surface, may be flush, that is, in a flat state with no steps between two successive layers. Alternatively, the resin layers 17, 15, 13, and 11 may protrude from the side surfaces of the semiconductor chips 16, 14, 12, and 10. Further, for example, a semiconductor chip positioned at the upper and lower ends of the structure, for example, the semiconductor chip 16 or the semiconductor chip 10, may be smaller than other semiconductor chips.

Further, the thickness of the resin layers 17, 15, 13, and 11 can be selected arbitrarily. For example, it may be from at least 5 μm to not more than 100 μm, preferably from at least 7 μm to not more than 75 μm, and more preferably from at least 10 μm to not more than 50 μm. By making the thickness to be at least 5 μm, the resin layer can reliably cover the solder layer, and the terminals 181 and 162, the terminals 161 and 142, the terminals 141 and 122, and the terminals 121 and 101 can be easily connected to each other by the flux activity of the resin layer. Further, by making the thickness to be not more than 100 μm, the terminals 181 and 162, the terminals 161 and 142, the terminals 141 and 122, and the terminals 121 and 101 can be easily connected to each other. Furthermore, by making the thickness to be not more than 100 μm, it is possible to suppress the warpage of the substrate 18 and the semiconductor chips 16, 14, 12, and 10 due to the curing shrinkage of the resin layer.

Here, the resin layers 17, 15, 13, and 11 will be described. The resin layers 17, 15, 13, and 11 are layers for filling in the gaps between the substrate 18 and the semiconductor chip 16, between the semiconductor chips 16 and 14, between the semiconductor chips 14 and 12, and between the semiconductor chips 12 and 10, respectively.

Each of the resin layers 17, 15, 13, and 11 includes a thermosetting resin. In addition, the resin layers preferably contain a flux active compound.

The solder does not melt at a temperature which is used only for the bonding of resin layers. Thereafter, curing of the semi-cured resin also proceeds further by the soldering conducted at a temperature at which the solder melts. The degree of semi-curing of the resin at the time of bonding can be selected arbitrarily. It is possible to adopt suitable conditions by controlling the temperature and time for the bonding step and soldering step.

As a thermosetting resin, for example, epoxy resins, oxetane resins, phenolic resins, (meth)acrylate resins, unsaturated polyester resins, diallyl phthalate resins, maleimide resins, or the like can be used. These can be used alone, or two or more types can be used as a mixture.

Among them, epoxy resins having excellent curability and storage stability, and heat resistance, moisture resistance and chemical resistance of the cured product are suitably used. The content of the thermosetting resin in the resin layers 17, 15, 13, and 11 can be arbitrarily selected, if required. As an example, the content from at least 30% by weight to not more than 70% by weight is preferred. Examples of other preferred ranges include the following: the content may be from at least 10% by weight to not more than 100% by weight; it may be from at least 20% by weight to not more than 100% by weight; it may be from at least 30% by weight to not more than 100% by weight; it may be from at least 50% by weight to not more than 100% by weight; and it may be from at least 70% by weight to not more than 100% by weight.

When the resin layers 17, 15, 13, and 11 contain a flux active compound, in some cases, the resin layers have the effect of removing an oxide film existing on the surface of the solder layer and the terminal at the time of soldering. By ensuring that the resin layers 17, 15, 13, and 11 have a flux activity, it is possible to perform soldering with excellent connection reliability because the oxide films covering the surface of the solder and the terminal are removed. For the resin layers 17, 15, 13, and 11 to have a flux activity, it is necessary that the resin layers 17, 15, 13, and 11 contain a flux active compound. The flux active compound contained in the resin layers 17, 15, 13, and 11 is not particularly limited, as long as it is used for the soldering. Compounds having either one of carboxyl groups or phenolic hydroxyl groups, or both of carboxyl groups and phenolic hydroxyl groups are preferred, and they may be used alone, or a plurality of types may be used in combination.

The amount of flux active compound incorporated in the resin layers 17, 15, 13, and 11 can be selected arbitrarily, but is preferably from 1 to 30% by weight, more preferably from 2 to 25% by weight, and particularly preferably from 3 to 20% by weight.

Examples of the flux active compounds having a carboxyl group include aliphatic acid anhydrides, alicyclic acid anhydrides, aromatic acid anhydrides, aliphatic carboxylic acids, and aromatic carboxylic acids.

Examples of the aliphatic acid anhydrides that are flux active compounds having a carboxyl group include succinic anhydride, polyadipic acid anhydride, polyazelaic acid anhydride, and polysebacic acid anhydride.

Examples of the alicyclic acid anhydrides that are flux active compounds having a carboxyl group include methyltetrahydrophthalic anhydride, methylhexahydrophthalic anhydride, methylhymic acid anhydride, hexahydrophthalic anhydride, tetrahydrophthalic anhydride, trialkyl tetrahydrophthalic anhydride, and methyl cyclohexene dicarboxylic acid anhydride.

Examples of the aromatic acid anhydrides that are flux active compounds having a carboxyl group include phthalic anhydride, trimellitic anhydride, pyromellitic anhydride, benzophenone tetracarboxylic anhydride, ethylene glycol bistrimellitate, and glycerol tristrimellitate.

Examples of the aliphatic carboxylic acids that are flux active compounds having a carboxyl group include a compound represented by the following general formula (I), formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, and succinic acid.

HOOC—(CH$_2$)$_n$—COOH          (I)

(In formula (I), n represents an integer of at least 0 and not more than 20.)

Examples of the aromatic carboxylic acids that are flux active compounds having a carboxyl group include benzoic acid, phthalic acid, isophthalic acid, terephthalic acid, hemimellitic acid, trimellitic acid, trimesic acid, mellophanic acid, prehnitic acid, pyromellitic acid, mellitic acid, triyl acid, xylic acid, hemellitic acid, mesitylene acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic derivatives such as 1,4-dihydroxy-2-naphthoic acid and 3,5-dihydroxy-2-naphthoic acid, phenolphthalin, and diphenolic acid.

Of these flux active compounds having a carboxyl group, the compounds represented by the aforementioned general formula (I) are preferred in view of the activity of flux activity compounds, the amount of outgas generated during the curing of the resin layer, and a favorable balance between the elastic modulus of the resin layer after curing, the glass transition temperature, and the like. In addition, of the compounds represented by the aforementioned general formula (I), the compounds in which n in formula (I) is 3 to 10 are particularly preferred from the viewpoint that it is possible to suppress an increase in the elastic modulus in the resin layer after curing and also possible to improve the bonding properties.

Of the compounds represented by the aforementioned general formula (I), examples of the compounds in which n in formula (I) is 3 to 10 include glutaric acid (HOOC—(CH$_2$)$_3$—COOH) where n=3, adipic acid (HOOC—(CH$_2$)$_4$—COOH) where n=4, pimelic acid (HOOC—(CH$_2$)$_5$—COOH) where n=5, sebacic acid (HOOC—(CH$_2$)$_8$—COOH) where n=8, and HOOC—(CH$_2$)$_{10}$—COOH where n=10.

Examples of the flux active compounds having a phenolic hydroxyl group include phenols and the like. Specific examples thereof include monomers containing a phenolic hydroxyl group, such as phenol, o-cresol, 2,6-xylenol, p-cresol, m-cresol, o-ethylphenol, 2,4-xylenol, 2,5-xylenol, m-ethylphenol, 2,3-xylenol, meditol, 3,5-xylenol, p-tertiarybutyl phenol, catechol, p-tertiaryamyl phenol, resorcinol, p-octyl phenol, p-phenyl phenol, bisphenol A, bisphenol F, bisphenol AF, biphenol, diallyl bisphenol F, diallyl bisphenol A, trisphenol and tetrakis phenol; phenol novolac resins, o-cresol novolac resins, bisphenol F novolac resins, and bisphenol A novolac resins.

The compounds having either one of carboxyl groups or phenolic hydroxyl groups or both of carboxyl groups and phenolic hydroxyl groups as described above are incorporated three-dimensionally by the reaction with a thermosetting resin such as an epoxy resin.

For this reason, from the viewpoint of improving the formation of a three-dimensional network of the epoxy resin after curing, as the flux active compound, a flux active curing agent that has a flux activity and also acts as a curing agent for the epoxy resin is preferred. Examples of the flux active curing agents include compounds having, within one molecule, two or more phenolic hydroxyl groups that can be added to the epoxy resin, and one or more carboxyl groups that are directly bonded to the aromatic which shows a flux activity (reducing action). Examples of such flux active curing agents include benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, and gallic acid (3,4,5-trihydroxy benzoic acid); naphthoic acid derivatives such as 1,4-dihydroxy-2-naphthoic acid, 3,5-dihydroxy-2-naphthoic acid, and 3,7-dihydroxy-2-naphthoic acid; phenolphthalin, and diphenolic acid. These may be used alone or in combination of two or more types thereof Among them, in order to obtain good bonding between the terminals, it is particularly preferable to use phenolphthalin.

Further, the amount of flux activity curing agent incorporated in the resin layer is preferably from 1 to 30% by weight, and particularly preferably from 3 to 20% by weight. By ensuring that the amount of flux activity curing agent incorporated in the resin layer is within the above range, it is possible to improve the flux activity of the resin layer, and also to prevent the flux activity curing agent that has not reacted with a thermosetting resin from remaining within the resin layer.

In addition, the resin layer may contain an inorganic filler. By incorporating an inorganic filler in the resin layer, it is possible to increase the minimum melt viscosity of the resin layer, and to suppress the formation of gaps between the terminals. Here, examples of the inorganic filler include silica and alumina.

(Sealing Step)

Next, sealing of the structure 3 is carried out using a sealing material. The method of sealing can be selected arbitrarily, and it may be any of, for example, potting, transfer molding, and compression molding.

Figure 3B:
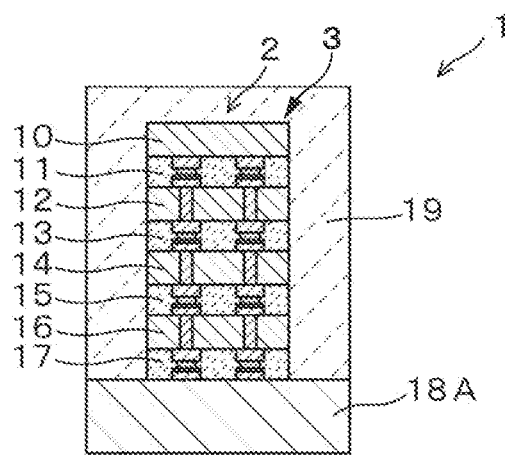
FIG. 3B is a schematic cross-sectional view showing an example of a process of manufacturing a semiconductor device of the present invention.

Then, in those cases where a plurality of the structures 3 are provided, by cutting each of the structures 3, it is possible to obtain a plurality of the semiconductor devices 1 as shown in FIG. 3B. It should be noted that in FIG. 3B, the reference symbol 19 denotes a sealing material, and the reference symbol 18A denotes the substrate 18 that is diced. Further, a structure included in the semiconductor device 1 can be selected arbitrarily. When the semiconductor device 1 has a plurality of the structures 3, each unit of the semiconductor device 1 may be cut. Note that for the cutting, it is possible to use a dicing blade, laser, a router, or the like.

According to the present embodiment as described above, it is possible to achieve the following effects.

In the present embodiment, a step is carried out in which the resin layer 17 and the semiconductor chip 16 are laminated in this order on the substrate 18, followed by heating, to bond the substrate 18 and the semiconductor chip 16 through the resin layer 17 in a semi-cured state; the resin layer 15 and the semiconductor chip 14 are laminated in this order on the semiconductor chip 16, followed by heating, to bond the semiconductor chip 16 and the semiconductor chip 14 through the resin layer 15 in a semi-cured state; and the resin layer 13 and the semiconductor chip 12 are laminated in this order on the semiconductor chip 14, followed by heating, to bond the semiconductor chip 14 and the semiconductor chip 12 through the resin layer 13 in a semi-cured state. Then, a pair of clamping members 43 and 44 are prepared, and after mounting a laminate constituted of the substrate 18, the resin layer 17, the semiconductor chip 16, the resin layer 15, the semiconductor chip 14, the resin layer 13, and the semiconductor chip 12 on the clamping member 44, which is one of the clamping members, the semiconductor chip 10 is installed on the semiconductor chip 12 through the resin layer 11 to configure the laminate 2, and the laminate 2 is clamped by one clamping member 44 and the other clamping member 43, and heated to carry out the soldering. For this reason, as compared with the prior art, it is possible to reduce the thermal damage to the substrate 18 and each of the semiconductor chips 16, 14, 12, and 10. Therefore, it is possible to improve the reliability of the semiconductor device 1.

Further, a step is carried out in which, after laminating the resin layer 17 and the semiconductor chip 16 in this order on the substrate 18, the substrate 18 and the semiconductor chip 16 are bonded through the resin layer 17 in a semi-cured state by heating; after laminating the resin layer 15 and the semiconductor chip 14 in this order on the semiconductor chip 16, the semiconductor chip 16 and the semiconductor chip 14 are bonded through the resin layer 15 in a semi-cured state by heating; and after laminating the resin layer 13 and the semiconductor chip 12 in this order on the semiconductor chip 14, the semiconductor chip 14 and the semiconductor chip 12 are bonded through the resin layer 13 in a semi-cured state by heating. Then, a pair of clamping members 43 and 44 are prepared, and after mounting a laminate including the substrate 18, the resin layer 17, the semiconductor chip 16, the resin layer 15, the semiconductor chip 14, the resin layer 13 and the semiconductor chip 12 on one of the clamping members 44, the semiconductor chip 10 is installed on the semiconductor chip 12 through the resin layer 11 to configure the laminate 2. The entire laminate 2 is clamped by one clamping member 44 and the other clamping member 43, and heated to carry out the soldering between the terminals 181 and 162, between the terminals 161 and 142, between the terminals 141 and 122, and between the terminals 121 and 101 at the same time. For this reason, compared with the cases where a plurality of semiconductor components are laminated while sequentially performing the soldering for each pair of semiconductor components, it is possible to improve the productivity at the time of soldering.

Note that in the present embodiment, at the time of obtaining the laminate 2, heating is performed each time a semiconductor chip which is provided with a resin layer is laminated on the substrate 18. The heating in this case is a heating process for bonding, with a resin layer, between the substrate and the semiconductor chip, and between the semiconductor chips. Accordingly, the heating time may be relatively short and also the heating temperature may be low. Therefore, even if a step for obtaining the laminate 2 is carried out, it is possible to improve productivity, as compared to the conventional manufacturing method.

Further, in the present embodiment, the laminate 2 is clamped to perform soldering.

Conventionally, each time a semiconductor chip was laminated, it was clamped and soldered. For this reason, the semiconductor chips in the lower layer were subjected to several times of clamping which was required for the soldering, and were easily damaged.

On the other hand, in the present embodiment, a pair of clamping members are prepared, and after laminating the substrate 18, the resin layer 17, the semiconductor chip 16, the resin layer 15, the semiconductor chip 14, the resin layer 13, and the semiconductor chip 12 on one of the clamping members in this order, the semiconductor chip 10 is installed on the semiconductor chip 12 through the resin layer 11 to configure the laminate 2, and then the laminate 2 as a whole is clamped by the one clamping member and the other clamping member, and heated to carry out the soldering. Therefore, several times of clamping at the time of soldering can be prevented, and thus the damage to the substrate 18 and the semiconductor chips 16, 14, 12, and 10 can be reduced.

Further, in the present embodiment, after soldering between the terminals 181 and 162, the terminals 161 and 142, the terminals 141 and 122, and the terminals 121 and 101 of the laminate 2 to configure the structure 3, the structure 3 is pressurized with a fluid, followed by heating, to thereby cure the resin layers 17, 15, 13 and 11. By pressurizing the structure 3 with a fluid, it is possible to prevent the generation of voids in the resin layers 17, 15, 13 and 11 of the structure 3. Further, by pressurizing the structure 3 with a fluid, the voids present in the resin layers 17, 15, 13 and 11 of the structure 3 are pressurized and decrease in size. For the reasons described above, it is possible to prevent the voids from causing the positional misalignment between the terminals. Further, it is possible to prevent the resin layers 17, 15, 13 and 11 from being protruded by the voids and soiling the device 6.

In the step for preparing the laminate 2, when lamination of the semiconductor chip provided with a resin layer is carried out under atmospheric pressure, for example, in some cases, gas enters the interface between the resin layer 17 and the semiconductor chip 16 to form voids in the resin layer 17. However, as mentioned above, because it is possible to make the voids smaller by applying pressure when curing the laminate, the step for preparing the laminate 2 need not necessarily be carried out under vacuum or the like, but can be carried out under atmospheric pressure. Therefore, it is possible to enhance the manufacturing efficiency of the semiconductor device 1, and it is also possible to reduce the manufacturing cost.

Further, in the present embodiment, in the step for preparing the laminate 2, the substrate 18 and the semiconductor chip 16 are bonded through the resin layer 17 in a semi-cured state. In the same manner, the semiconductor chips 16 and 14 are bonded through the resin layer 15 in a semi-cured state, and the semiconductor chips 14 and 12 are bonded through the resin layer 13 in a semi-cured state. As described above, since the semiconductor chips are bonded to each other, it is possible to prevent the occurrence of positional deviation among the semiconductor chips in the laminate 2.

It should be noted that when bonding the semiconductor chips 12 and 10 through the resin layer 11 in a semi-cured state, and when bonding the semiconductor chips 14 and 12 through the resin layer 13 in a semi-cured state, heat is applied several times to the substrate 18 and the semiconductor chips 16, 14, and 12. However, because the heating is for bonding the semiconductor chips with a resin layer in a semi-cured state, the heating temperature can be set relatively low, and also the heating time can be kept relatively short even if the heating temperature is raised. Therefore, it is thought that there is very little influence of heat on the substrate 18 and the semiconductor chips 16, 14, and 12.

Further, in the present embodiment, in the previous stage for configuring the laminate 2, the resin layer 17 is provided to the semiconductor chip 16. In the same manner, the resin layer 15 is provided to the semiconductor chip 14, and the resin layer 13 is provided to the semiconductor chip 12. Although all of the semiconductor chips 16, 14, and 12 have a TSV structure with a very thin thickness, the resin layers 17, 15, and 13 are provided respectively, and therefore it is possible to prevent the occurrence of warpage of the semiconductor chips 16, 14, and 12 and to provide them with excellent handling properties.

Further, in the present embodiment, the semiconductor chip having a TSV structure with a very thin thickness will be laminated on the substrate 18. For this reason, it is possible to provide excellent handling properties, as compared with the conventional cases where the semiconductor chips having a TSV structure with a very thin thickness are laminated.

Further, in the present embodiment, after soldering a plurality of the laminates 2 to the substrate 18, sealing is carried out, followed by cutting. As a result, it is possible to improve the productivity of the semiconductor device 1.

It should be noted that the present invention is not limited to the embodiment described above, and modifications, improvements or the like within a range that can achieve the object of the present invention are included in the present invention.

Furthermore, in the embodiment described above, soldering is conducted at the same time as the configuration of the laminate 2, followed by the curing. However, the resin layers 17, 15, 13, and 11 do not have to be completely cured in the curing step. For example, the resin layers 17, 15, 13 and 11 may be completely cured when the sealing is performed.

Figure 6A:
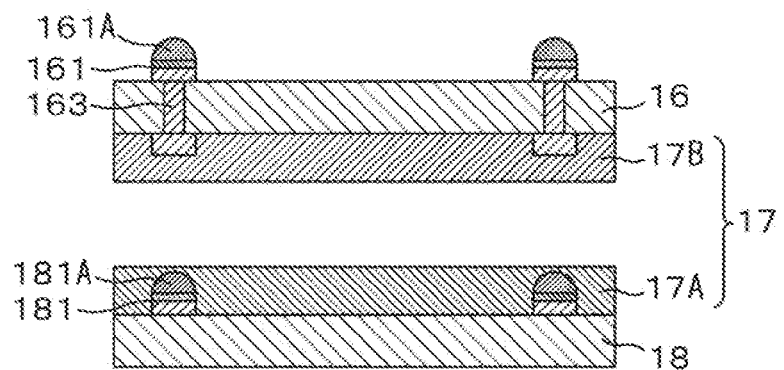
FIG. 6A is a schematic cross-sectional view showing a modified example of the combination of the resin layer and semiconductor chip of the present invention.
Figure 6B:
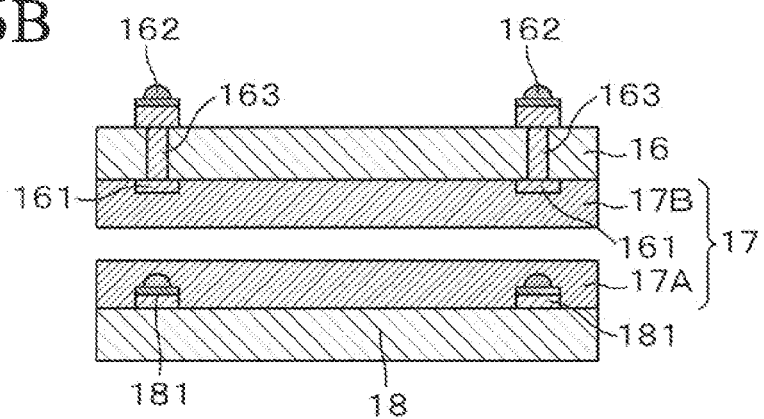
FIG. 6B is a schematic cross-sectional view showing a modified example of the combination of the resin layer and semiconductor chip of the present invention.
Figure 7:
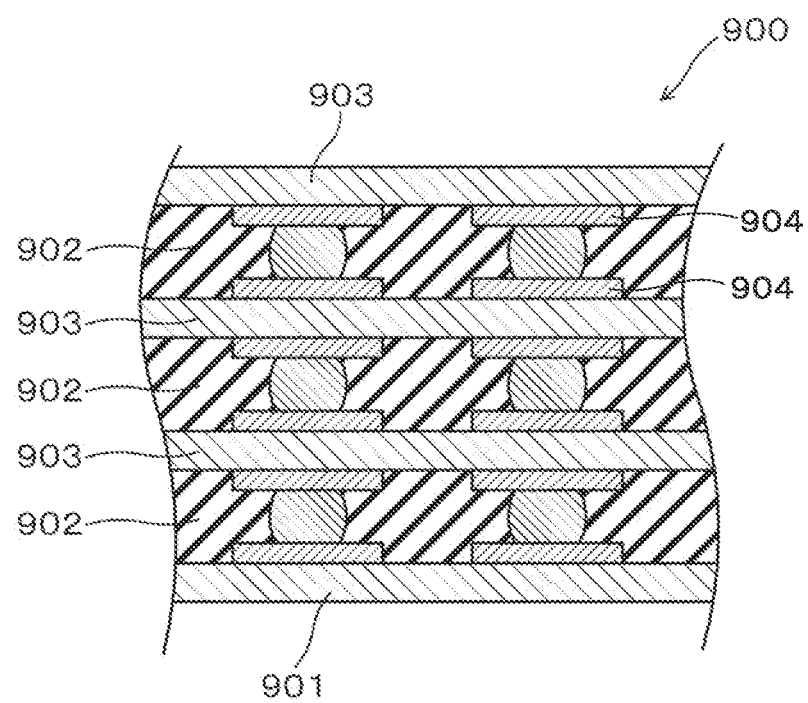
FIG. 7 is a schematic cross-sectional view showing a structure of a conventional semiconductor device described in prior art.
Figure 8A:
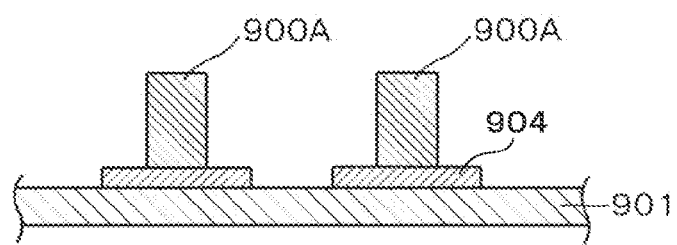
FIG. 8A is a schematic cross-sectional view showing a conventional process of manufacturing a semiconductor device.
Figure 8B:
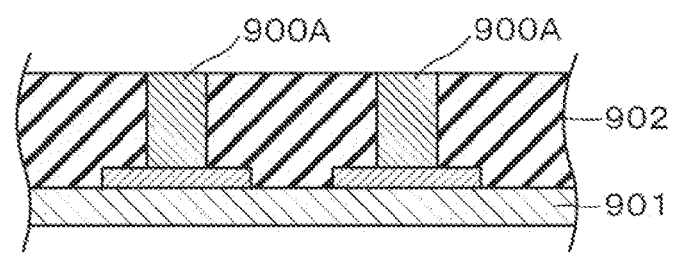
FIG. 8B is a schematic cross-sectional view showing a conventional process of manufacturing a semiconductor device.
Figure 8C:
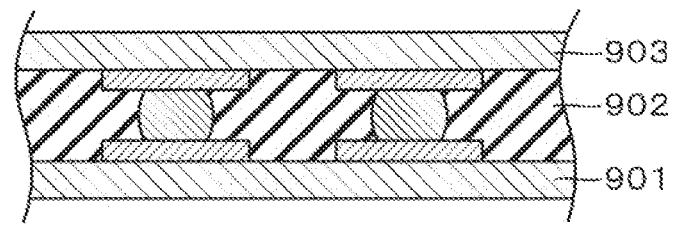
FIG. 8C is a schematic cross-sectional view showing a conventional process of manufacturing a semiconductor device.

Furthermore, in the embodiment described above, the resin layer 17 was provided on the semiconductor chip 16 side, and the semiconductor chip 16 provided with the resin layer 17 was laminated on the substrate 18. However, the present invention is not limited thereto. For example, as shown in FIGS. 6A and 6B, it is possible to configure the resin layer 17 by providing the resin layers 17A and 17B to the semiconductor chip 16 and the substrate 18, respectively, and coupling the resin layers 17A and 17B to form the resin layer 17. Note that in FIGS. 6A and 6B, there is a difference in the amount of the solder layer. The amount of the solder layer can be selected arbitrarily.

Further, the resin layer 17 may be provided on the substrate 18 side; the resin layer 15 may be provided on the semiconductor chip 16 side; the resin layer 13 may be provided on the semiconductor chip 14; and the resin layer 11 may be provided on the semiconductor chip 12 side.

Figure 9A:
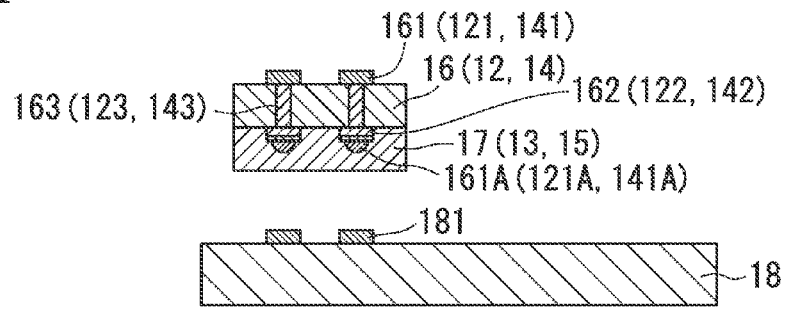
FIG. 9A is a schematic process diagram showing an example of a method of manufacturing a semiconductor device of the present invention.
Figure 9B:
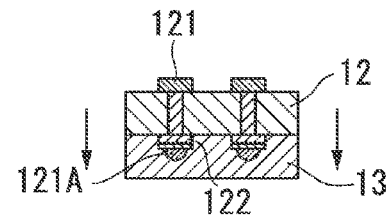
FIG. 9B is a schematic process diagram showing an example of a method of manufacturing a semiconductor device of the present invention.
Figure 9B:
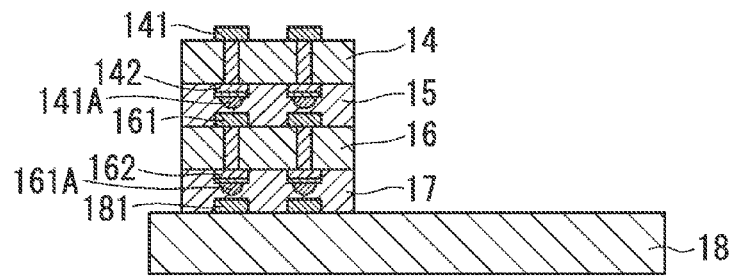
Figure 9C:
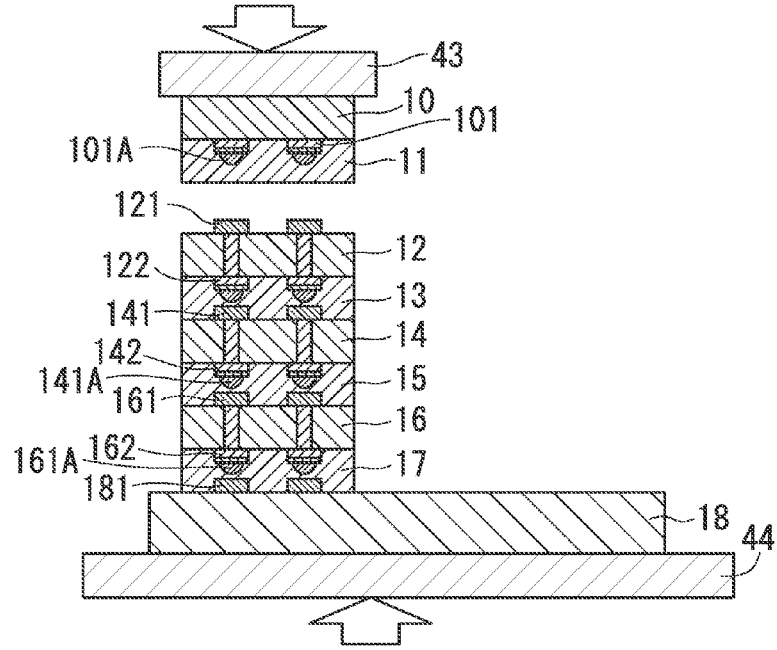
FIG. 9C is a schematic process diagram showing an example of a method of manufacturing a semiconductor device of the present invention.
Figure 9D:
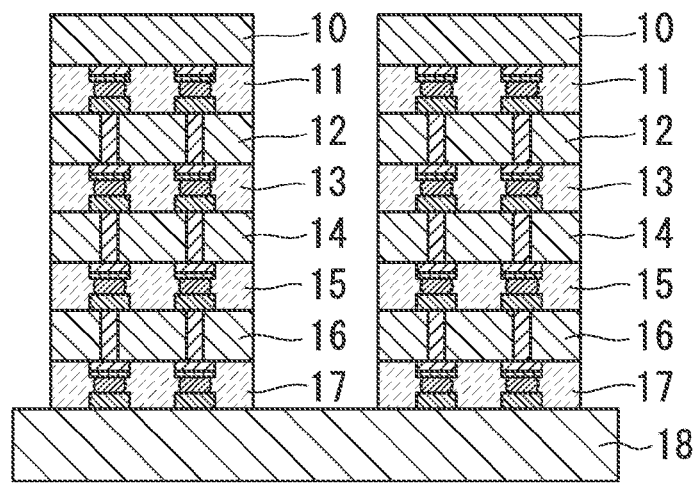
FIG. 9D is a schematic process diagram showing an example of a method of manufacturing a semiconductor device of the present invention.
Figure 9E:
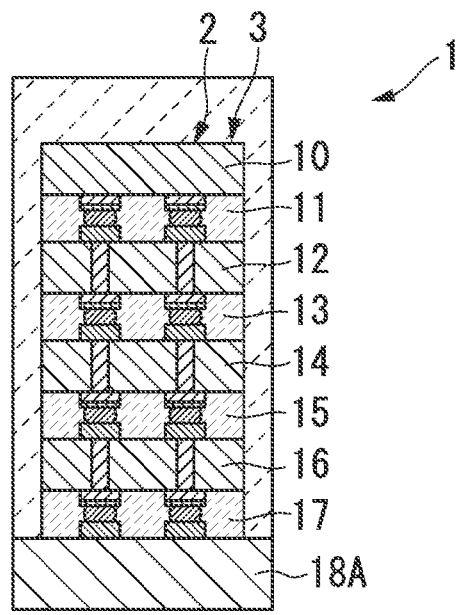
FIG. 9E is a schematic process diagram showing an example of a method of manufacturing a semiconductor device of the present invention.
Figure 10A:
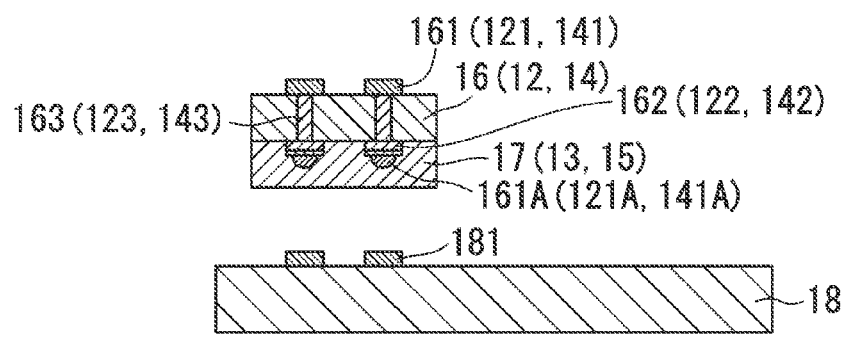
FIG. 10A is a schematic process diagram showing an example of a method of manufacturing a semiconductor device of the present invention.
Figure 10B:
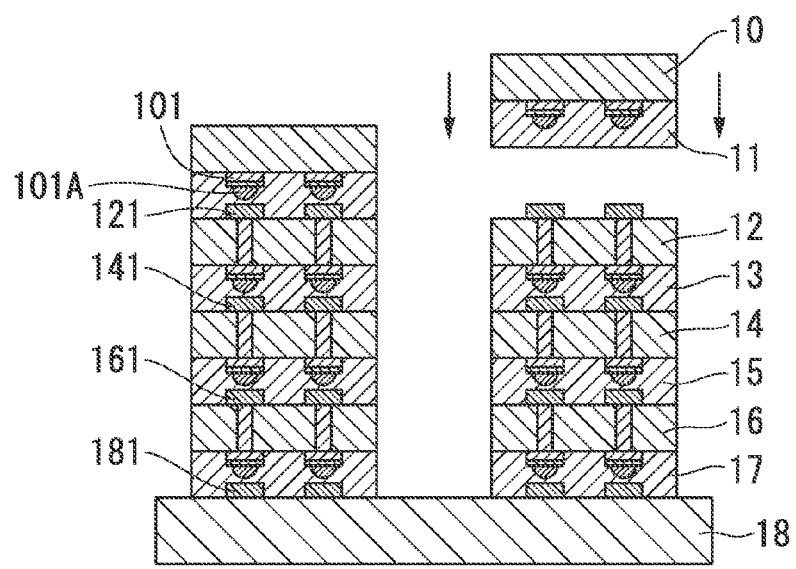
FIG. 10B is a schematic process diagram showing an example of a method of manufacturing a semiconductor device of the present invention.
Figure 10C:
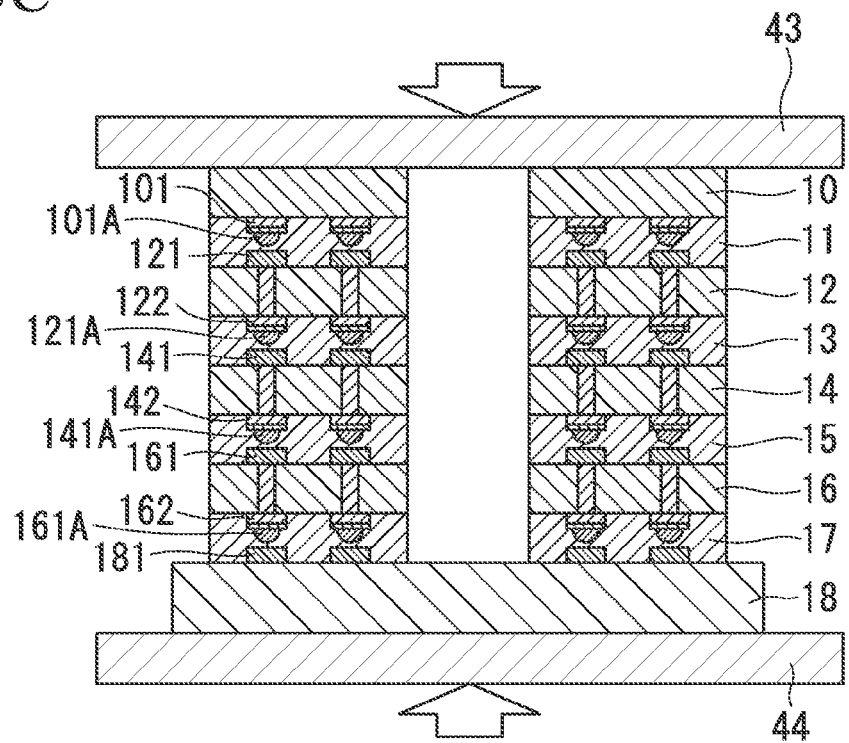
FIG. 10C is a schematic process diagram showing an example of a method of manufacturing a semiconductor device of the present invention.
Figure 10D:
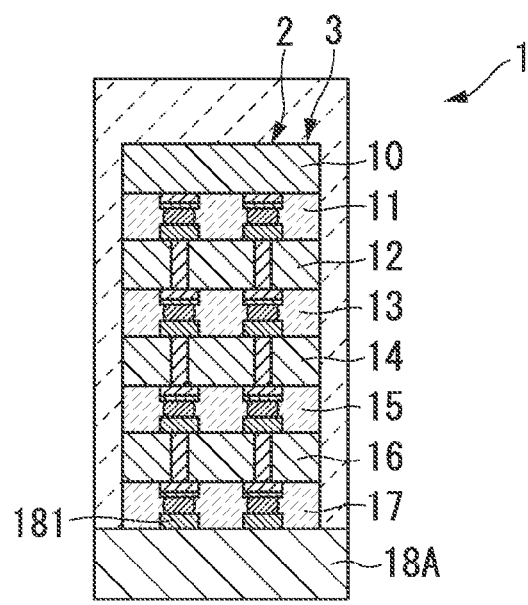
FIG. 10D is a schematic process diagram showing an example of a method of manufacturing a semiconductor device of the present invention.

As shown in FIGS. 9A to 9E, in the present invention, the position of the solder layer can be selected arbitrarily as long as the soldering between the terminals is possible. That is, it is possible to provide only a terminal on the substrate without providing the solder layer, and then use a semiconductor chip provided with a resin layer as described below. More specifically, it is possible to use a semiconductor chip provided with a resin layer, which includes a solder layer which is present on top of a terminal on the surface on the substrate side of the semiconductor chip provided with the resin layer, and is embedded in the resin layer. At this time, the semiconductor chip provided with the resin layer wherein the chips served as the top layer also has a semiconductor layer. FIGS. 9A to 9C are the same as FIGS. 1A to 1C except that the positions of the solder layers are different. By repeating several times the steps from FIG. 1A up to 1C or the steps from FIGS. 9A to 9C, a plurality of structures can be formed on one substrate, as shown in FIG. 9E. By sealing and cutting the resultant as necessary, it is possible to obtain a semiconductor device in a favorable manner.

Furthermore, in each of the embodiments described above, the semiconductor chip 10 may also be configured so as to have a TSV structure.

Further, in each of the embodiments described above, an example of manufacturing the semiconductor device 1 having four semiconductor chips was described. However, the present invention is not limited thereto. It is sufficient to include at least two or more, and preferably three or more semiconductor chips. The upper limit for the number of laminated semiconductor chips and resin layers is not particularly limited, as long as the manufacturing is possible. For example, it may be from 2 to 10, or from 2 to 30, as long as the resulting structure includes a plurality of resin layers and a plurality of semiconductor components laminated alternately therein. Further, there is also no restriction on the number of laminates formed on one substrate. For example, it may be from 1 to 4, from 1 to 64, from 1 to 256, or the like.

For example, the aforementioned laminate is obtained by laminating at least the first resin layer, the first semiconductor component, the second resin layer, and the second semiconductor component on the substrate, and if necessary, laminating the third resin layer, and the third semiconductor component, or even more number of resin layers and semiconductor components. In addition, the laminate may be configured so that each pair of the semiconductor components and/or the substrate and semiconductor component that are facing each other through the resin layer has a connection terminal for electrically connecting between the substrate and the semiconductor component and between the semiconductor components, respectively; and of the above connection terminals that are facing each other, at least one connection terminal has a solder layer.

Furthermore, in each of the embodiments described above, the terminals 181, 161, 141, and 121 had the solder layers 181A, 161A, 141A, and 121A. However, the present invention is not limited thereto, and the terminals 162, 142, 122, and 101 may be one having a solder layer on the surface. Further, all of the terminals 181, 161, 141, and 121, and the terminals 162, 142, 122, and 101 may have a solder layer on the surface. As long as the terminals that are facing each other can be subjected to soldering, the solder layer may be present on one terminal or on both terminals. It is acceptable as long as it is possible to melt the solder layers thereof to carry out the soldering between the substrate 18 and the semiconductor chips 16, 14, 12, and 10.

In addition, in the embodiment, the semiconductor chip 10 provided with the resin layer 11 was mounted to the clamping member 43. However, the present invention is not limited thereto, and the semiconductor chip 10 provided with the resin layer 11 may not be mounted to the clamping member 43. For example, the laminate 2 may be configured by: preparing the resin layer 17 in a semi-cured state; bonding the substrate 18 and the semiconductor chip 16 therethrough; further bonding the semiconductor chip 16 and the semiconductor chip 14 through the resin layer 15 in a semi-cured state; further bonding the semiconductor chip 14 and the semiconductor chip 12 through the resin layer 13 in a semi-cured state; and then a laminate constituted of the substrate 18, the resin layer 17, the semiconductor chip 16, the resin layer 15, the semiconductor chip 14, the resin layer 13, and the semiconductor chip 12 is mounted on the clamping member 44, and thereafter, on the resulting laminate, simply installing the semiconductor chip 10 provided with the resin layer 11. In the laminate 2, the semiconductor chip 10 is in a state of being not bonded to the semiconductor chip 12 through the resin layer 11, because no heat or pressure has been applied thereto. Thereafter, the laminate 2 is clamped with the clamping members 44 and 43, and is further heated, to thereby carry out the soldering. The soldering as described above can be carried out by using a flip chip bonder.

Furthermore, a laminate may be formed such that the semiconductor chips provided with a resin layer are bonded with each other to prepare a plurality of laminates in advance; and using the resultant laminates may be used to form the laminate.

For example, it may be configured so that: a first laminate (two-layer structure) is constructed in which the semiconductor chip 10 provided with the resin layer 11 and the semiconductor chip 12 provided with the resin layer 13 are bonded by the resin layer 11; a second laminate (two-layer structure) is further constructed in which the substrate 18, semiconductor chip 16 provided with the resin layer 17 the semiconductor chip 16, and the semiconductor chip 14 provided with the resin layer 15 are bonded by the resin layers 17 and 15; the first laminate is mounted to the clamping member 43; and the second laminate is installed to the clamping member 44. Alternatively, it is also possible to prepare an upper laminate having a three-layer structure, and a lower laminate having a one-layer structure. Or, it is also possible to prepare an upper laminate having a one-layer structure, and a lower laminate having a three-layer structure (in such a case, a lamination process as shown in FIG. 4B is carried out). In this case, a method for manufacturing a semiconductor device is provided, which includes: the aforementioned step (A); a step for obtaining a laminate, in which n semiconductor components and n resin layers are laminated alternately in this order, by heating and pressurization at a temperature equal to or less than the temperature at which the solder layer melts; and a soldering step in which the laminate is heated and pressurized at a temperature equal to or less than the temperature at which the solder layer melts. In other words, it is sufficient to obtain a laminate that has not been subjected to soldering, prior to the soldering step. In other words, using n semiconductor components and n resin layers, any number of laminates can be laminated on a substrate in an order which can be selected arbitrarily, such that a layer which is constituted of one set of a semiconductor component and a resin layer, and/or laminates that are constituted of a plurality sets, for example, two sets, three sets, or four sets, of semiconductor components and resin layers are prepared and laminated on a substrate in an order which can be selected arbitrarily.

Hereinafter, embodiments of the present invention will be described with reference to the attached drawings.

Second Embodiment

FIGS. 4A to 4C and FIG. 5 show a method for manufacturing a semiconductor device in which 4 layers of semiconductor components are laminated, which is a preferred embodiment of the present invention.

Figure 14A:
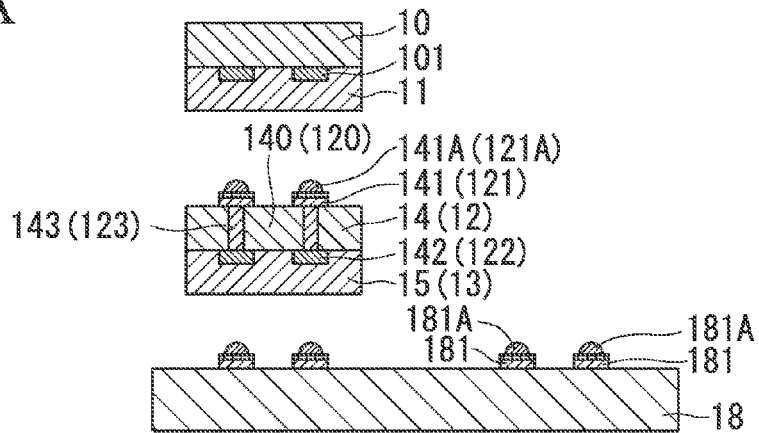
FIG. 14A is a schematic process diagram showing an example of a method of manufacturing a semiconductor device of the present invention.
Figure 14B:
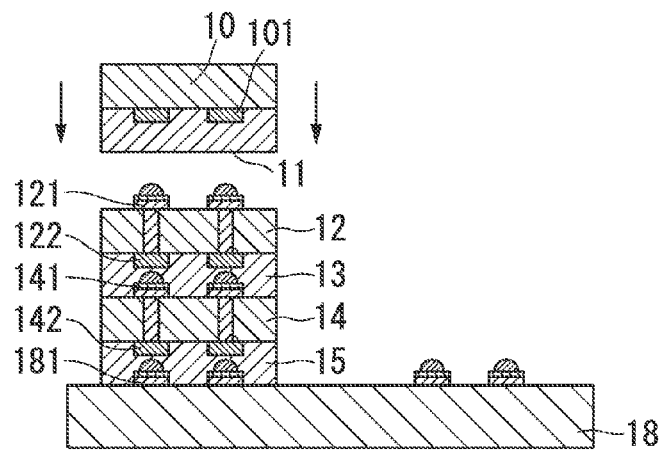
FIG. 14B is a schematic process diagram showing an example of a method of manufacturing a semiconductor device of the present invention.
Figure 14C:
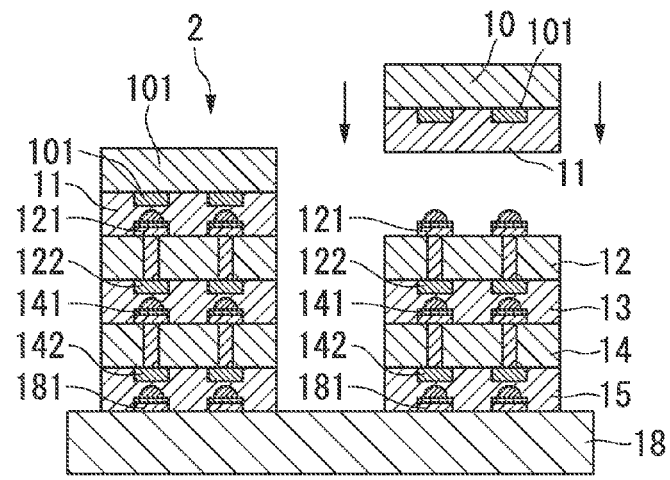
FIG. 14C is a schematic process diagram showing an example of a method of manufacturing a semiconductor device of the present invention.

FIGS. 14A to 14C show a method for manufacturing a semiconductor device that includes 3 layers of semiconductor components, which is a preferred embodiment of the present invention.

Figure 4A:
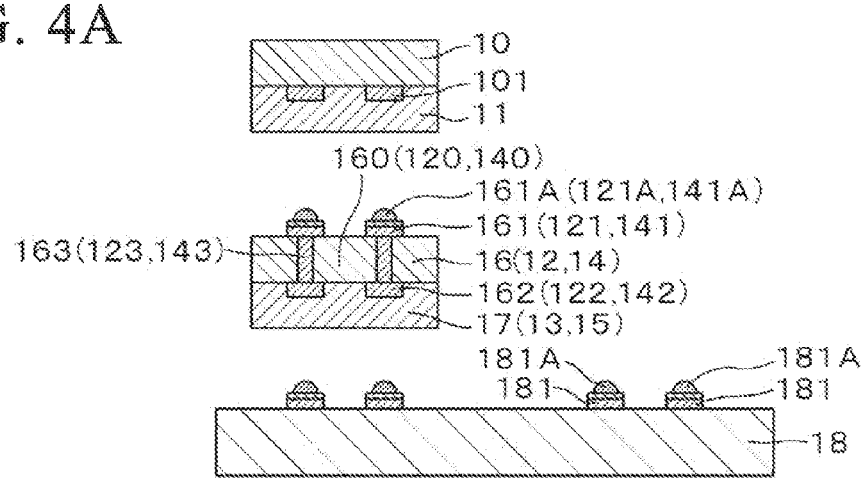
FIG. 4A is a schematic cross-sectional view showing an example of a process of manufacturing a semiconductor device of the present invention.
Figure 4B:
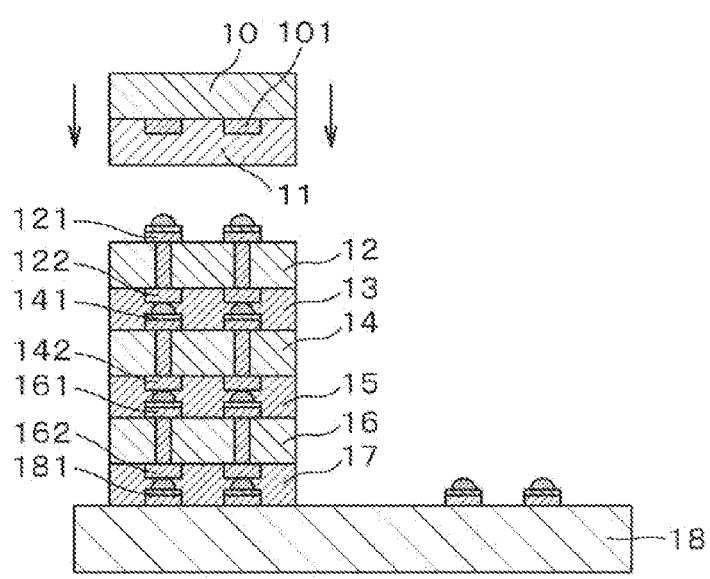
FIG. 4B is a schematic cross-sectional view showing an example of a process of manufacturing a semiconductor device of the present invention.
Figure 4C:
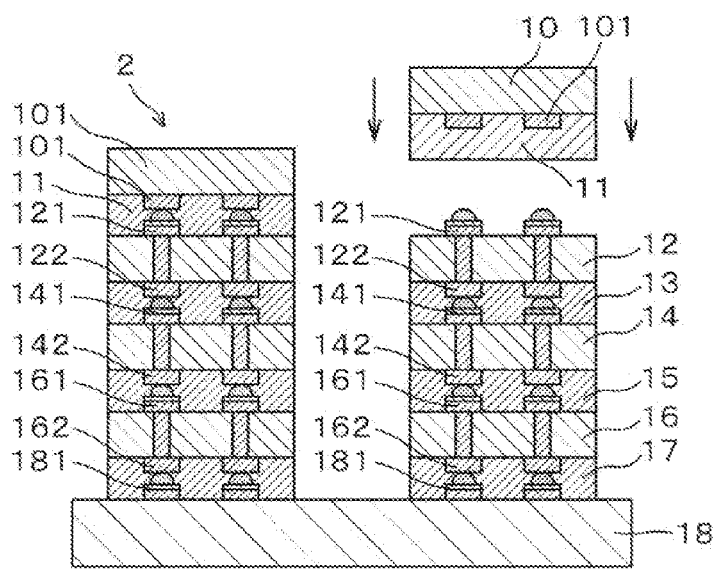
FIG. 4C is a schematic cross-sectional view showing an example of a process of manufacturing a semiconductor device of the present invention.

From FIGS. 4A to 4C, it is possible to manufacture a semiconductor device that includes three layers of semiconductor components shown in FIGS. 14A to 14C by omitting a step for providing a resin layer 17 and a semiconductor component 16, providing a resin layer 15 directly on a substrate 18 as a first resin layer, and carrying out the subsequent steps sequentially. From FIGS. 4A to 4C, it is possible to manufacture a semiconductor device that includes two layers of semiconductor components by omitting a step for providing resin layers 17 and 15 and semiconductor components 16 and 14, providing a resin layer 13 directly on a substrate 18 as a first resin layer, and carrying out the subsequent steps sequentially.

First, the outline of the manufacturing method for the semiconductor device 1 according to the present embodiment will be described.

The method for manufacturing a semiconductor device 1 according to the present embodiment includes: a step for preparing the members of a first semiconductor component 16, a second semiconductor component 14, a third semiconductor component 12, a fourth semiconductor component 10, a substrate 18, a first resin layer 17, a second resin layer 15, a third resin layer 13, and a fourth resin layer 11; a lamination step for obtaining a laminate 2 on the substrate 18; a step for obtaining a plurality of laminates 2 on the substrate 18 by repeating the lamination step; and a soldering step.

As shown in FIG. 4A, in the step for preparing the members, a semiconductor chip (fourth semiconductor component) 10 that has a connection terminal for connecting with the semiconductor chip (third semiconductor component) 12 on one side; the semiconductor chip (third semiconductor component) 12 that has a connection terminal for connecting with the semiconductor chip (second semiconductor component) 14 on one side and has a connection terminal for connecting with the semiconductor chip (fourth semiconductor component) 10 on the other side; the semiconductor chip (second semiconductor component) 14 that has a connection terminal for connecting with the semiconductor chip (first semiconductor component) 16 on one side and has a connection terminal for connecting with the semiconductor chip (third semiconductor component) 12 on the other side; the semiconductor chip (first semiconductor component) 16 that has a connection terminal for connecting with the substrate 18 on one side and has a connection terminal for connecting with the semiconductor chip (second semiconductor component) 14 on the other side; the substrate 18 that has a plurality of connection terminals for connecting with the semiconductor chip (first semiconductor component) 16 on one side; a resin layer (first resin layer) 17; a resin layer (second resin layer) 15; a resin layer (third resin layer) 13; and a resin layer (fourth resin layer) 11; are prepared.

In the lamination step for obtaining the laminate 2, a step for laminating the resin layer 17 and the semiconductor chip 16 on the substrate 18 in this order, followed by heating, thereby bonding the substrate 18 and the semiconductor chip 16 through the resin layer 17 in a semi-cured state; a step for laminating the resin layer 15 and the semiconductor chip 14 on the semiconductor chip 16 in this order, followed by heating, thereby bonding the semiconductor chip 16 and the semiconductor chip 14 through the resin layer 15 in a semi-cured state; a step for laminating the resin layer 13 and the semiconductor chip 12 on the semiconductor chip 14 in this order, followed by heating, thereby bonding the semiconductor chip 14 and the semiconductor chip 12 through the resin layer 13 in a semi-cured state; and a step for laminating the resin layer 11 and the semiconductor chip 10 on the semiconductor chip 12 in this order, followed by heating, thereby bonding the semiconductor chip 12 and the semiconductor chip 10 through the resin layer 11 in a semi-cured state; are carried out. According to this method, the laminate 2 which includes at least of the semiconductor chip 10, the resin layer 11, the semiconductor chip 12, the resin layer 13, the semiconductor chip 14, the resin layer 15, and the semiconductor chip 16, and in which the resin layers and the semiconductor chips are laminated alternately, can be obtained.

Further, by repeating the lamination step described above with respect to the aforementioned substrate 18 several times, it is possible to obtain a plurality of the laminates 2 on the substrate 18.

Next, in the soldering step, a pair of clamping members 52 and 53 is prepared, and a plurality of the laminates 2 laminated on the substrate 18 are mounted on one clamping member 53. Thereafter, the substrate 18 and a plurality of the laminates 2 are clamped with one clamping member 53 and the other clamping member 52, and heated to carry out the soldering. Together with this bonding, the curing of the resin layer 11, the resin layer 13, the resin layer 15, and the resin layer 17 is promoted by the heating described above, while pressurizing the substrate 18 and a plurality of the laminates 2 with a fluid. As a result, a structure is obtained.

Next, the manufacturing method for the semiconductor device 1 of the present embodiment will be described in detail with reference to FIGS. 4A to 4C, FIG. 5, FIG. 2, and FIGS. 3A and 3B.

(Step for Preparing Members)

First, as shown in FIG. 4A, the semiconductor chip 16 and the substrate 18 are prepared. The material prepared in this step of the present embodiment is the same material as that used in the first embodiment described above, and likewise, preferred examples thereof are also preferred. Therefore, the detailed descriptions thereof will be omitted.

(Step for Obtaining a Laminate)

Next, as shown in FIGS. 4A and 4B, a lamination process is performed. This step is the same as the lamination method of the first embodiment with the exception that in the present embodiment, the step for bonding the semiconductor chip 10 provided with the resin layer 11 is performed in the same manner as the method for bonding other semiconductor chips provided with a resin layer. That is, a method used up to the bonding of three sets of semiconductor chips provided with a resin layer is the same as the method of the first embodiment, and illustrations and preferred conditions and examples are also the same as those in the first embodiment. For this reason, the method used up to the bonding of three sets of semiconductor chips provided with a resin layer will be described briefly, and the detailed descriptions thereof will be omitted.

First, the resin layer 17 and the semiconductor chip 16 are laminated on the substrate 18 in this order, and then clamped with a pair of clamping members and heated to thereby bond the substrate 18 and the semiconductor chip 16 through the resin layer 17 in a semi-cured state.

Next, the surface provided with the terminal 161 of the semiconductor chip 16 and the resin layer 15 are disposed so as to face each other to thereby laminate the semiconductor chip 14 on the semiconductor chip 16 through the resin layer 15.

Thereafter, the substrate 18, the resin layer 17, the semiconductor chip 16, the resin layer 15, and the semiconductor chip 14 are clamped with a pair of clamping members, followed by heating, to thereby bond the semiconductor chip 16 and the semiconductor chip 14 through the resin layer 15 in a semi-cured state (stage B).

Next, the surface provided with the terminal 141 of the semiconductor chip 14 and the resin layer 13 are disposed so as to face each other to thereby laminate the semiconductor chip 12 on the semiconductor chip 14 through the resin layer 13.

Then, the substrate 18, the resin layer 17, the semiconductor chip 16, the resin layer 15, the semiconductor chip 14, the resin layer 13, and the semiconductor chip 12 are clamped with a pair of clamping members and heated to thereby bond the semiconductor chip 14 and the semiconductor chip 12 through the resin layer 13 in a semi-cured state (stage B). By performing each time the heating at a temperature, which is below the temperature at which the solder layer melts, in the manner described above, a laminate is obtained in which three sets of semiconductor chips provided with a resin layer are bonded.

The substrate and the semiconductor chip provided with a resin layer may be subjected to a preheating treatment as needed prior to the bonding described above.

Next, the semiconductor chip provided with a resin layer is bonded, which will be disposed as a top of the semiconductor components. In the present embodiment, the semiconductor chip provided with a resin layer which will be disposed on top is also bonded by the heating at a temperature below the melting point of the solder layer. Also in this case, the substrate and the semiconductor chip provided with a resin layer may be subjected to a preheating treatment as needed prior to the bonding described above.

In this manner, the laminate 2 which includes the resin layer 17, the semiconductor chip 16, the resin layer 15, the semiconductor chip 14, the resin layer 13, the semiconductor chip 12, the resin layer 11, and the semiconductor chip 10, and in which the resin layers and the semiconductor components are laminated alternately, is obtained on the substrate 18 by carrying out the same method as that described above.

More specifically, as shown in FIG. 4B, the surface provided with the terminal 121 of the semiconductor chip 12 of the laminate, in which three sets of semiconductor chips provided with a resin layer are bonded, and the resin layer 11 of the semiconductor chip 10 provided with the resin layer 11 are disposed so as to face each other, to thereby laminate the semiconductor chip 10 on the semiconductor chip 12 through the resin layer 11.

At this time, it is preferable to carry out alignment by checking the alignment mark formed on the semiconductor chip 12 and the alignment mark formed on the semiconductor chip 10.

After the alignment, the substrate 18, the resin layer 17, the semiconductor chip 16, the resin layer 15, the semiconductor chip 14, the resin layer 13, the semiconductor chip 12, the resin layer 11, and the semiconductor chip 10 are heated to thereby bond the semiconductor chip 12 and the semiconductor chip 10 through the resin layer 11 in a semi-cured state (stage B). At this time, like the bonding step prior to this, the substrate 18, the resin layer 17, the semiconductor chip 16, the resin layer 15, the semiconductor chip 14, the resin layer 13, the semiconductor chip 12, the resin layer 11, and the semiconductor chip 10 are clamped and heated with a pair of clamping members that have a built-in heater. It is possible to bond the semiconductor chip 12 and the semiconductor chip 10 by clamping with the pair of clamping members and applying a load, together with the heating. For example, the semiconductor chip 12 and the semiconductor chip 10 are bonded in the air under atmospheric pressure by using a flip chip bonder. The heating temperature at this time may be selected in the same manner as the preferred temperature and time in the bonding step prior to this. For example, although the heating temperature is not particularly limited, as long as the thermosetting resin of the resin layer 11 is not fully cured, it is preferably lower than the curing temperature of the thermosetting resin.

Whether the position of the semiconductor chip 10 with respect to the semiconductor chip 12 after bonding is correct or not can be confirmed, for example, by using an X-ray microscope or infrared microscope.

As a result, the laminate 2 which comprises at least the resin layer 17, the semiconductor chip 16, the resin layer 15, the semiconductor chip 14, the resin layer 13, the semiconductor chip 12, the resin layer 11, and the semiconductor chip 10 on the substrate 18, and in which the resin layers and the semiconductor components are laminated alternately, can be obtained (FIG. 4C).

Such a method may be conducted by repeating the steps described above in accordance with the number of connection terminals provided on the substrate 18.

That is, by repeating the lamination step described above with respect to the aforementioned substrate 18 several times, it is possible to obtain a plurality of the laminates 2 on the substrate 18. In the case of forming a plurality of laminates, a plurality of laminates may be formed by the following method for forming a subsequent laminates, after completing the formation of a single laminate.

Alternatively, it may be configured so that the intended number of the first resin layers 17 or the first resin layers 17 bonded to the semiconductor chip, which is the same as the number of laminates prepared in plurality, is provided on the substrate 18, and the bonding step is performed on each of these resin layers or semiconductor chips at the same time or sequentially. In the latter method, a plurality of laminates can be prepared in a short time.

Note that in the present step, the solder layers 121A, 141A, 161A, and 181A are not melted. The terminals 101 and 121, the terminals 122 and 141, the terminals 142 and 161, and the terminals 162 and 181 are not soldered to each other. Further, the terminal 122 and the solder layer 141A may or may not be in contact with each other. Moreover, the resin of the resin layer 13 may be interposed between the terminal 122 and the solder layer 141A. The same applies to the terminal 142 and the solder layer 161A, and the terminal 162 and the solder layer 181A.

(Soldering Step)

Next, the soldering between the terminals is performed. By heating the substrate 18 and the laminate 2 on the substrate 18 obtained in the steps described above, the soldering between the terminals 101 and 121, between the terminals 122 and 141, between the terminals 142 and 161, and between the terminals 162 and 181 is carried out. In FIG. 5, a device 5 which can be used in the present step, and a laminate (structure) following the soldering step, before being taken out from the device 5, are shown.

Here, in the soldering step, the soldering between terminals refers to the following. It refers to a state in which the substrate 18 and the laminate 2 laminated on the substrate 18 are heated to a temperature equal to or higher than the melting point of the solder layers 121A, 141A, 161A, and 181A; and as a result, each of the solder layers 121A 141A 161A, and 181A which is used for bonding between the semiconductor chips 10 and 12, between the semiconductor chips 12 and 14, between the semiconductor chips 14 and 16, and between the semiconductor chip 16 and the substrate 18, respectively, is melted; and also the terminals 101 and 121, the terminals 122 and 141, the terminals 142 and 161, and the terminals 162 and 181 are connected to each other through the solder layers.

The apparatus used in the soldering can be selected arbitrarily. For example, in this case, the device 5 shown in FIG. 5 can be used. The device 5 includes a vessel 51 to which a fluid is introduced, and a pair of hot plates (clamping members) 52 and 53 that are disposed inside the vessel 51.

The vessel 51 is a pressure vessel. Examples of the materials of the vessel 51 include metals and the like, and for example, stainless steel, titanium, or copper is used.

The hot plates 52 and 53 are press plates having a heater therein, and the substrate 18 and the laminate 2 laminated on the substrate 18 that are disposed above the hot plate 53 are clamped with the hot plates 52 and 53. A pin is formed in the hot plate 53. This pin penetrates through a plate material (installing section for installing the substrate 18 and the laminate 2) 55. This plate material 55 slides on the pin and comes into contact with the hot plate 52 when the laminate 2 is clamped.

It is preferable that the temperature of the hot plate 52 be set higher than the temperature of the hot plate 53. For example, the temperature of the hot plate 52 is preferably higher than that of the hot plate 53 by 20° C. or more, and more preferably higher by at least 50° C. and by not more than 200° C. It is preferred that the hot plate 52 be at a temperature equal to or higher than the melting point of the solder layers 121A, 141A, 161A, and 181A, and the hot plate 53 be at a temperature lower than the melting point of the solder layers 121A, 141A, 161A, and 181A. Although the temperature can be selected as needed, by way of example, the temperature of the hot plate 53 is generally from 80 to 220° C., and is preferably from 120 to 180° C., and the temperature of the hot plate 52 is generally from 200 to 400° C., and is preferably from 240 to 320° C.

First, the hot plates 52 and 53 are heated to a predetermined temperature in advance. The plate material 55 is kept away from the hot plate 53. The substrate 18 and the laminate 2 laminated on the substrate 18 are disposed on this plate material 55. Next, a fluid is introduced into the vessel 51 through a pipe 511. The fluid is preferably a gas, and examples thereof include air, an inert gas (nitrogen gas, rare gas) or the like.

Then, while maintaining a state in which the substrate 18 and the laminate 2 are pressurized with the fluid, the plate material 55 is slid on the pin 54 and moved up, so that the substrate 18 and the laminate 2 laminated on the substrate 18 are clamped with the hot plate 52 and the plate material 55 along the lamination direction.

The substrate 18 and the laminate 2 are heated to a temperature equal to or higher than the melting point of the solder layers 121A, 141A, 161A, and 181A to thereby carry out the soldering between the terminals 101 and 121, between the terminals 122 and 141, between the terminals 142 and 161, and between the terminals 162 and 181.

By clamping the substrate 18 and the laminate 2 with the hot plate 52 and the plate material 55, even in those cases where the resin is caught between the terminal 101 and the solder layer 121A (and between the terminal 122 and the solder layer 141A, between the terminal 142 and the solder layer 161A, and between the terminal 162 and the solder layer 181A), it is possible to remove the resin and reliably bring the terminal 101 and the solder layer 121A (and the terminal 122 and the solder layer 141A, the terminal 142 and the solder layer 161A, and the terminal 162 and the solder layer 181A) into contact with each other through the solder layers, and to stably carry out the soldering.

The pressing force at the time of pressurizing the substrate 18 and the laminate 2 laminated on the substrate 18 with the fluid can be selected arbitrarily. It is preferably from not less than 0.1 MPa to not more than 10 MPa, more preferably from not less than 0.3 MPa to not more than 7 MPa, and even more preferably from not less than 0.5 MPa to not more than 5 MPa. By pressurizing the substrate 18 and the laminate 2 with the fluid, it is possible to suppress the generation of voids within the resin layers 11, 13, 15, and 17. In particular, by making the pressing force to be not less than 0.1 MPa, this effect becomes more prominent. Further, by making the pressing force to be not more than 10 MPa, it is possible to suppress an increase in the size and complexity of the device. It should be noted that the expression "pressurizing with the fluid" refers to an increase in the pressure of the atmosphere of the laminate 2, from the atmospheric pressure, which corresponds with the pressing force. In other words, the pressing force of 10 MPa indicates that the pressure applied to the laminate 2 is higher than the atmospheric pressure by 9 MPa. Note that the curing of the resin layer may be completed fully in this step, or the curing may be completed in a sealing step which is conducted optionally.

Here, the laminate 2 is heated at a temperature equal to or higher than the melting point of the solder layers 121A, 141A, 161A, and 181A. For the heating temperature, any temperature equal to or higher than the melting point of the solder layers can be selected. For example, the temperature that can be used for the soldering described in the first embodiment can also be used in the present embodiment. For example, it is possible to heat at 240° C. to 300° C. for about 1 second to 10 minutes. Due to such heating, it is possible to melt the solder layers 121A, 141A, 161A, and 181A, and to thereby carry out the soldering. It should be noted that in those cases where the melting points of the solder layers 121A, 141A, 161A, and 181A are different, it is sufficient to heat the substrate 18 and the laminate 2 thereon to a temperature equal to or higher than the melting point of the solder layer having the highest melting point.

Then, the hot plate 52 and the plate material 55 are separated, and further, the fluid is discharged from the vessel 51.

The application of pressure to the substrate 18 and the laminate 2 with the fluid is stopped due to the discharge described above, and then, the substrate 18 and the laminate 2 are taken out from the vessel 51. Note that in this step, the resin layer may be fully cured, or the curing may not be completed.

In this manner, one or a plurality of the laminates 2 are disposed on the substrate 18, and also as a result of the soldering between the terminals of the substrate 18 and the laminate 2, a structure 3 is obtained (see FIG. 3A).

Note that in the soldering step, in those cases where the resin layers 11, 13, 15, and 17 are not fully cured, the curing of the resin layers 11, 13, 15, and 17 may be promoted by using the device 6 shown in FIG. 2. Because the device 6 has been described in the first embodiment, the descriptions thereof will be omitted. Preferred conditions in the first embodiment can also be used in a similar manner as the preferred conditions.

In the manner described above, the structure 3 is obtained in which the semiconductor chips 10 and 12, the semiconductor chips 12 and 14, the semiconductor chips 14 and 16, and the semiconductor chip 16 and the substrate 18 are soldered to each other (FIG. 3A). Unless otherwise stated, preferred conditions for the structure 3, each of the layers, and the laminate or the like in the first embodiment can also be used in the present embodiment in a similar manner. Therefore, the descriptions thereof will be omitted.

(Sealing Step)

Next, sealing of the structures 3 is conducted using a sealing material, and the semiconductor device 1 shown in FIG. 3B can be obtained by cutting each of the structures 3 following the sealing.

The method of sealing and cutting can be performed in the same manner as the conditions and examples described in the first embodiment. Therefore, the descriptions thereof will be omitted.

According to the present embodiment as described above, it is possible to achieve the following effects.

In the present embodiment, the resin layer 17 and the semiconductor chip 16 are laminated in this order on the substrate 18, followed by heating, to bond the substrate 18 and the semiconductor chip 16 through the resin layer 17 in a semi-cured state; the resin layer 15 and the semiconductor chip 14 are laminated in this order on the semiconductor chip 16, followed by heating, to bond the semiconductor chip 16 and the semiconductor chip 14 through the resin layer 15 in a semi-cured state; the resin layer 13 and the semiconductor chip 12 are laminated in this order on the semiconductor chip 14, followed by heating, to bond the semiconductor chip 14 and the semiconductor chip 12 through the resin layer 13 in a semi-cured state; and the resin layer 11 and the semiconductor chip 10 are laminated in this order on the semiconductor chip 12, followed by heating, to bond the semiconductor chip 12 and the semiconductor chip 10 through the resin layer 11 in a semi-cured state; thereby obtaining a laminate constituted at least of the resin layer 17, the semiconductor chip 16, the resin layer 15, the semiconductor chip 14, the resin layer 13, the semiconductor chip 12, the resin layer 11, and the semiconductor chip 10 on the substrate 18, and in which the resin layers and the semiconductor chips are laminated alternately. After that, a pair of clamping members 52 and 53 are prepared, and the laminate 2 constituted of the substrate 18, the resin layer 17, the semiconductor chip 16, the resin layer 15, the semiconductor chip 14, the resin layer 13, the semiconductor chip 12, the resin layer 11, and the semiconductor chip 10 is mounted on one clamping member 53, and then the substrate 18 and the laminate 2 laminated on the substrate 18 are clamped and heated with the hot plate 52 serving as one clamping member and the plate material 55 serving as the other clamping member, to thereby carry out the soldering. For this reason, as compared with the prior art, it is possible to reduce the thermal damage to the substrate 18 and each of the semiconductor chips 16, 14, 12, and 10. Therefore, it is possible to improve the reliability of the semiconductor device 1.

Further, the resin layer 17 and the semiconductor chip 16 are laminated in this order on the substrate 18, followed by heating, to bond the substrate 18 and the semiconductor chip 16 through the resin layer 17 in a semi-cured state; the resin layer 15 and the semiconductor chip 14 are laminated in this order on the semiconductor chip 16, followed by heating, to bond the semiconductor chip 16 and the semiconductor chip 14 through the resin layer 15 in a semi-cured state; the resin layer 13 and the semiconductor chip 12 are laminated in this order on the semiconductor chip 14, followed by heating, to bond the semiconductor chip 14 and the semiconductor chip 12 through the resin layer 13 in a semi-cured state; and the resin layer 11 and the semiconductor chip 10 are laminated in this order on the semiconductor chip 12, followed by heating, to bond the semiconductor chip 12 and the semiconductor chip 10 through the resin layer 11 in a semi-cured state. As a result, a laminate constituted at least of the resin layer 17, the semiconductor chip 16, the resin layer 15, the semiconductor chip 14, the resin layer 13, the semiconductor chip 12, the resin layer 11, and the semiconductor chip 10 on the substrate 18, and in which the resin layers and the semiconductor chips are laminated alternately, is obtained. After that, a pair of clamping members 52 and 53 are prepared, and the laminate 2 constituted of the substrate 18, the resin layer 17, the semiconductor chip 16, the resin layer 15, the semiconductor chip 14, the resin layer 13, the semiconductor chip 12, the resin layer 11, and the semiconductor chip 10 is mounted on one clamping member 53, and then the substrate 18 and the laminate 2 laminated on the substrate 18 are clamped and heated with the hot plate 52 serving as one clamping member and the plate material 55 serving as the other clamping member, to thereby carry out the soldering between the terminals 181 and 162, between the terminals 161 and 142, between the terminals 141 and 122, and between the terminals 121 and 101 at the same time. For this reason, compared with the cases where a plurality of semiconductor components are laminated while sequentially performing the soldering for each pair of semiconductor components, it is possible to improve the productivity at the time of soldering.

Note that in the present embodiment, at the time of obtaining the laminate 2, heating is performed each time a semiconductor chip provided with a resin layer is laminated on the substrate 18. The heating in this case is a heating process for bonding, with a resin layer, between the substrate and the semiconductor chip, and between the semiconductor chips. Accordingly, the heating time may be relatively short and also the heating temperature may be low. Therefore, even if a step for obtaining the laminate 2 is carried out, it is possible to improve productivity, as compared to the conventional manufacturing method.

Further, in the present embodiment, the laminate 2 is clamped for soldering.

Conventionally, each time a semiconductor chip was laminated, it was clamped and soldered. For this reason, the semiconductor chips in the lower layer were subjected to several times of clamping and were easily damaged.

On the other hand, in the present embodiment, a pair of clamping members are prepared; and the substrate 18, the resin layer 17, the semiconductor chip 16, the resin layer 15, the semiconductor chip 14, the resin layer 13, the semiconductor chip 12, the resin layer 11, and the semiconductor chip 10 are laminated on one of the clamping members; the substrate 18 and the laminate 2 on the substrate 18 as a whole are clamped by the one clamping member and the other clamping member, and heated to carry out the soldering. Therefore, several times of clamping at the time of soldering can be prevented, and thus the damage to the substrate 18 and the semiconductor chips 16, 14, 12, and 10 can be reduced.

Further, in the present embodiment, after soldering between the terminals 181 and 162, the terminals 161 and 142, the terminals 141 and 122, and the terminals 121 and 101 of the laminate 2 to configure the structure 3, the structure 3 is pressurized with a fluid, followed by heating, to thereby cure the resin layers 17, 15, 13 and 11. By pressurizing the structure 3 with a fluid, it is possible to prevent the generation of voids in the resin layers 17, 15, 13 and 11 of the structure 3. Further, by pressurizing the structure 3 with a fluid, the voids present in the resin layers 17, 15, 13 and 11 of the structure 3 are pressurized and decrease in size. For the reasons described above, it is possible to prevent the voids from causing the positional misalignment between the terminals. Further, it is possible to prevent the resin layers 17, 15, 13 and 11 from being protruded by the voids and soiling the device 6.

In the step for preparing the laminate 2, when lamination of the semiconductor chip provided with a resin layer is carried out under atmospheric pressure, for example, in some cases, gas enters the interface between the resin layer 17 and the semiconductor chip 16 to form voids in the resin layer 17. However, as mentioned above, because it is possible to make the voids smaller by applying pressure when curing the laminate, the step for preparing the laminate 2 need not necessarily be carried out under vacuum or the like, but can be carried out under atmospheric pressure. Therefore, it is possible to enhance the manufacturing efficiency of the semiconductor device 1, and it is also possible to reduce the manufacturing cost.

Further, in the present embodiment, in the step for preparing the laminate 2, the substrate 18 and the semiconductor chip 16 are bonded through the resin layer 17 in a semi-cured state. In the same manner, the semiconductor chips 16 and 14 are bonded through the resin layer 15 in a semi-cured state, the semiconductor chips 14 and 12 are bonded through the resin layer 13 in a semi-cured state, and the semiconductor chips 12 and 10 are bonded through the resin layer 11 in a semi-cured state. As described above, since the semiconductor chips are bonded to each other, it is possible to prevent the occurrence of positional deviation among the semiconductor chips in the laminate 2.

It should be noted that when bonding the semiconductor chips 12 and 10 through the resin layer 11 in a semi-cured state, and when bonding the semiconductor chips 14 and 12 through the resin layer 13 in a semi-cured state, heat is applied several times to the substrate 18 and the semiconductor chips 16, 14, and 12. However, because the heating is for bonding the semiconductor chips with a resin layer in a semi-cured state, the heating temperature can be set relatively low, and also the heating time can be kept relatively short even if the heating temperature is raised. Therefore, it is thought that there is very little influence of heat on the substrate 18 and the semiconductor chips 16, 14, and 12.

Further, in the present embodiment, in the previous stage for configuring the laminate 2, the resin layer 17 is provided to the semiconductor chip 16. In the same manner, the resin layer 15 is provided to the semiconductor chip 14, and the resin layer 13 is provided to the semiconductor chip 12. Although all of the semiconductor chips 16, 14, and 12 have a TSV structure with a very thin thickness, by providing the resin layers 17, 15, and 13, respectively, it is possible to prevent the occurrence of warpage of the semiconductor chips 16, 14, and 12 and to provide them with excellent handling properties.

Further, in the present embodiment, a semiconductor chip having a TSV structure with a very thin thickness will be laminated on the substrate 18. For this reason, it is possible to provide excellent handling properties, as compared with the conventional cases where the semiconductor chips having a TSV structure with a very thin thickness are laminated.

Further, in the present embodiment, after soldering a plurality of the laminates 2 to the substrate 18, sealing is carried out, followed by cutting. As a result, it is possible to improve the productivity of the semiconductor device 1.

It should be noted that the present invention is not limited to the embodiment described above, and modifications, improvements or the like within a range that can achieve the object of the present invention are included in the present invention.

Furthermore, in the embodiment described above, soldering is conducted at the same time as the configuration of the laminate 2 on the substrate 18, followed by the curing. However, the resin layers 17, 15, 13, and 11 do not have to be completely cured in the curing step. For example, the resin layers 17, 15, 13 and 11 may be completely cured when the sealing is performed.

Furthermore, in the embodiment described above, the resin layer 17 was provided on the semiconductor chip 16 side, and the semiconductor chip 16 provided with the resin layer 17 was laminated on the substrate 18. However, the present invention is not limited thereto. For example, as shown in FIGS. 6A and 6B, it is possible to provide the resin layers 17A and 17B to the semiconductor chip 16 and the substrate 18, respectively, and to configure the resin layer 17 with the resin layers 17A and 17B.

Further, the resin layer 17 may be provided on the substrate 18; the resin layer 15 may be provided on the semiconductor chip 16 side; the resin layer 13 may be provided on the semiconductor chip 14; and the resin layer 11 may be provided on the semiconductor chip 12 side.

In the present invention, the position of the solder layer can be selected arbitrarily as long as the soldering between the terminals is possible. The above-mentioned examples and conditions can also be used as the preferred examples and conditions.

For example, as shown in FIGS. 10A to 12F, it is possible to provide only a terminal on the substrate without providing a semiconductor layer, and then use a semiconductor chip provided with a resin layer as described below. More specifically, it is possible to use a semiconductor chip provided with a resin layer, which includes a solder layer present on top of a terminal on the surface on the substrate side of the semiconductor chip provided with the resin layer, and embedded in the resin layer. At this time, the semiconductor chip 10 provided with the resin layer serving as the top layer also has a solder layer 101A.

The method shown in FIGS. 10A to 10D is substantially the same as the method shown in FIGS. 4A to 4C, FIG. 5, and FIGS. 3A and 3B with the exception that the positions of the solder layers are different.

Note that other than the difference in the positions of the solder layers, those shown in FIGS. 11A to 11E and FIGS. 12A to 12F are different from those shown in FIGS. 4A to 4C in the following points.

Figure 11A:
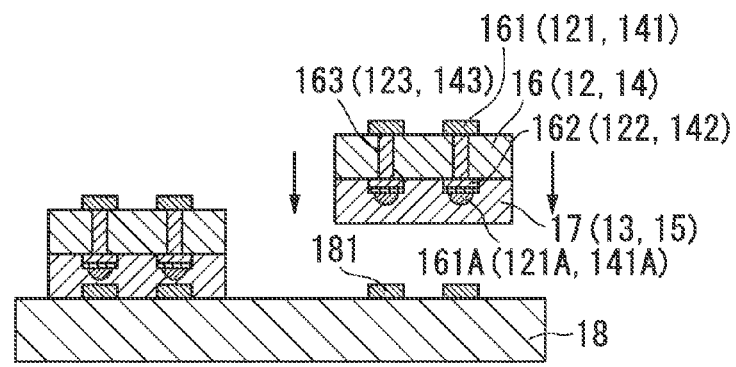
FIG. 11A is a schematic process diagram showing an example of a method of manufacturing a semiconductor device of the present invention.
Figure 11B:
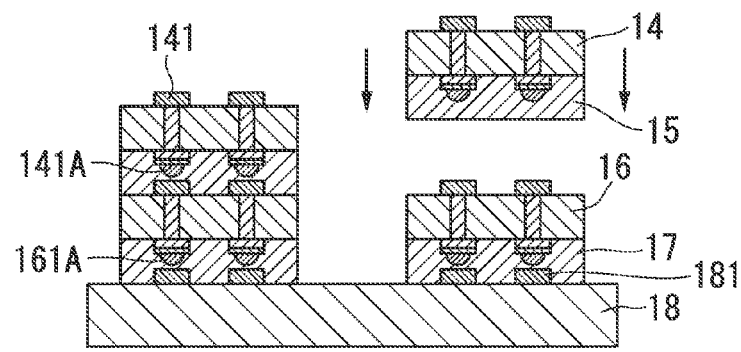
FIG. 11B is a schematic process diagram showing an example of a method of manufacturing a semiconductor device of the present invention.
Figure 11C:
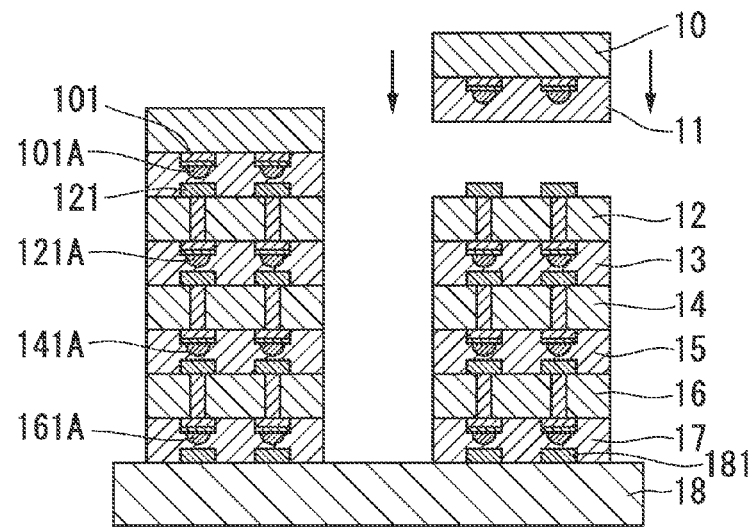
FIG. 11C is a schematic process diagram showing an example of a method of manufacturing a semiconductor device of the present invention.
Figure 11D:
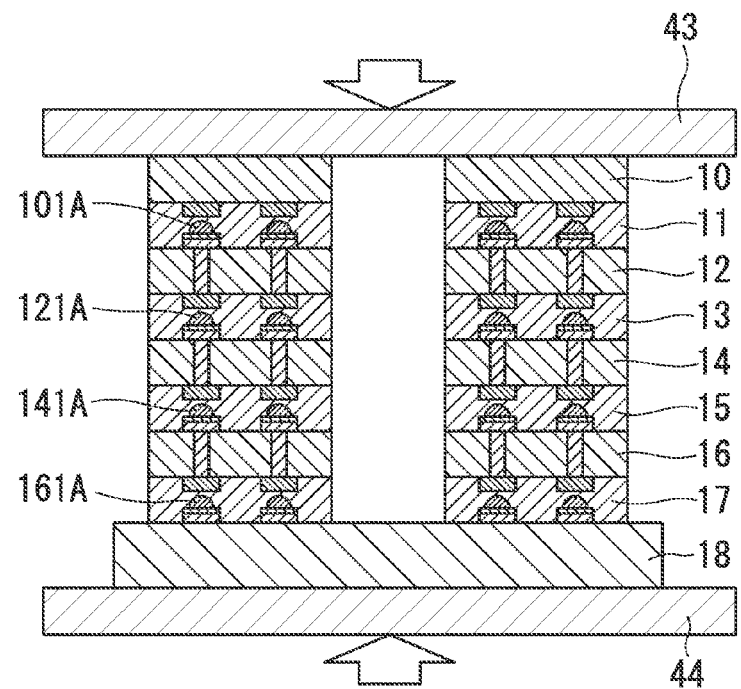
FIG. 11D is a schematic process diagram showing an example of a method of manufacturing a semiconductor device of the present invention.
Figure 11E:
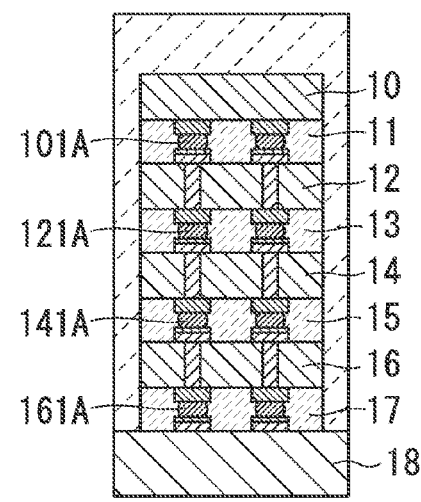
FIG. 11E is a schematic process diagram showing an example of a method of manufacturing a semiconductor device of the present invention.
Figure 12A:
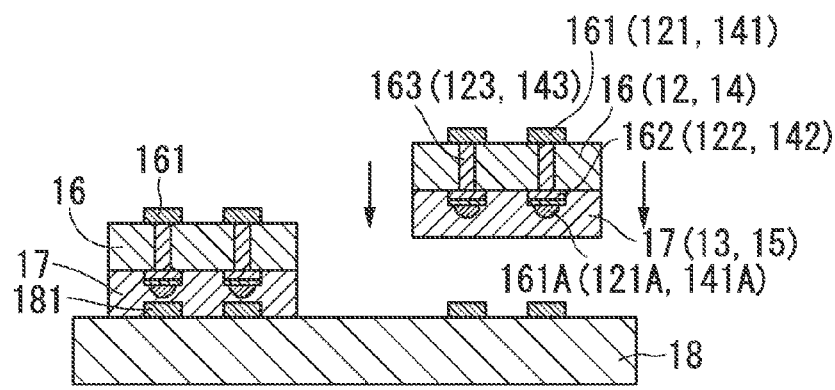
FIG. 12A is a schematic process diagram showing an example of a method of manufacturing a semiconductor device of the present invention.
Figure 12B:
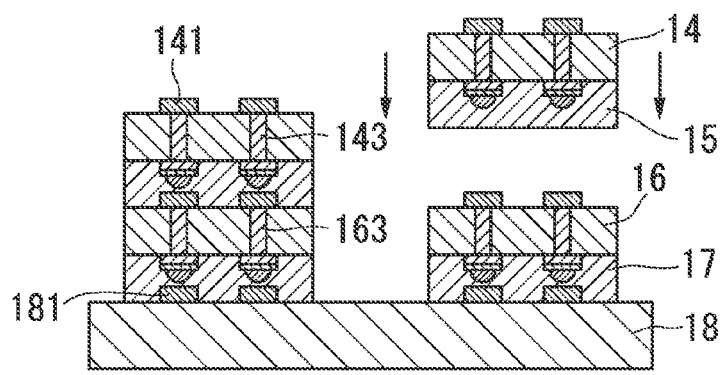
FIG. 12B is a schematic process diagram showing an example of a method of manufacturing a semiconductor device of the present invention.
Figure 12C:
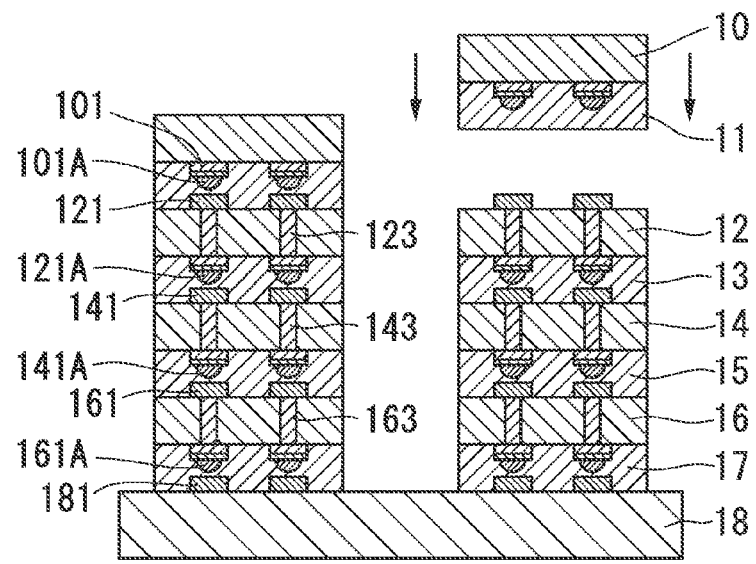
FIG. 12C is a schematic process diagram showing an example of a method of manufacturing a semiconductor device of the present invention.
Figure 12D:
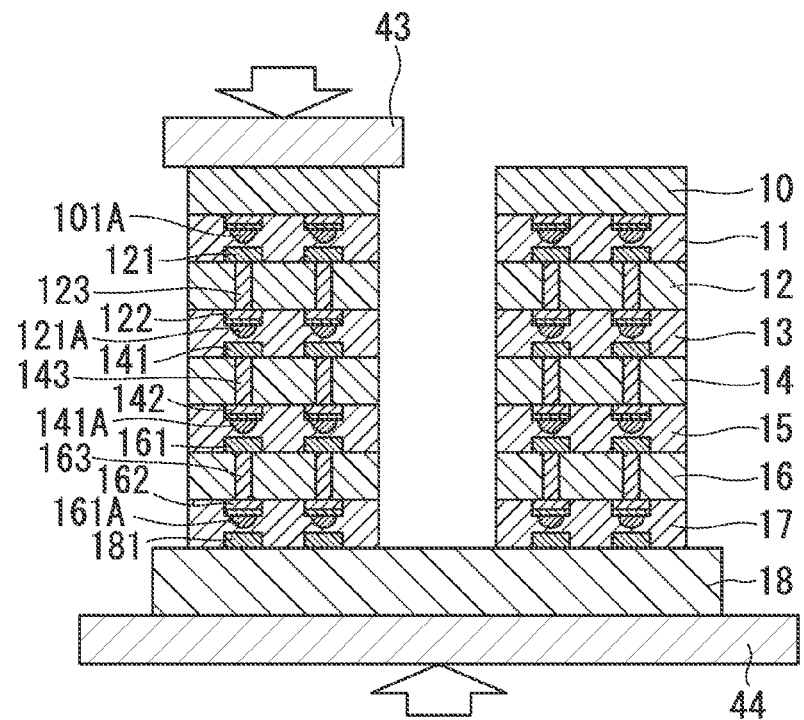
FIG. 12D is a schematic process diagram showing an example of a method of manufacturing a semiconductor device of the present invention.
Figure 12E:
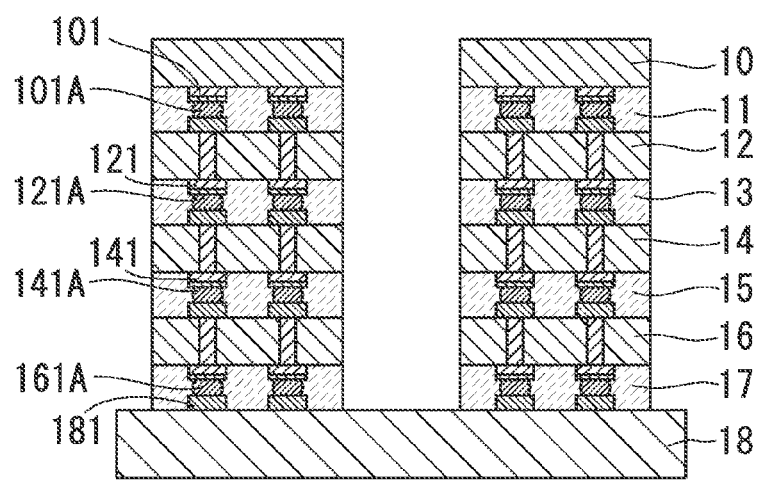
FIG. 12E is a schematic process diagram showing an example of a method of manufacturing a semiconductor device of the present invention.
Figure 12F:
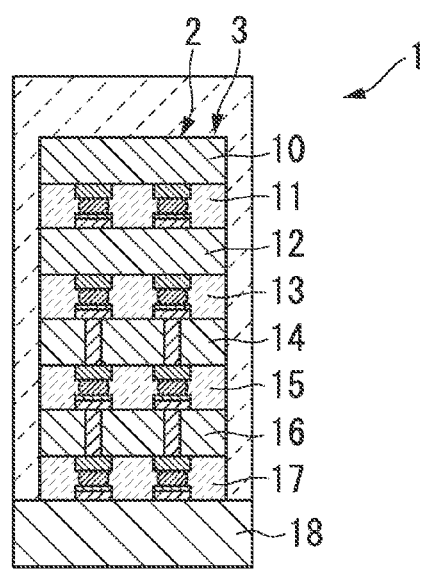
FIG. 12F is a schematic process diagram showing an example of a method of manufacturing a semiconductor device of the present invention.

Other than the difference in the positions of the semiconductor layers, the method shown in FIGS. 11A to 11E is different from the method shown in FIGS. 4A to 4C, FIG. 5, and FIGS. 3A and 3B in that a plurality of laminates are manufactured at about the same time. Note that pressurization may be carried out as necessary in the semiconductor soldering step in FIG. 11D. FIGS. 11A to 11C show a state in which a plurality of semiconductor chips provided with a resin layer are disposed one by one with respect to a plurality of terminals on a substrate, and after this step is completed, to the above semiconductor chips, semiconductor chips provided with a resin layer are disposed one by one in order, and these operations are repeated. However, it is also possible to employ a method in which a plurality of semiconductor chips provided with a resin layer are disposed onto a predetermined substrate or semiconductor chip at once, and these operations are repeated.

Other than the difference in the positions of the solder layers, the method shown in FIGS. 12A to 12F is different from the method shown in FIGS. 4A to 4C, FIG. 5, and FIGS. 3A and 3B in that a plurality of laminates are manufactured at about the same time, and also that the soldering is carried out for each laminate. It is different from the method shown in FIGS. 11A to 11E in that the soldering is carried out for each laminate, but otherwise the same.

Furthermore, in the embodiment described above, the semiconductor chip 10 may also be configured so as to have a TSV structure.

Further, in each of the embodiments described above, an example of manufacturing the semiconductor device 1 having four semiconductor chips was described. However, the present invention is not limited thereto. It is sufficient to include at least two or more, and preferably three or more semiconductor chips. The upper limit for the number of semiconductor chips and resin layers is not particularly limited, as long as the manufacturing is possible. It is sufficient as long as the resulting structure includes a plurality of resin layers and a plurality of semiconductor components which are laminated alternately therein.

In other words, for example, the laminate described above is one obtained by laminating at least a first resin layer, a first semiconductor component, a second resin layer, a second semiconductor component, a third resin layer, and a third semiconductor component on a substrate. In addition, the laminate may be configured so that each pair of the semiconductor components and/or the substrate and semiconductor component that are facing each other through the resin layer has a connection terminal for electrically connecting between the substrate and the semiconductor component and between the semiconductor components, respectively; and of the above connection terminals that are facing each other, at least one connection terminal has a solder layer.

Furthermore, in the embodiment described above, the terminals 181, 161, 141, and 121 had the solder layers 181A, 161A, 141A, and 121A. However, the present invention is not limited thereto, and the terminals 162, 142, 122, and 101 may be one having a solder layer on the surface. Further, all of the terminals 181, 161, 141, and 121, and the terminals 162, 142, 122, and 101 may have a solder layer on the surface. As long as the terminals that are facing each other can be subjected to soldering, the solder layer may be present on one terminal or on both terminals. It is possible to melt the solder layers thereof to carry out the soldering between the substrate 18 and the semiconductor chips 16, 14, 12, and 10.

EXAMPLES

Specific examples of a manufacturing method of the present invention will be shown below. However, the present invention is not limited to these specific examples.

Example 1

1. Preparation of Resin Film (Resin Layer)

9 g of a phenol novolac resin (manufactured by Sumitomo Bakelite Co., Ltd.; model number: PR-55617), 26.8 g of a liquid bisphenol A type epoxy resin (manufactured by Dainippon Ink and Chemicals, Inc.; model number: EPICLON-840S), 9 g of phenolphthalin (manufactured by Tokyo Chemical Industry Co., Ltd.), 14.8 g of a bisphenol A type phenoxy resin (manufactured by Tohto Kasei Co., Ltd.; model number: YP-50), 0.1 g of 2-phenyl-4-methylimidazole (manufactured by Shikoku Chemicals Corporation; model number: 2P4MZ), 0.5 g of β-(3,4-epoxy cyclohexyl)ethyl trimethoxysilane (manufactured by Shin-Etsu Chemical Co., Ltd.; model number: KBM-403), and 40 g of a spherical silica filler (manufactured by Admatechs Co., Ltd.; model number: SC1050; average particle size: 0.25 μm) were dissolved and stirred in methyl ethyl ketone to thereby obtain a resin varnish having a solid content of 50% by weight.

This resin varnish was applied to a polyester film (manufactured by Toray Industries, Inc.; model number: Lumirror) and dried under the conditions of 100° C./5 min, to thereby obtain a resin film having a resin thickness of 26 μm.

The melt viscosity of the resin film was 1,200 Pa·s at 80° C., and was 230 Pa·s at 150° C.

It should be noted that this resin varnish was in a semi-cured state (liquid varnish→film-like) when dried at 100° C. for 5 minutes. In addition, the resin varnish can be dried at 60° C. to 180° C., depending on the time, and the curing temperature of the obtained film was in the range of 120° C. to 250° C., depending on the curing time.

2. Preparation of a Silicon Chip Provided with a Resin Film

An 8-inch silicon wafer on which a dicing film had been formed was prepared. The thickness of the silicon wafer is 100 μm. A plurality of bonding pads having a diameter of 40 μm and a height of 10 μm were formed on the surface side on which the dicing film of the wafer had been formed, and a Ni/Au plating was formed on the pad surface.

A plurality of copper bumps having a diameter of 40 μm and a height of 8 μm were formed as protrusions on the surface opposite to the surface on which the dicing film had been formed, and a Sn-3.5Ag solder layer having a thickness of 6 μm was formed thereon. The melting temperature of the solder layer is 221° C.

In addition, the portions in which the copper bumps described above are not exposed are conducting the front and back of the silicon wafer, thereby forming a TSV (Through Silicon Via) structure. Note that the above bonding pads and the copper bumps are in contact in a predetermined combination.

It should be noted that the protruding portion of the copper bumps and the bonding pads act as a connection terminal described in the present invention.

The resin film described above was laminated on an 8-inch silicon wafer on the side where the copper bumps are formed as protrusions, by using a vacuum laminator (manufactured by Meiki Co., Ltd.; model number: MVLP-500/600-2A) under the conditions of 95° C./30 sec/0.8 MPa.

Then, a plurality of silicon chips provided with a resin film that have a size of 6 mm square and a number of solder bumps of 1,089 (bump pitch: 180 μm; area array arrangement) were obtained by dicing a laminate (dicing film/silicon wafer/resin film) under the following conditions using a dicing apparatus (manufactured by DISCO Corporation; model number: DFD-6340).
<Dicing Conditions>
Dicing speed: 20 mm/sec
Spindle rotation speed: 40,000 rpm
Blade Part Number: ZH05-SD 3500-N1-50 BB (manufactured by DISCO Corporation)

3. Preparation of Substrate

A silicon substrate block in which 4,356 pads having a diameter of 40 μm and a height of 10 μm were formed on one side was prepared. A Ni/Au plating has been formed on the pad surface of the silicon substrate block with a size of 20 mm square and a thickness of 0.4 mm. A TSV (Through Silicon Via) which conducts the front and back of the silicon substrate is formed in the silicon substrate block. In addition, the silicon substrate block is an aggregate of four silicon substrates having a size of 10 mm square and a number of pads of 1,089 (pad pitch: 180 μm; area array arrangement).

4. Preparation of Laminate

The silicon chip was laminated on the silicon substrate block as follows using a flip chip bonder (manufactured by Panasonic Factory Solutions Co., Ltd.; model number: F033).

The lower stage of the flip chip bonder (one of the clamping members) was set to 100° C., and the silicon substrate block was mounted thereon. Next, the silicon chip provided with a resin film was adsorbed onto a bonding tool (the other clamping member) which was set to 150° C. Thereafter, the silicon substrate block and the silicon chip provided with a resin film were aligned using the vertical camera of the flip chip bonder and laminated under the condition of a load of 5 N for 2 seconds to obtain a laminate (silicon substrate block/resin film/silicon chip). It should be noted that the silicon substrate block was an assembly including four silicon substrates, and the silicon chip provided with a resin film was mounted onto any one area among them.

Next, the laminate (silicon substrate block/resin film/silicon chip) obtained above was removed once, and was then mounted on the lower stage of the flip chip bonder which was set to 100° C. Another silicon chip provided with a resin film was adsorbed onto a bonding tool which was set to 150° C., and the silicon chip in the above laminate and the silicon chip provided with a resin film were aligned using the vertical camera of the flip chip bonder and laminated under the condition of a load of 5 N for 2 seconds. As a result, a laminate of a two-layer lamination type (silicon substrate block/resin film/silicon chip/resin film/silicon chip) (laminate (I)) was obtained.

5. Soldering of Laminate

The soldering between each of the layers (solder bumps/pads) of the laminate (I) was carried out by using a flip chip bonder. The lower stage of the flip chip bonder was set to 100° C., and the laminate (I) was mounted thereon. The laminate (I) was pressurized with a bonding tool which was set to 150° C. under the condition of a load of 50 N for 12 seconds, and then the temperature of the bonding tool was raised rapidly. That is, the soldering between each of the layers (solder bumps/pads) was carried out by setting the temperature of the bonding tool to 280° C. and pressurization at 50 N for 12 seconds, to obtain a laminate (structure) (silicon substrate block/resin film/silicon chip/resin film/silicon chip).

In the same manner as described above, three sets of laminates were formed on other areas of the silicon substrate blocks. More specifically, a combination of a step for laminating two layers of the silicon chip provided with a resin film and a step for carrying out the soldering was repeated three times in total, thereby obtaining a laminate of a two-stage lamination type in which silicon chips were laminated and soldered on all of the silicon substrates of the silicon substrate block (laminate (II)). Further, when performing the soldering, the application of pressure was conducted for each lamination process.

Note that the laminate (I) and the laminate (II) are laminates formed in the same manner.

Then, in order to complete the curing of the resin layer, four sets of laminates (laminate (I) and three laminates (II)) formed on one substrate were pressurized and cured using a pressurizing and heating device (manufactured by Kyosin Engineering Corporation; model number: HPV-5050MAH-D). Air was used as a pressurizing fluid, and the pressurization and curing was conducted under the conditions of 180° C./2 hr/0.8 MPa to obtain a laminate (laminate (III)).

6. Sealing and Cutting

The laminate (III) was subjected to sealing and molding using an epoxy resin sealing material (manufactured by Sumitomo Bakelite Co., Ltd., model number: SUMIKON EME-G770) under the conditions of a mold temperature of 175° C., an injection pressure of 7.8 MPa, and a curing time of 2 minutes by using a transfer molding machine. Thereafter, the resultant was post-cured at 175° C. for 2 hours to obtain a semiconductor device assembly.

Then, using a dicing apparatus, the semiconductor device assembly was diced under the following conditions to obtain a semiconductor device of 10 mm square.
<Dicing Conditions>
Dicing speed: 2 mm/sec
Spindle rotation speed: 30,000 rpm
Blade Part Number: ZH05-SD 3500-N1-50 DD

7. Evaluation of Semiconductor Device

The thus obtained semiconductor device was embedded in an epoxy resin and the cross section thereof was observed with a scanning electron microscope (SEM). As a result, solder joints between (silicon substrate/silicon chip) and between (silicon chip/silicon chip) were excellent, and also no crack was observed on the silicon chip. Moreover, no voids were observed in the resin layers between (silicon substrate/silicon chip) and between (silicon chip/silicon chip).

Example 2

1. Preparation of Laminate

The silicon chip provided with a resin film used in Example 1 was laminated on the silicon substrate block used in Example 1 by using a flip chip bonder.

The lower stage of the flip chip bonder was set to 100° C., and the silicon substrate block was mounted thereon. Next, the silicon chip provided with a resin film was adsorbed onto a bonding tool which was set to 150° C. Thereafter, the silicon substrate block and the silicon chip were aligned using the vertical camera of the flip chip bonder and laminated under the condition of a load of 5 N for 2 seconds. As a result, a laminate (silicon substrate block/resin film/silicon chip) was obtained. It should be noted that the silicon substrate block was an assembly of four silicon substrates, and the silicon chip provided with a resin film was mounted onto any one of the areas.

Moreover, also in the remaining three areas of the silicon substrate block, a silicon chip provided with a resin film was laminated one by one in the same manner as described above to obtain a laminate.

Next, the one-layered laminate obtained above was mounted on the lower stage which was set to 100° C. Another silicon chip provided with a resin film was adsorbed onto a bonding tool which was set to 150° C. Thereafter, the silicon chip in the above laminate and the silicon chip provided with a resin film were aligned using the vertical camera of the flip chip bonder and laminated under the condition of a load of 5 N for 2 seconds, to obtain a laminate of two-layer lamination type.

Moreover, also in the remaining three areas of the above laminate, a silicon chip was laminated one by one in the same manner as described above, and the silicon chips provided with a resin film were laminated two by two on the respective silicon substrate areas of the silicon substrate block. In this way, four sets of laminates (laminate (IV)) were obtained.

2. Soldering of Laminate (IV)

For any one laminate among the four sets of laminates (IV), bonding between (solder bumps/pads) in each of the layers that are laminated on a silicon substrate in a predetermined area was carried out by using a flip chip bonder. The lower stage of the flip chip bonder was set to 100° C., and the four sets of the laminates (IV) were mounted thereon.

Among the laminates (IV), the laminate (IV) present in any one of the aforementioned areas on the silicon substrate was pressurized with a bonding tool which was set to 150° C. under the condition of a load of 50 N for 12 seconds, and then the temperature of the bonding tool was raised rapidly. That is, the soldering between (solder bumps/pads) in each of the layers of the above laminate was carried out by setting the temperature of the bonding tool to 280° C. and pressurization at 50 N for 12 seconds.

In the same manner as the pressurization and heating described above, bonding between (solder bumps/pads) in each of the layers of the three laminates laminated on the silicon substrate in the remaining three areas was carried out sequentially to obtain four laminates of two-layer lamination type (laminate (V)) (structure) that were formed on one substrate.

Then, in order to complete the curing of the resin layer, the laminate (V) was pressurized and cured using the pressurizing and heating device used in Example 1. Air was used as a pressurizing fluid, and the pressurization and curing was conducted under the conditions of 180° C./2 hr/0.8 MPa to obtain a laminate (laminate (VI)).

3. Sealing and Cutting

The laminate (VI) was subjected to sealing and molding using an epoxy resin sealing material (manufactured by Sumitomo Bakelite Co., Ltd., model number: SUMIKON EME-G770) under the conditions of a mold temperature of 175° C., an injection pressure of 7.8 MPa, and a curing time of 2 minutes by using a transfer molding machine. Thereafter, the resultant was post-cured at 175° C. for 2 hours to obtain a semiconductor device assembly.

Then, using a dicing apparatus, the semiconductor device assembly was diced under the following conditions to obtain a semiconductor device of 10 mm square.
<Dicing Conditions>
Dicing speed: 2 mm/sec
Spindle rotation speed: 30,000 rpm
Blade Part Number: ZH05-SD 3500-N1-50 DD

4. Evaluation of Semiconductor Device

The thus obtained semiconductor device was embedded in an epoxy resin and the cross section thereof was observed with a scanning electron microscope (SEM). As a result, solder joints between (silicon substrate/silicon chip) and between (silicon chip/silicon chip) were excellent, and also no crack was observed on the silicon chip. Moreover, no voids were observed in the resin layers between (silicon substrate/silicon chip) and between (silicon chip/silicon chip).

Example 3

1. Soldering of Laminate (IV)

Four sets of the laminates (IV) identical to those manufactured in Example 2 were prepared. The soldering between (solder bumps/pads) of the laminate (IV) was carried out by using a flip chip bonder in the similar manner as the soldering in Example 2 with the exception that the conditions were changed. In Example 3, the soldering between all of (solder bumps/pads) of the four laminates laminated on the four silicon substrate areas was collectively carried out. More specifically, the soldering was carried out in the following manner.

The lower stage of the flip chip bonder was set to 100° C., and the four sets of the laminates (IV) formed on one substrate were mounted thereon. Four of the laminates (IV) were pressurized at the same time with a bonding tool which was set to 150° C. under the condition of a load of 200 N for 12 seconds. Then, the temperature of the bonding tool was raised rapidly to set the temperature of the bonding tool to 280° C., and the resultant was pressurized at 200 N for 12 seconds to carry out the soldering between (solder bumps/pads) of all layers, thereby obtaining a laminate (structure) which had been subjected to soldering.

Then, in order to complete the curing of the resin layer, the laminate (IV) in which between (solder bumps/pads) was soldered was pressurized and cured using the pressurizing and heating device used in Example 1. Air was used as a pressurizing fluid, and the pressurization and curing was conducted under the conditions of 180° C./2 hr/0.8 MPa to obtain a laminate (laminate (VII)).

3. Sealing and Cutting

The laminate (VII) was subjected to sealing and molding using an epoxy resin sealing material (manufactured by Sumitomo Bakelite Co., Ltd., model number: SUMIKON EME-G770) under the conditions of a mold temperature of 175° C., an injection pressure of 7.8 MPa, and a curing time of 2 minutes by using a transfer molding machine. Thereafter, the resultant was post-cured at 175° C. for 2 hours to obtain a semiconductor device assembly.

Then, using a dicing apparatus, the semiconductor device assembly was diced under the following conditions to obtain a semiconductor device of 10 mm square.
<Dicing Conditions>
Dicing speed: 2 mm/sec
Spindle rotation speed: 30,000 rpm
Blade Part Number: ZH05-SD 3500-N1-50 DD 4. Evaluation of Semiconductor Device The thus obtained semiconductor device was embedded in an epoxy resin and the cross section thereof was observed with a scanning electron microscope (SEM). As a result, solder joints between (silicon substrate/silicon chip) and between (silicon chip/silicon chip) were excellent, and also no crack was observed on the silicon chip. Moreover, no voids were observed in the resin layers between (silicon substrate/silicon chip) and between (silicon chip/silicon chip).

Example 4

1. Preparation of Laminate

The laminate (I) was prepared in the same manner as in Example 1. A step for laminating the silicon chip provided with a resin film two by two was repeated three times in the remaining three areas on the silicon substrate block to obtain three sets of laminates (laminate (VIII)). Note that the laminate (I) and the laminate (VIII) are the same laminates manufactured in the same manner.

2. Soldering of Laminate

The soldering between (solder bumps/pads) of all the layers of the aforementioned four sets of laminates was carried out at the same time in the same manner as in Example 3.

Then, in order to complete the curing of the resin layer, the resultant was pressurized and cured using a pressurizing and heating device. Air was used as a pressurizing fluid, and the pressurization and curing was conducted under the conditions of 180° C./2 hr/0.8 MPa to obtain a laminate (laminate (IX)).

3. Sealing and Cutting

The laminate (IX) was subjected to sealing and molding using an epoxy resin sealing material (manufactured by Sumitomo Bakelite Co., Ltd., model number: SUMIKON EME-G770) under the conditions of a mold temperature of 175° C., an injection pressure of 7.8 MPa, and a curing time of 2 minutes by using a transfer molding machine. Thereafter, the resultant was post-cured at 175° C. for 2 hours to obtain a semiconductor device assembly.

Then, using a dicing apparatus, the semiconductor device assembly was diced under the following conditions to obtain a semiconductor device of 10 mm square.
<Dicing Conditions>
Dicing speed: 2 mm/sec
Spindle rotation speed: 30,000 rpm
Blade Part Number: ZH05-SD 3500-N1-50 DD 4. Evaluation of Semiconductor Device The thus obtained semiconductor device was embedded in an epoxy resin and the cross section thereof was observed with a scanning electron microscope (SEM). As a result, solder joints between (silicon substrate/silicon chip) and between (silicon chip/silicon chip) were excellent, and also no crack was observed on the silicon chip. Moreover, no voids were observed in the resin layers between (silicon substrate/silicon chip) and between (silicon chip/silicon chip).

Example 5

1. Preparation of Laminate

The silicon chip provided with a resin film used in Example 1 was laminated on the silicon substrate block used in Example 1 by using a flip chip bonder.

The lower stage of the flip chip bonder was set to 100° C., and the silicon substrate block was mounted thereon. Next, the silicon chip provided with a resin film was adsorbed onto a bonding tool which was set to 150° C. Thereafter, the silicon substrate block and the silicon chip were aligned using the vertical camera of the flip chip bonder and laminated under the condition of a load of 5 N for 2 seconds to obtain a laminate (silicon substrate block/resin film/silicon chip). It should be noted that the silicon substrate block was an assembly including four silicon substrates, and the silicon chip provided with a resin film was mounted onto any one area among them.

Moreover, also in the remaining three areas of the silicon substrate block, a silicon chip provided with a resin film was laminated one by one in the same manner as described above to obtain a laminate.

Next, the four sets of the one-layer laminates obtained above were mounted on the lower stage which was set to 100° C. Another silicon chip provided with a resin film was adsorbed onto a bonding tool which was set to 150° C. Thereafter, for one laminate, the silicon chip in the above laminate and the silicon chip provided with a resin film were aligned using the vertical camera of the flip chip bonder and laminated under the condition of a load of 5 N for 2 seconds, to obtain one laminate of two-layer lamination type.

Moreover, also on the laminates in the remaining three areas of the above laminate, a silicon chip was laminated one by one in the same manner as described above. The silicon chips provided with a resin film were laminated two by two on the respective silicon substrate areas of the silicon substrate block. In this manner, four sets of laminates of two-layer lamination type were obtained.

Furthermore, the silicon chip provided with a resin film was further laminated on the above laminate in the respective silicon substrate areas of the silicon substrate block to obtain four sets of laminates of three-layer lamination type (laminate (X)).

2. Soldering of Laminate (X)

For any one laminate among the four sets of laminates (X), bonding between (solder bumps/pads) in each of the layers that are laminated on a silicon substrate in a predetermined area was carried out by using a flip chip bonder. The lower stage of the flip chip bonder was set to 100° C., and the four sets of the laminates (X) were mounted thereon. The laminate (IV) present in any one of the areas on the silicon substrate was pressurized with a bonding tool which was set to 150° C. under the conditions of a load of 50 N for 12 seconds, and then the temperature of the bonding tool was raised rapidly. That is, the soldering between (solder bumps/pads) in each of the layers of the above laminate was carried out by setting the temperature of the bonding tool to 280° C. and pressurization at 50 N for 12 seconds.

In the same manner as the pressurization and heating described above, bonding between (solder bumps/pads) in each of the layers laminated on the silicon substrate in the remaining three areas was carried out to obtain a laminate (laminate (XI)).

Then, in order to complete the curing of the resin layer, the laminate (XI) was pressurized and cured using the pressurizing and heating device used in Example 1. Air was used as a pressurizing fluid, and the pressurization and curing was conducted under the conditions of 180° C./2 hr/0.8 MPa to obtain a laminate (laminate (XI)).

3. Sealing and Cutting

The laminate (XI) was subjected to sealing and molding using an epoxy resin sealing material (manufactured by Sumitomo Bakelite Co., Ltd., model number: SUMIKON EME-G770) under the conditions of a mold temperature of 175° C., an injection pressure of 7.8 MPa, and a curing time of 2 minutes by using a transfer molding machine. Thereafter, the resultant was post-cured at 175° C. for 2 hours to obtain a semiconductor device assembly.

Then, using a dicing apparatus, the semiconductor device assembly was diced under the following conditions to obtain a semiconductor device of 10 mm square.
<Dicing Conditions>
Dicing speed: 2 mm/sec
Spindle rotation speed: 30,000 rpm
Blade Part Number: ZH05-SD 3500-N1-50 DD 4. Evaluation of Semiconductor Device The thus obtained semiconductor device was embedded in an epoxy resin and the cross section thereof was observed with a scanning electron microscope (SEM). As a result, solder joints between (silicon substrate/silicon chip) and between (silicon chip/silicon chip) were excellent, and also no crack was observed on the silicon chip. Moreover, no voids were observed in the resin layers between (silicon substrate/silicon chip) and between (silicon chip/silicon chip).

Comparative Example 1

1. Soldering of Laminate

A silicon chip provided with a resin film was laminated and soldered on a silicon substrate block by using a flip chip bonder. For the silicon chip provided with a resin film, substrate block, and other devices, the same as those prepared in Example 1 were used.

The lower stage of the flip chip bonder was set to 100° C., and the silicon substrate block was mounted thereon. Next, the silicon chip provided with a resin film was adsorbed onto a bonding tool which was set to 150° C. Thereafter, the silicon substrate block and the silicon chip were aligned using the vertical camera of the flip chip bonder; the silicon chip was laminated and pressurized under the condition of a load of 50 N for 12 seconds; and then the temperature of the bonding tool was raised rapidly. That is, the soldering between (solder bumps/pads) was carried out by setting the temperature of the bonding tool to 280° C. and pressurization under the condition of 50 N for 12 seconds to obtain a laminate (laminate (a)).

Then, the laminate (a) obtained above was mounted onto a lower stage which was set to 100° C., and another silicon chip provided with a resin film was adsorbed onto a bonding tool which was set to 150° C. Thereafter, the silicon chip in the laminate and the silicon chip provided with a resin film were aligned using the vertical camera of the flip chip bonder; the silicon chip was laminated and pressurized under the condition of a load of 50 N for 12 seconds; and then the temperature of the bonding tool was raised rapidly. That is, the soldering between (solder bumps/pads) was carried out by setting the temperature of the bonding tool to 280° C. and pressurization under the condition of 50 N for 12 seconds to obtain a laminate (laminate (b)).

Then, in order to complete the curing of the resin layer, the laminate (b) was pressurized and cured using a pressurizing and heating device. Air was used as a pressurizing fluid, and the pressurization and curing was conducted under the conditions of 180° C./2 hr/0.8 MPa to obtain a laminate which had been pressurized and cured.

In Comparative Example 1, in the previous stage of the second soldering step, it is necessary to cool the bonding tool from 280° C. to 150° C. The cooling from 280° C. to 150° C. was conducted in order to reduce the influence of high temperature. The cooling time required at that time was 30 seconds. However, in Examples, it was confirmed that there was no need to conduct the cooling operation, thereby increasing productivity.

In addition, when the laminate (structure) was observed, in Comparative Example 1, misalignment between (solder bumps/pads) was observed during the second soldering step, which is thought to be caused by the remelting of the solder between (silicon substrate/silicon chip). Such misalignment observed in Comparative Example 1 was not observed in any of the laminates (structures) obtained in Examples.

Comparative Example 2

The following experiment was conducted in order to demonstrate the effects of the present invention.
1. Preparation of Liquid Sealing Resin Composition 15.955% by weight of a bisphenol F type epoxy resin and 15.955% % by weight of a glycidyl amine type epoxy resin as liquid epoxy resins (A); 16.383% by weight of an aromatic primary amine type curing agent as a curing agent (B); 50.000% by weight of spherical silica having an average particle size of 0.5 μm and a maximum particle size of 24 μm as an inorganic filler (C); 0.016% by weight of a liquid silicone compound (D) having an amino group; 1.596% by weight of an epoxy silane coupling agent as a silane coupling agent; and 0.095% by weight of a colorant were mixed. The mixture was mixed using a planetary mixer and a three-roll mill, followed by a vacuum defoaming treatment to thereby obtain a liquid sealing resin composition.
2. Preparation of a Silicon Chip with No Resin Film An 8-inch silicon wafer identical to that used in Example 1, on which a dicing film had been formed, was diced to give a silicon chip having a chip size of 6 mm square.
3. Soldering of Laminate A silicon substrate block similar to that used in Example 1 was prepared. A flux was applied onto a pad forming surface of the silicon substrate in any one area of the silicon substrate block, and the silicon substrate block was mounted on the lower stage of the flip chip bonder. The aforementioned silicon chip was adsorbed onto a bonding tool. Thereafter, the silicon substrate block and the silicon chip were aligned and superimposed using the vertical camera of the flip chip bonder to obtain a temporary laminate in which it was laminated so that a bump forming surface of the silicon chip and a pad forming surface of the silicon substrate blocks were facing each other. The temporary laminate was heated in a reflow furnace to a temperature equal to or higher than the melting point of the solder to carry out the soldering. Furthermore, flux removal and cleaning were conducted to obtain a laminate (laminate (c)).

A flux was applied onto a pad forming surface of the silicon chip of the obtained laminate (c), and the resultant was mounted on the lower stage of the flip chip bonder. Another silicon chip was adsorbed onto a bonding tool. Thereafter, the silicon chip in the laminate (c) and another silicon chip were aligned and superimposed using the vertical camera of the flip chip bonder to obtain a temporary laminate in which it was laminated so that a bump forming surface of the another silicon chip and a pad forming surface of the silicon chip in the laminate (c) were facing each other. The temporary laminate was heated in a reflow furnace to a temperature equal to or higher than the melting point of the solder to carry out the soldering. Furthermore, flux removal and cleaning were conducted. As a result, a laminate (laminate (d)) was obtained.

4. Sealing Between Silicon Chips

The laminate (d) was heated on a hot plate of 110° C., and the above liquid sealing resin composition was dispensed on one side of the laminate (d). The laminate was filled, between (silicon substrate/silicon chip) and between (silicon chip/silicon chip), with the above liquid sealing resin composition. The liquid sealing resin composition within the laminate was heated and cured for 120 minutes in an oven at 150° C.
5. Evaluation of Laminate The thus obtained laminate in which between the silicon chips was sealed with the above resin composition was embedded in an epoxy resin and the cross section thereof was observed with a scanning electron microscope (SEM). As a result, a large number of voids were observed between (silicon substrate/silicon chip) and between (silicon chip/silicon chip).
(Summary)

As is clear from the results of Examples and Comparative Examples described above, the method of the present invention demonstrated excellent effects.

By conducting a heat treatment once at a temperature equal to or higher than the melting point of the solder, the soldering between each of the semiconductor components can be carried out collectively in the semiconductor device obtained by the method for manufacturing a semiconductor device according to the present invention. Therefore, the method was excellent in terms of productivity. Further, no cracks were observed in the semiconductor components of the semiconductor device obtained in Examples, thereby demonstrating high reliability.

On the other hand, in Comparative Example 1, because two semiconductor components were soldered on a substrate, it is necessary to conduct a heat treatment twice at a temperature equal to or higher than the melting point of the solder, the required time increases, misalignment was also observed in the obtained products, and thus productivity was poor. In addition, in Comparative Example 2, unlike the present invention, because between the semiconductor components was sealed with a resin following the soldering, a large number of voids were observed between the semiconductor components.

Further, as in the first embodiment, it has been confirmed that even when the soldering of the entire laminate is carried out after mounting the semiconductor chip at the top without bonding, it is possible to implement a manufacturing method excellent in productivity and also to obtain excellent evaluation on semiconductor device in a similar manner.

While preferred Examples of the present invention have been described and illustrated above, it should be understood that the present invention is not limited to these Examples. Additions, omissions, substitutions, and other modifications can be made without departing from the spirit or scope of the present invention.

INDUSTRIAL APPLICABILITY

A method for manufacturing a semiconductor device capable of improving the productivity and reliability can be provided.

REFERENCE SIGNS LIST

1: Semiconductor device
2: Laminate
3: Structure
5: Device
6: Device

10: Semiconductor chip
10A: Semiconductor wafer
11: Resin layer
11A, 11B: Resin layer
12: Semiconductor chip
13: Resin layer
14: Semiconductor chip
15: Resin layer
16: Semiconductor chip
17: Resin layer
18: Substrate
18A: Substrate
19: Sealing material
43: Clamping member
44: Clamping member
51: Vessel
52: Hot plate
53: Hot plate
54: Pin
55: Plate material
101: Terminal
120: Substrate
121: Terminal
121A: Solder layer
122: Terminal
123: Via
140: Substrate
141: Terminal
141A: Solder layer
142: Terminal
143: Via
160: Substrate
161: Terminal
161A: Solder layer
162: Terminal
163: Via
181: Terminal
181A: Solder layer
511: Pipe
900A: Connection bump
900: Semiconductor device
901: Interposer
902: Film-like adhesive
903: Semiconductor chip

The invention claimed is:

1. A method of manufacturing a semiconductor device, the method comprising:
   a step (A) which is a step of preparing one or more combinations of n semiconductor components and n resin layers, and one substrate,
      wherein the n semiconductor components are constituted from first to nth semiconductor components that are laminated in this order through resin layers,
      the n resin layers are constituted from first to nth resin layers that are used sequentially,
      said substrate has a plurality of connection terminals for connecting with the first semiconductor component on one side,
      the first semiconductor component has a connection terminal for connecting with the substrate on one side and a connection terminal for connecting with another semiconductor component on the other side,
      each of second to n−1th semiconductor components has a connection terminal for connecting with another semiconductor component on both sides,
      the nth semiconductor component has a connection terminal for connecting with the n−1th semiconductor component,
      in the first to the nth semiconductor components, at least one of connection terminals that are facing each other through a resin layer when the semiconductor components are laminated sequentially has a solder layer, and
      in the first semiconductor component and the substrate, at least one of the connection terminal of the first semiconductor component for connecting with the substrate and the connection terminal of the substrate for connecting with the first semiconductor component that are facing each other has a solder layer,
      with a proviso that n is an integer of 2 or more;
   a first bonding step (B) of bonding said substrate and said first semiconductor component through said first resin layer in a semi-cured state, by laminating at least one first resin layer and at least one first semiconductor component in this order, on the substrate, to form at least one laminated structure, followed by heating at a temperature at which the resin layer is semi-cured and which is lower than a temperature at which the solder layer melts;
   a repetitive bonding step (C) of obtaining, on the substrate, at least one laminate in which (n−1) resin layers and (n−1) semiconductor components are laminated alternately, by repeating a process until the n−1th semiconductor component is bonded, in which another resin layer and another semiconductor component are laminated in this order on said semiconductor component which is bonded, followed by heating at a temperature which is lower than a temperature at which the solder layer melts, to bond the semiconductor component through said resin layer in a semi-cured state, with the proviso that this step is omitted when n equals 2;
   a step (D) of preparing a pair of clamping members, and, on one clamping member, mounting said substrate on which at least one laminate is laminated, with the proviso that this step is omitted in those cases where said substrate is already mounted on a pair of clamping members in a step prior to this;
   a step (E) of obtaining, on the substrate, at least one laminate in which n resin layers and n semiconductor components are laminated alternately, by further laminating the nth resin layer and the nth semiconductor component in this order on said n−1th semiconductor component in said laminate which is mounted on the clamping member;
   a clamping and soldering step (F) of obtaining a structure which is a soldered laminate, by clamping said substrate and said laminate from a substrate side and a side of said nth semiconductor component with said one clamping member and the other clamping member, and also by heating said substrate and laminate at a temperature equal to or higher than a temperature at which the solder layer melts, to carry out soldering between connection terminals that are facing each other; and
   a curing step (G) of heating at a temperature which is equal to or higher than a curing temperature of the resin layer, to thereby promote curing of said first to nth resin layers.

2. The method of manufacturing a semiconductor device according to claim 1,
   wherein each of said resin layers comprises a thermosetting resin of not less than 30% by weight and not more than 70% by weight, and said n is any one of integers selected from the group consisting of 2, 3, 4, 5, 6, 7, 8, 9, and 10.

3. The method of manufacturing a semiconductor device according to claim 1,
wherein a plurality of first resin layers are disposed on the substrate, and the first semiconductor components are laminated on each of said first resin layers, in the first bonding step (B); and
in the repetitive bonding step (C), another resin layer and semiconductor component are laminated in this order, on each of a plurality of said first semiconductor components.

4. The method of manufacturing a semiconductor device according to claim 1, further comprising:
a repeating step (C'), prior to the mounting step (D), of repeating several times a combination of the first bonding step (B), which forms one laminate, and the repetitive bonding step (C), thereby forming a plurality of laminates on the substrate;
or
a repeating step (C"), prior to the curing step (G), of repeating several times a combination of the steps (B) to (F), which forms one laminate, thereby forming a plurality of laminates on the substrate.

5. The method of manufacturing a semiconductor device according to claim 1, wherein
said step (A) is a step
wherein said n is 3, and
the first semiconductor component, the second semiconductor component, the third semiconductor component, the substrate, the first resin layer, the second resin layer, and the third resin layer are prepared as said semiconductor and resin layer;
said first bonding step (B) is a step of bonding said substrate and said first semiconductor component through said first resin layer in a semi-cured state, by laminating said first resin layer and said first semiconductor component in this order on said substrate, followed by heating;
said repetitive bonding step (C) is a step of bonding said first semiconductor component and said second semiconductor component through said second resin layer in a semi-cured state, by laminating said second resin layer and said second semiconductor component in this order on said first semiconductor component, followed by heating;
said step (D) is a step of preparing a pair of clamping members and mounting said substrate, first resin layer, first semiconductor component, second resin layer, and second semiconductor component on one clamping member;
said step (E) is a step of configuring a laminate on the substrate by installing said third semiconductor component on said second semiconductor component through said third resin layer;
said clamping and soldering step (F) is a step of obtaining a structure which is a soldered laminate, by clamping said laminate with said one clamping member and the other clamping member, followed by heating to carry out soldering; and
said curing step (G) is a step of promoting curing of said first resin layer, second resin layer, and third resin layer.

6. The method of manufacturing a semiconductor device according to claim 5,
wherein said first resin layer, the second resin layer and said third resin layer comprise a thermosetting resin; and
in said curing step, heating is carried out while pressurizing said structure with a fluid to promote curing of said first resin layer, second resin layer, and third resin layer.

7. The method of manufacturing a semiconductor device according to claim 5,
wherein at least one of second semiconductor component connection terminal of said third semiconductor component and third semiconductor component connection terminal of said second semiconductor component comprises a solder layer,
at least one of first semiconductor component connection terminal of said second semiconductor component and second semiconductor component connection terminal of the first semiconductor component comprises a solder layer, and
at least one of substrate connection terminal of said first semiconductor component and first semiconductor component connection terminal of said substrate comprises a solder layer.

8. The method of manufacturing a semiconductor device according to claim 5, further comprising, prior to said step (B):
a sub-step of providing a resin layer constituting said third resin layer on at least one of a surface in which the third semiconductor component connection terminal of said second semiconductor component is formed, and a surface in which said second semiconductor component connection terminal of said third semiconductor component is provided;
providing a resin layer constituting said second resin layer on at least one of a surface in which the second semiconductor component connection terminal of said first semiconductor component is formed, and a surface in which said first semiconductor component connection terminal of said second semiconductor component is provided; and
providing a resin layer constituting said first resin layer on at least one of a surface in which the first semiconductor components connection terminal of said substrate is formed, and a surface in which said substrate connection terminal of said first semiconductor component is provided.

9. The method of manufacturing a semiconductor device according to claim 5,
wherein said step (D) of mounting the substrate is a step of preparing a device including a pair of clamping members, that are preheated and oppositely disposed, and an installing section, in which said laminate is installed, which is disposed between the pair of clamping members while being spaced apart from them, and disposing said laminate on said installing section; and
said clamping and soldering step (F) is a step of carrying out soldering by heating, while clamping said laminate and said installing section, with said pair of clamping members which are heated.

10. The method of manufacturing a semiconductor device according to claim 9,
wherein among said pair of clamping members, a temperature of one clamping member is lower than a temperature of the other clamping member.

11. The method of manufacturing a semiconductor device according to claim 5, further comprising, in a step after said curing step:
a cutting step of cutting the substrate for each of said structures;
wherein said structure comprises at least said third resin layer, said third semiconductor component, said second resin layer, said second semiconductor component, said first resin layer, and said first semiconductor component, and has a structure in which the resin layers and the semiconductor components are laminated alternately;

two or more of said structures are formed on said substrate; and in said curing step, curing of said first resin layer, the second resin layer, and the third resin layer that are included in a plurality of said structures formed on said substrate is promoted.

12. The method of manufacturing a semiconductor device according to claim 5, wherein said second semiconductor component is a semiconductor chip of a TSV structure which has a substrate and a through-via that penetrates through said substrate, and the through-via is connected to said third semiconductor component connection terminal and said first semiconductor component connection terminal;

said first semiconductor component is a semiconductor chip of a TSV structure which has a substrate and a through-via that penetrates through said substrate, and the through-via is connected to said second semiconductor component connection terminal and a terminal provided on a surface opposite to a surface on which said second semiconductor component connection terminal is provided, among surfaces of said substrate.

13. The method of manufacturing a semiconductor device according to claim 1, further comprising at least one of the following characteristics:

(i) the solder layer has a melting point of 110 to 250° C.; and (ii) the resin layer comprises a thermosetting resin, and a flux active compound of 1 to 30% by weight which has at least one of carboxyl groups and phenolic hydroxyl groups.

14. The method of manufacturing a semiconductor device according to claim 1, further comprising at least one of the following characteristics:

(iii) comprises a step of pressurizing said substrate and said laminate with a fluid, which is carried out in a vessel where the fluid is introduced;

(iv) the resin layer comprises a thermosetting resin;

(v) heating in the curing step is performed by use of a pressurizing fluid which is heated, or by heating of a vessel.

15. The method of manufacturing a semiconductor device according to claim 14, further comprising at least one of the following characteristics:

(vi) the solder layer has a melting point of 170 to 230° C.;

(vii) the fluid is air or an inert gas;

(viii) pressing force for pressurizing the laminate is from not less than 0.1 MPa to not more than 10 MPa.

16. A method of manufacturing a semiconductor device, the method comprising:

a step (A) which is a step of preparing one or more combinations of n semiconductor components and n resin layers, and one substrate, wherein the n semiconductor components are constituted from first to nth semiconductor components that are laminated in this order through resin layers, the n resin layers are constituted from first to nth resin layers that are used sequentially, said substrate has a plurality of connection terminals for connecting with the first semiconductor component on one side of the substrate, the first semiconductor component has a connection terminal for connecting with the substrate on one side thereof and a connection terminal for connecting with another semiconductor component on the other side thereof, each of the second to n−1th semiconductor components has a connection terminal for connecting with another semiconductor component on both sides, the nth semiconductor component has a connection terminal for connecting with the n−1th semiconductor component, in the first to the nth semiconductor components, at least one of connection terminals that are facing each other through a resin layer when the semiconductor components are laminated sequentially has a solder layer, in the first semiconductor component and the substrate, at least one of the connection terminal of the first semiconductor component for connecting with the substrate and the connection terminal of said substrate for connecting with the first semiconductor component that are facing each other has a solder layer, with a proviso that n is an integer of 2 or more;

a first bonding step (B) of bonding said substrate and said first semiconductor component through said first resin layer in a semi-cured state, by laminating at least one first resin layer and at least one first semiconductor component in this order, on the substrate, to form at least one laminate structure, followed by heating the structure at a temperature at which the resin layer is semi-cured and which is lower than a temperature at which the solder layer melts;

a second bonding step (b-1) of bonding said first semiconductor component and said second semiconductor component through said second resin layer in a semi-cured state, by laminating the second resin layer and the second semiconductor component in this order on said first semiconductor component which has been bonded, followed by heating at a temperature at which the resin layer is semi-cured, and which is lower than a temperature at which the solder layer melts;

a repetitive bonding step (c) of obtaining at least one laminate in which n resin layers and n semiconductor components are laminated alternately on the substrate, by repeating (n−1) times a sequential bonding on said second semiconductor component under the same conditions as those in the second bonding step until the nth semiconductor component is bonded, with a proviso that this step is omitted when n equals 2;

a step (D) of preparing a pair of clamping members, and, on one clamping member, mounting said substrate on which at least one laminate is laminated, with the proviso that this step is omitted in those cases where said substrate is already mounted on a pair of clamping members in a step prior to this;

a step (e) of pressurizing said substrate and said laminate with a fluid;

a step (f) of clamping said substrate and said laminate from a substrate side and a side of said nth semiconductor component with said one clamping member and the other clamping member;

a soldering and curing step (g) of obtaining a structure which is a soldered laminate, by heating said substrate and laminate at a temperature equal to or higher than a temperature at which the solder layer melts, to carry out soldering between connection terminals that are facing each other, while promoting curing of said first to said nth resin layers.

17. The method of manufacturing a semiconductor device according to claim 16,
wherein each of said resin layers comprises a thermosetting resin of not less than 30% by weight and not more than 70% by weight, and said n is any one of integers selected from the group consisting of 2, 3, 4, 5, 6, 7, 8, 9, and 10.

18. The method of manufacturing a semiconductor device according to claim 16,
wherein a plurality of first resin layers are disposed on the substrate, and the first semiconductor components are laminated on each of said first resin layers, in the first bonding step (B); and
in the second bonding step (b-1), another resin layer and semiconductor component are laminated in this order, on each of a plurality of said first semiconductor components.

19. The method of manufacturing a semiconductor device according to claim 16,
further comprising a repeating step (c'), prior to the mounting step (D), of repeating several times a combination of the first bonding step (B) wherein one laminate is formed, the second bonding step (b-1), and the repetitive bonding step (c) to form a plurality of laminates on the substrate;
or
further comprising a repeating step (C") of repeating several times a combination of the steps (B) to (g) wherein one laminate is formed, thereby forming a plurality of laminates on the substrate.

20. The method of manufacturing a semiconductor device according to claim 16, comprising:
said step (A) which is a step
wherein said n is 3, and
the third semiconductor component having a connection terminal for connecting with the second semiconductor component on one side,
the second semiconductor component having a connection terminal for connecting with the first semiconductor components on one side and a connection terminal for connecting with said third semiconductor component on the other side,
the first semiconductor component having a connection terminal for connecting with the substrate on one side and a connection terminal for connecting with said second semiconductor component on the other side,
the substrate having a plurality of connection terminals for connecting with said first semiconductor component on one side,
the third resin layer,
the second resin layer, and
the first resin layer are prepared, as said semiconductor and resin layer,
said first bonding step (B) is a first bonding step wherein said substrate and said first semiconductor component are bonded through said first resin layer in a semi-cured state by laminating said first resin layer and said first semiconductor component in this order on said substrate, followed by heating;
said second bonding step (b-1) is a step of bonding said first semiconductor component and said second semiconductor component through said second resin layer in a semi-cured state by laminating said second resin layer and said second semiconductor component in this order on said first semiconductor component, followed by heating,
said repetitive bonding step (c) is a step of obtaining at least one laminate constituted of at least said third semiconductor component, said third resin layer, said second semiconductor component, said second resin layer, and said first semiconductor component, in which the resin layers and the semiconductor components are laminated alternately, by a step in which said second semiconductor component and said third semiconductor component are bonded through said third resin layer in a semi-cured state by laminating said third resin layer and said third semiconductor component in this order on said second semiconductor component, followed by heating;
said step (D) is a step of preparing a pair of clamping members and, above one clamping member, mounting a plurality of said laminates that are laminated on said substrate;
said step (e) is a step of pressurizing, with a fluid, said substrate and said laminate that are mounted;
said step (f) is a step of clamping, while pressurizing, said substrate and said laminate with said one clamping member and the other clamping member while applying pressure; and
said step (g) is a step of heating, while clamping, said substrate and said laminate to carry out soldering, and also to promote curing of said third resin layer, second resin layer, and first resin layer.

21. The method of manufacturing a semiconductor device according to claim 20,
wherein at least one of second semiconductor component connection terminal of said third semiconductor component and third semiconductor component connection terminal of said second semiconductor component comprises a solder layer,
at least one of first semiconductor component connection terminal of said second semiconductor component and second semiconductor component connection terminal of the first semiconductor component comprises a solder layer, and
at least one of substrate connection terminal of said first semiconductor component and first semiconductor component connection terminal of said substrate comprises a solder layer.

22. The method of manufacturing a semiconductor device according to claim 20, further comprising, prior to said step (B):
a sub-step of providing a resin layer constituting said first resin layer on at least one of a surface of said second semiconductor component where the third semiconductor component connection terminal is formed, and a surface of said third semiconductor component where said second semiconductor component connection terminal is provided;
providing a resin layer constituting said second resin layer on at least one of a surface of said first semiconductor component where the second semiconductor component connection terminal is formed, and a surface of said second semiconductor component where said first semiconductor component connection terminal is provided; and
providing a resin layer constituting said first resin layer on at least one of a surface of said substrate where the first semiconductor components connection terminal is formed, and a surface of said first semiconductor component where said substrate connection terminal is provided.

23. The method of manufacturing a semiconductor device according to claim 20,
- wherein said step (D) of mounting the substrate is a step of preparing a device including a pair of clamping members that are preheated and oppositely disposed and an installing section which is disposed between the pair of clamping members while being spaced apart from them, and
- disposing, a plurality of said laminates laminated on said substrate, on said installing section spaced apart from said pair of clamping members; and
- said soldering step (g) is a step of carrying out soldering by heating while clamping a plurality of said laminates that are laminated on said substrate with said pair of clamping members.

24. The method of manufacturing a semiconductor device according to claim 23,
- wherein among said pair of clamping members, a temperature of one clamping member is lower than a temperature of the other clamping member.

25. The method of manufacturing a semiconductor device according to claim 20,
- wherein two or more of said laminates are formed on said substrate; and
- comprises, after said soldering step, a cutting step of cutting the substrate for each of said laminates.

26. The method of manufacturing a semiconductor device according to claim 20,
- wherein said second semiconductor component is a semiconductor chip of a TSV structure which comprises a substrate and a through-via that penetrates through said substrate, and the through-via is connected to said third semiconductor component connection terminal and said first semiconductor component connection terminal; and
- said first semiconductor component is a semiconductor chip of a TSV structure which comprises a substrate and a through-via that penetrates through said substrate, and the through-via is connected to said second semiconductor component connection terminal and a terminal provided on a surface opposite to a surface on which said second semiconductor component connection terminal is provided, among surfaces of said substrate.

27. The method of manufacturing a semiconductor device according to claim 16, further comprising at least one of the following characteristics: (i) the solder layer has a melting point of 110 to 250° C.; and
- (ii) the resin layer comprises a thermosetting resin, and a flux active compound of 1 to 30% by weight which has at least one of carboxyl groups and phenolic hydroxyl groups.

28. The method of manufacturing a semiconductor device according to claim 16, further comprising at least one of the following characteristics:
- (iii) a step of pressurizing said substrate and said laminate with a fluid is carried out in a vessel where the fluid is introduced;
- (iv) the resin layer comprises a thermosetting resin; and
- (v) heating for solder curing and curing of the resin layer is performed by the clamping members that are heated.

29. The method of manufacturing a semiconductor device according to claim 16, further comprising at least one of the following characteristics:
- (vi) the solder layer has a melting point of 170 to 230° C.;
- (vii) the fluid is air or an inert gas; and
- (viii) pressing force for pressurizing the laminate is from not less than 0.1 MPa to not more than 10 MPa.

30. The method of manufacturing a semiconductor device according to claim 16, further comprising, after said step (g), a post-curing step of carrying out heating and pressurizing in order to completely cure the resin layer of the laminate.

31. A semiconductor device manufactured by the method of manufacturing a semiconductor device described in claim 1.

32. A semiconductor device manufactured by the method of manufacturing a semiconductor device described in claim 16.

* * * * *